United States Patent [19]
Wakata et al.

[11] Patent Number: 5,305,338
[45] Date of Patent: Apr. 19, 1994

[54] SWITCH DEVICE FOR LASER

[75] Inventors: Hitoshi Wakata; Akihiro Suzuki; Kenyu Haruta; Haruhiko Nagai; Akihiko Iwata; Shinji Murata; Isamu Tanakura; Tomohiro Sasagawa; Yuito Kimura, all of Hyogo, Japan

[73] Assignee: Mitsubishi Denki Kabushiki Kaisha, Tokyo, Japan

[21] Appl. No.: 757,419

[22] Filed: Sep. 10, 1991

[30] Foreign Application Priority Data

| Sep. 25, 1990 | [JP] | Japan | 2-256232 |
|---|---|---|---|
| Sep. 25, 1990 | [JP] | Japan | 2-256233 |
| Sep. 25, 1990 | [JP] | Japan | 2-256234 |
| Sep. 25, 1990 | [JP] | Japan | 2-256235 |
| Sep. 25, 1990 | [JP] | Japan | 2-256236 |
| Sep. 25, 1990 | [JP] | Japan | 2-256237 |
| Sep. 25, 1990 | [JP] | Japan | 2-256238 |
| Sep. 25, 1990 | [JP] | Japan | 2-256239 |
| Sep. 25, 1990 | [JP] | Japan | 2-256240 |
| Sep. 25, 1990 | [JP] | Japan | 2-256241 |
| Nov. 9, 1990 | [JP] | Japan | 2-305201 |
| Nov. 9, 1990 | [JP] | Japan | 2-305203 |
| Nov. 9, 1990 | [JP] | Japan | 2-305204 |
| Nov. 9, 1990 | [JP] | Japan | 2-305205 |
| Nov. 9, 1990 | [JP] | Japan | 2-305206 |
| Nov. 9, 1990 | [JP] | Japan | 2-305209 |
| Nov. 9, 1990 | [JP] | Japan | 2-305210 |
| Nov. 9, 1990 | [JP] | Japan | 2-305211 |

[51] Int. Cl.$^5$ .................. H01S 3/00; H03K 17/08
[52] U.S. Cl. ........................ 372/38; 372/29; 372/69; 372/82
[58] Field of Search ............ 378/38, 29; 372/69, 372/82

[56] References Cited

U.S. PATENT DOCUMENTS

| 3,808,578 | 4/1974 | Hansen. | |
| 3,877,000 | 4/1975 | Kosco. | |
| 4,145,708 | 3/1979 | Ferro et al. | |
| 4,245,194 | 1/1981 | Fahlen et al. | |
| 4,359,773 | 11/1982 | Swartz et al. | 372/29 |

(List continued on next page.)

FOREIGN PATENT DOCUMENTS

| 0164752 | 12/1985 | European Pat. Off. |
| 0264135 | 4/1988 | European Pat. Off. |
| 0340918 | 11/1989 | European Pat. Off. |
| 0408142 | 1/1991 | European Pat. Off. |
| 0431846 | 6/1991 | European Pat. Off. |
| 0487964 | 6/1992 | European Pat. Off. |
| 3630775 | 3/1988 | Fed. Rep. of Germany. |
| 3734607 | 12/1988 | Fed. Rep. of Germany. |
| 3822991 | 1/1990 | Fed. Rep. of Germany. |
| 3912704 | 10/1990 | Fed. Rep. of Germany. |
| 61-224345 | 10/1986 | Japan. |
| 971286 | 9/1964 | United Kingdom. |
| 2081024 | 2/1982 | United Kingdom. |
| 2090058 | 6/1982 | United Kingdom. |
| 2161318 | 1/1986 | United Kingdom. |
| 2227877 | 8/1990 | United Kingdom. |

OTHER PUBLICATIONS

Rickwood, K. R., Serafetinides, A. A.: "Semiconductor pre-ionized nitrogen laser" in: US Journal Rev. Sci. Instrum., vol. 57, No. 7, Jul. 1986, pp. 1299-1302.

(List continued on next page.)

Primary Examiner—Leon Scott, Jr.
Attorney, Agent, or Firm—Sughrue, Mion, Zinn, Macpeak & Seas

[57] ABSTRACT

A switch device used for a laser device, includes series-parallel connected switch elements or modules. The switch elements or modules are simultaneously turned on by trigger signals from trigger circuits. The transmission lines for connecting the trigger circuits to respective switch elements are equal to one another in length. A protecting circuit is provided for the switch elements, and indicators are provided for indicating the shortcircuit of the switch elements. In the switch device, the number of wires for the switch elements is made small and heat generated from the switch elements is effectively radiated. The modules are easily stacked, and firmly connected to a control unit for controlling the switch elements. A discharge excited laser device using the switch device has a high efficiency and a long lifetime and is reliable.

30 Claims, 47 Drawing Sheets

U.S. PATENT DOCUMENTS

| | | |
|---|---|---|
| 4,366,567 | 12/1982 | Fukuzawa et al. .................. 372/38 |
| 4,400,812 | 8/1983 | Clark et al. ........................ 372/38 |
| 4,510,606 | 4/1985 | Yagi et al. .......................... 372/38 |
| 4,584,595 | 4/1986 | Kammiller . |
| 4,630,277 | 12/1986 | Cirkel et al. . |
| 4,635,267 | 1/1987 | Cirkel et al. . |
| 4,639,760 | 1/1987 | Granberg et al. . |
| 4,679,203 | 7/1987 | Taylor et al. . |
| 4,692,643 | 9/1987 | Tokunaga et al. . |
| 4,698,518 | 10/1987 | Pacala . |
| 4,706,252 | 11/1987 | Egawa et al. ...................... 372/38 |
| 4,727,454 | 2/1988 | Neidig et al. . |
| 4,727,455 | 2/1988 | Neidig et al. . |
| 4,751,408 | 6/1988 | Rambert . |
| 4,813,048 | 3/1989 | Yamane et al. .................... 372/30 |
| 4,835,649 | 5/1989 | Salerno . |
| 4,837,789 | 6/1989 | Egawa ................................ 372/38 |
| 4,876,689 | 10/1989 | Egawa ................................ 372/38 |
| 4,929,932 | 5/1990 | Shipkowski . |
| 4,983,865 | 1/1991 | Ho et al. . |
| 5,040,992 | 8/1991 | Miyamoto et al. . |
| 5,053,853 | 10/1991 | Haj-Ali-Ahmadi et al. . |
| 5,054,029 | 10/1991 | Sugawara et al. .................. 372/38 |
| 5,115,147 | 5/1992 | Kusano et al. ..................... 372/31 |

OTHER PUBLICATIONS

Laurent, P., Rischmueller, K.: "Schaltregler fuer Hohe Ausgangsstroeme und hohe Schaltfrequenzen" in: German technical journal Elektronik 2/Jan. 22, 1988, pp. 80–82.

Colletti, J. A. et al. "Twin-contact connector" in: US technical journal IBM Technical Disclosure Bulletin, vol. 14, No. 9, Feb. 1972, pp. 2597–2598.

Watanabe, S. et al.: "High repetition long pulse XeCL Laser with a coaxial ceramic pulse-forming line" in: US technical journal Rev. Sci. Instrum, vol. 57, No. 12, Dec. 1986, pp. 2970–2973.

Tsutomu Shimada, et al "Pulsed $CO_2$ Laser Pumped by an All Solid-State Magnetic Exciter" Japanes Journal of Applied Physics vol. 24, No. 11, Nov., 1985 pp. L855–L857.

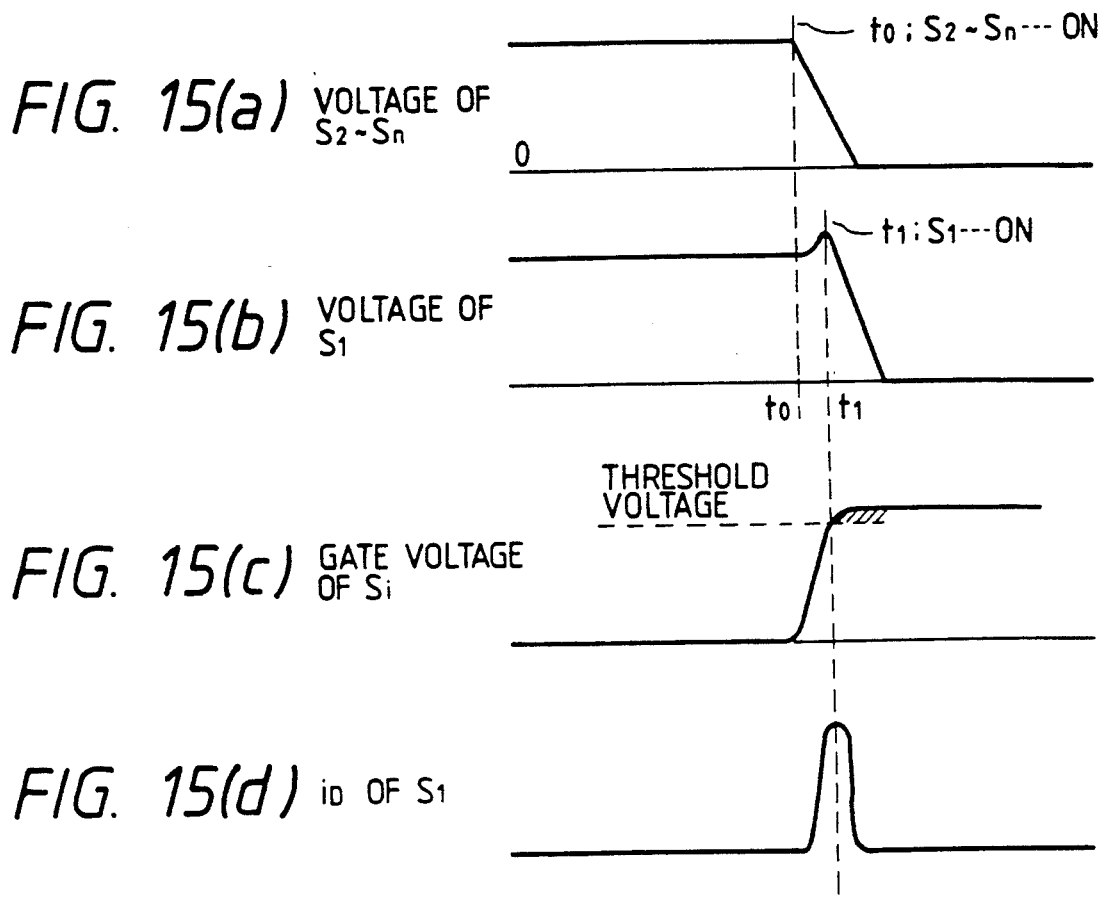
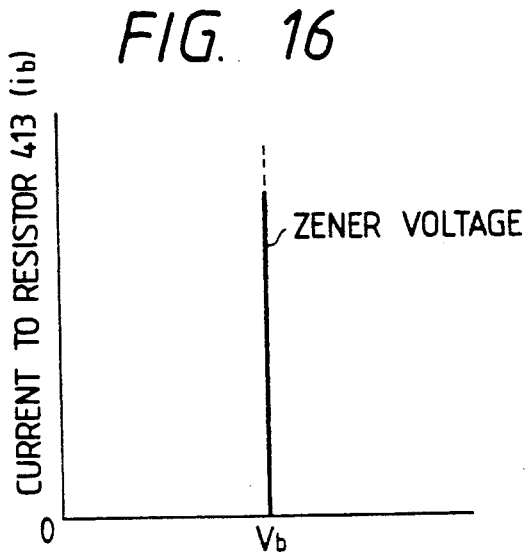

FIG. 26 PRIOR ART
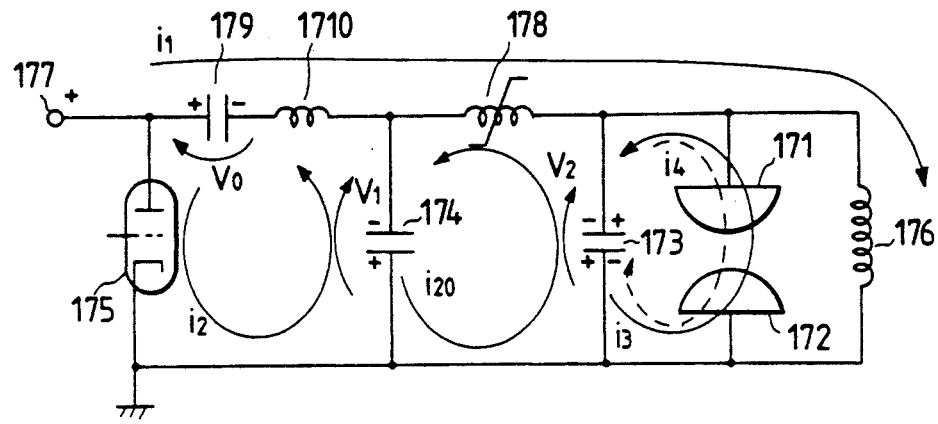
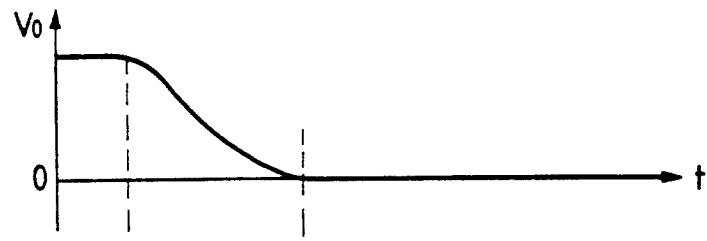
FIG. 27(a)
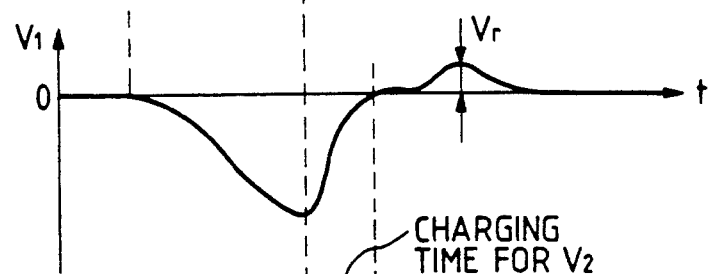
FIG. 27(b)
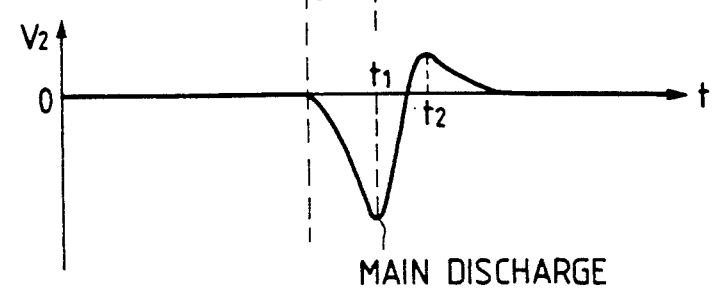
FIG. 27(c)

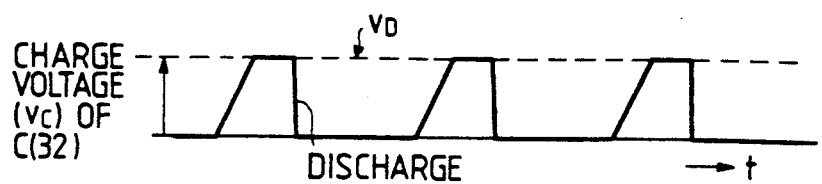
FIG. 41
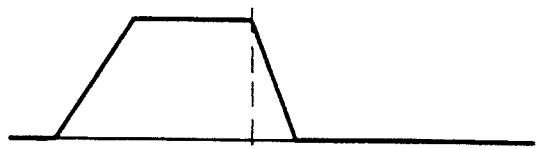
FIG. 42(a) VOLTAGE OF S2-Sn (VD)
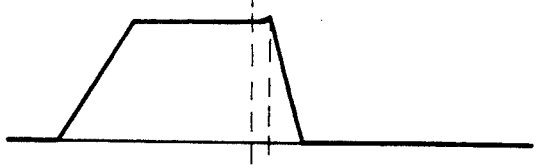
FIG. 42(b) VOLTAGE OF S1 (VD)
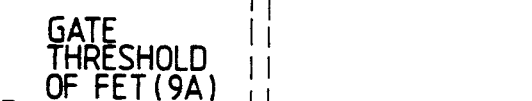
FIG. 42(c) CURRENT OF RESISTOR (13) (ic)
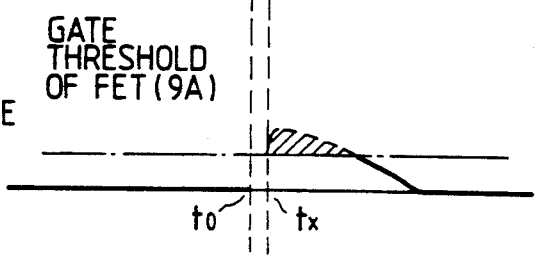
FIG. 42(d) GATE VOLTAGE (VG) OF S1 = ic·r FIG. 48(c) ⟶⟶⟶⟶⟶⟶⟶⟶⟶⟶⟶⟶⟶⟶⟶⟶

SWITCH DEVICE FOR LASER

BACKGROUND OF THE INVENTION

The present invention relates to a switch device used for a laser device, in which a number of high speed solid-state switch elements, such as field effect transistors (FETs), are simultaneously turned on and off, and more particularly to a switch device used as a high voltage switch for a discharge excited laser device and the like.

FIG. 1 is a circuit diagram showing a discharge circuit used for an excimer (excited dimer) laser device as a conventional discharge excited laser device. In the figure, reference numeral 10 designates a high voltage power source; 11 a charge reactor connected to one end of the high voltage power source 10; 2 a charge capacitor connected in series to the reactor 11; 9 a pair of discharge electrodes connected between the charge capacitor 2 and the other end of the high voltage power source 10; 13 a laser beam resulting from the discharge between the paired electrodes 9; 12 a charge reactor connected in parallel to the paired electrodes 9; 8 a capacitor connected in parallel to the paired electrodes 9 and receiving electric charges from the capacitor 2; and 1 a thyratron, serving as a high voltage switch, connected between the other end of the high voltage power source 10 and a node between the reactor 11 and the capacitor 2. The pair of electrodes 9 are disposed in discharge gas, such as rare gas and halogen gas.

FIG. 2 is a perspective view showing an excimer laser device using the discharge circuit of FIG. 1. In the figure, like reference symbols are used for designating like or equivalent portions in FIG. 1. In the illustration of FIG. 2, the high voltage power source 10, and the reactors 11 and 12, which are shown in FIG. 1, are omitted, for simplicity.

In FIG. 2, the thyratron 1 as a high voltage switch is contained in a tubular container 6 made of conductive material. One end of the container 6 is closed by a cover 7 made of insulating material.

A plurality of charge capacitors 2 are arrayed in a line. One end of the line of the capacitors 2 is connected to one end of the thyratron 1 by means of an L-shaped conductive plate 4. The other end of the line of the capacitors 2 is connected to an elongated conductive plate 3. A parallelepiped case 5 made of conductive material is provided. The case 5 is filled with discharge gas. A pair of electrodes 9 are disposed in the case 5. One of the paired electrodes 9 is mounted on the conductive plate 3, while the other is mounted on the bottom of the case 5. One end of the case 5 is connected to the other end of the thyratron 1 through the container 6. The plurality of capacitors 8 are provided between one of the inner side walls of the case 5 and the side wall of the conductive plate 3, both the side walls facing each other. Similarly, the plurality of capacitors 8 are provided between the other of the inner side walls of the case 5 and the side wall of the conductive plate 3, both the side walls facing each other.

The assembly thus constructed may be electrically expressed by an equivalent circuit, which is substantially the same as that of FIG. 1.

The operation of the discharge circuit thus constructed will be described.

In FIG. 1, when the high voltage power source 10 is turned on while the thyratron 1 is in an off state, a charge loop of the high voltage power source 10 - reactor 11 - capacitor 2 - reactor 12 - high voltage power source 10 is formed to charge the capacitor 2. Then, when the thyratron 1 is fired, a charge transfer loop of capacitor 2 - thyratron 1 - capacitor 8 is formed. Through the charge transfer loop, the capacitor 2 is discharged and the charge discharged is transferred to the capacitor 8. Accordingly, the voltage across the capacitor 8, i.e., the voltage between the paired electrodes 9, rises. When it reaches the discharge voltage, discharge occurs between the paired electrodes 9. The discharge excites the gas in the case 5 to emit a pulsative laser beam 13.

The conventional discharge circuit employs the thyratron 1 as the high voltage switch. However, the thyratron 1 has a large inductance, and therefore the voltage between the electrodes 9 slowly rises. As a result, the discharge is instable. Further, since the thyratron requires a preheating time and is sensitive to temperature, a temperature controller must be provided.

To cope with this, a switch consisting of a number of high speed switch elements such as FETs, IGBTs or thyristors, as a switch to be used in place of the thyratron, was proposed by the applicants of the present application. FIG. 3 is a schematic illustration of a switch device 15 for a laser device consisting of a number of high speed switch elements 14 in which series-connected elements are further connected in parallel. By simultaneously turning on all the high speed switch elements 14 making up the switch device 15 which is used in place of the thyratron 1 in FIG. 1, the discharge current is allowed to flow from the capacitor 2.

Since the switch device 15 using the high speed switch elements 14 is thus constructed, when it is applied to the discharge exciting pulse laser device such as the excimer laser device, a switching speed of the discharge circuit influences an exciting efficiency of the laser medium. In order to obtain a higher exciting efficiency, a high speed switch must be used for the discharge circuit. However, in general, high speed switches have small rated voltage and current. Thus, such switches, if used, must be connected in a series-parallel fashion.

In a switch consisting of series-parallel connected high speed switches, if the number of series-parallel elements is large, the switch suffers from the following problems:

a) The inductance associated with the wires is increased.

b) Reliability of the wires deteriorates.

c) Intricate work is required for wiring and maintenance.

In a case where MOSFETs (900 V and 15 A, as rated values), suitable for high speed operation, are used as the switch elements 14 in the discharge circuit of the excimer laser device, and the switch consisting of the MOSFETs must withstand 30 kV and 4000 A, (solid-state switch) elements 14 totaling 9078 (=34×267) must be series-parallel connected. Accordingly, the above problems become actualized.

Particularly when the inductance in the circuit increases, the switching speed is made slow, and the efficiency of the charge transfer from the capacitor 2 to the capacitor 8 is reduced. This results in reduction of the laser oscillation efficiency. For this reason, the circuit inductance must be minimized.

Further, in the laser switch device as shown in FIG. 3, if some of the high speed switches connected in series, parallel or series-parallel connected break down to be shortcircuited, the voltage applied to the normal switches is increased. Thus, even if the number of the series and/or parallel connections is selected so that each high speed switch has the rated voltage larger than the required voltage, when some switches break down, a problem arises that a voltage larger than the rated voltage is applied to the normal switches, and a steep pulse voltage destroys the high speed switch if the laser device is continued to run leaving the switch trouble unrepaired. Also, in a situation where some of the series and/or parallel connected high speed switches are shortcircuited, but the remaining ones are normally operating, an operator may fail to find the switch trouble. This is a very dangerous situation.

To realize the switch device 15, a plurality of FETs 14 (in the following description, the high speed switch element 14 will be referred to as FETs 14) are interconnected into a single module. A plurality of such modules are connected into the switch device 15.

FIG. 4 is a perspective view showing an excimer laser device using the switch device 15 consisting of the modules, which is to be used in place of the thyratron 1. In the figure, like reference symbols are used for designating like or equivalent portions in FIG. 2.

In FIG. 4, reference numeral 20 designates the module with a terminal plate 20a. A set of modules 20 are mounted on each of conductive plates 617. The conductive plates 617 are interconnected through the terminal plates 20a of the modules 20. The conductive plates 617 are placed on insulating members 619, which are layered on both sides of conductive plate 618 with a T-shaped top. The terminal plates 20a of the set of the modules 20 mounted on the uppermost conductive plates 617 are connected to the T-shaped top of the conductive plate 618. In this instance, although the lowermost conductive plates 617 are integral with a case 5, those conductive plates 617 may be formed separately from the case 5. The bottom end of the conductive plate 618 is connected to one end of a plurality of capacitors 2.

The operation of the laser device thus constructed will be described.

Voltage is first applied from the high voltage power source 10 to the top of the conductive plate 618. The capacitors 2 are charged through the conductive plate 618. Then, all of the FETs 14 contained in all of the modules 20 are simultaneously turned on, to form a charge transfer loop of the capacitor 2 - switch device 15 - case 5 - capacitor 8. Thus, the charge is transferred from the capacitors 2 to the capacitors 8. Consequently, the voltage between the paired electrodes 9 rises and a discharge starts.

In the laser device under discussion, all of the FETs 14 are turned on at a high speed. The voltage between the paired electrodes 9 sharply rises, providing a stable discharge.

However, since the switch device consisting of the FET modules, used for the laser device of FIG. 4, is thus constructed, the heat due to the operation of a number of FETs 14 fabricated into modules, may damage the FETs 14 per se.

FIG. 5 is a cross sectional view showing the module 20. The module 20 contains a circuit in which a plurality of FETs 14 are simultaneously turned on. A drain electrode 190, common to those FETs 14, is provided on the upper surface of the module 20. A source electrode 200 common to the FETs and a gate electrode 210 are provided on the lower surface of the module 20. The drain electrode 190 is shaped in a thin plate, and the source electrode 200 and the gate electrode 210 are shaped in line pin terminals and protruded from the side edge of the module 20 outwardly.

The module 20 constituting the switch device 15, which consists of a number of solid-state switch elements such as FETs, is constructed as shown in FIG. 5. As shown, the source electrode 200 and the gate electrode 210 are protruded from the lower surface of the module 20. One approach to construct the switch device 15 using a number of modules 20, is to arrange the modules 20 two dimensionally as shown in FIG. 4. Another approach is to arrange the modules 20 into a stack. Particularly in the approach to stacking the modules, the protrusion of the pin-terminal like electrodes from the lower surface of the module 20 makes it difficult to stack the modules and to save the space. Accordingly, it is difficult to make the switch device miniatured and compact. Additionally, the inductance of the circuit is increased.

FIG. 6 is a perspective view showing the combination of the module 1116 and a controlling unit for control the module. The module 1116 contains a plurality of FETs. The control unit 1117 for driving and controlling the module is provided on a substrate board 1117a. The control unit 1117 applies control signals to the module 1116 through lead wires 1118.

FIG. 7 is a perspective view showing an excimer laser device using the switch device 15 consisting of the modules 20, in place of the thyratron 1. In the figure, like reference symbols are used for designating like or equivalent portions in FIG. 6.

In FIG. 7, a number of modules 1116 are grouped into sets of modules each consisting a predetermined number of modules. Each set of modules is provided on each conductive plate 1119 which is disposed on a side of a conductive plate 1120. The lower end of the conductive plates 1120 is connected to one end of each capacitor 2. A container 1121, accommodating the case 5 and the like, has a hole 21a through which a laser beam 13 passes to exterior.

The operation of the laser device thus constructed is the same as that of the device shown in FIG. 4.

In the switch device 15 consisting of the modules each containing a plurality of solid-state switch elements constructed as shown in FIG. 6, the control unit 1117 and the module 1116 are connected by means of the lead wires 1118. With such a connection, the control unit 1117 is suspended from the module 1116 by the lead wires 1118, and a number of connection points are required. Therefore, failure frequently occurs. Further, if the lengths of the lead wires 1118 are unequal, the drive times are not uniform, deteriorating the switching performance. If the nonuniformity of the drive times is great, overvoltage is applied on a number of solid-state switch elements, possibly destroying the elements.

FIG. 8 is a block diagram showing a conventional control circuit 211 for controlling the high speed solid-state switch elements 14. The control circuit 211 is constructed such that a trigger circuit 213 is provided on a substrate 212, and the trigger circuit applies a trigger signal to the switch elements 14 through signal lines 214 to 217 formed on the substrate 212, and through trigger terminals 218 of the switch elements 14.

The thus constructed switch device 15 consisting of the plurality of switch elements 14 has the problems on the switching operation as follows.

Those problems will be described using a case where the switch device 15 is applied to the excimer laser device. In the following description, a "switch time" is defined as the time which is required for the voltage across the capacitor 2 in FIG. 1 to fall from 90 to 10% of a predetermined voltage. The rise time of a high voltage applied to the pair of electrodes 9 in FIG. 1 is within 100 to 300 ns. The switch time of the switch device 15 that is required at that time, must be 50 ns or less. In a case where the switch device 15 consists of a number of high speed switch elements 14, if those switch elements 14 are asynchronously switched, many problems arise. For example, the switch time of the whole switch device 15 is elongated, an overcurrent flows into the switch element 14 switched earlier than the other switch elements, and an overvoltage is applied to the switch element 14 switched later than the others. In the latter two cases, the switch elements are damaged or reduced in lifetime. Preferably, it is necessary to synchronize the switching operations of the switch elements 14, so that before the voltage assigned to one switch element falls to 20% of its initial value after the switch elements 14 are turned on, the remaining switch elements 14 are turned on. That is, it is necessary that the synchronization is achieved in terms of time within 10 ns or less.

The control circuit 211 of FIG. 8 is designed such that one trigger circuit 213 applies a trigger signal to the respective switch elements 14. Therefore, the signal lines 214-217 are not equal in length to each other. As a result, the switch elements 14 are driven at different time points. That is, the switching operations of those elements cannot be synchronized within a predetermined time. Thus, a jitter occurs in the fall of the voltage as shown in FIG. 9, and the switch time exceeds a predetermined switch time (for example, 50 ns).

In the series-parallel circuit of the switch device 15 shown in FIG. 3, when coincidence among the conduction timings of the parallel circuits is lost, overvoltage is applied to those parallel circuits later conductive, possibly destroying the high speed solid-state switch elements 14 such as FETs. To cope with this, protecting circuits 316 shown in FIGS. 10 and 11 were proposed by the applicants of the present Patent Application.

The protecting circuit 316 shown in FIG. 10 is constructed such that a reverse-current blocking diode 317 and a parallel circuit consisting of a capacitor 318 and a resistor 319 are connected in series. The protecting circuit 316 is connected in parallel to each parallel circuit 320 consisting of the switch elements (FETs) 14.

In the protecting circuit 316 thus constructed, when an overvoltage is applied to the parallel circuit 320 and the current flows through the parallel circuit, the capacitor 318 is gradually charged through the diode 317 according to a time constant determined by the capacitor 318 and the resistor 319. Accordingly, the overvoltage is not directly applied to the switch elements 14, thereby protecting the switch elements.

In the protecting circuit 316' shown in FIG. 11, a reverse current blocking diode 321 and an FET 322 are connected in series. A series circuit consisting of a Zener diode 323, a reverse current block diode 324, and a resistor 325, is branched from the cathode of the reverse current blocking diode 321. A node between the reverse current block diode 324 and the resistor 325 is connected to the gate terminal of an FET 322.

In the protecting circuit, when an overvoltage is applied to the parallel circuit 320', the Zener diode 323 becomes conductive through the reverse current blocking diode 321 and voltage appears across the resistor 325. This voltage is applied to the gate terminal of the FET 322, which in turn is conductive. As a result, the current caused by the overvoltage flows through the diode 321 and the FET 322, thereby protecting the switch elements (FETs) 14.

As seen from the foregoing description, the protecting circuits 316 of FIGS. 10 and 11 are both by-paths for the current caused by the overvoltage.

Since the switch device 15 with the conventional protecting circuit 316, 316' is thus constructed, if the switch device 15 is applied to the discharge circuit as shown in FIG. 1, the following problems arise.

When, in each of the parallel circuits 320, 320' shown in FIGS. 10 and 11, a power source (not shown) is provided on the left side on the drawings of those figures, inductance L of the conductor constituting a current loop for the current I at a location close to the power source is smaller than that at a location distant from the power source. FIG. 12 is a diagram useful in explaining the reason for this. In the figure, an area of the current loop of the current I is A and its depth is "l". In an actual circuit, the parallel circuits 320, 320' are arrayed in parallel while extending in the direction "l". Accordingly, "l" indicates the length of the array, and is a fixed length in the description to follow.

In FIG. 12, inductance L of the conductor forming the current loop I is given $$L = \mu_o \times (A/l) \tag{1}$$

where $\mu_o$: dielectric constant.

The equation (1) indicates that in FIG. 12, the inductance L becomes larger toward the right side of the current loop I. The cross sectional area enclosed by the current loop I is referred to as the "inner side of the current loop". Then, inductance L of a subcurrent-loop within a main current loop is smaller than that outside the main current loop. To be more specific, in each of the circuits of FIGS. 10 and 11, with regard to the switch elements (FETs) 14 making up the parallel circuit 320, 320', the inductance L of the current loop for the switch elements (FET) 14 on the left side is small, and that for the switch elements (FET) 14 on the right side is large. The current I depends on the inductance L as follows:

$$I = Vo \sqrt{\frac{C}{L}} \sin \frac{t}{\sqrt{LC}} \tag{2}$$

where
Vo: Voltage
C: Synthesized capacitance of capacitors 2 and 8
t: Time.

FIG. 13 is a graph showing waveforms of the current I for two different inductances L and L' (L'<L As seen from the graph, in the case of the small inductance L', the current waveform is sharp within a short time.

As seen from the foregoing description, in the circuits of FIGS. 10 and 11, even if the protecting circuit 316 is used, an overvoltage is earlier applied to the switch elements (FETs) 14 on the left side, viz., in the inner side of the current loop than the protecting circuit 316, 316'. As a result, the switch elements (FETs) will be destroyed.

FIGS. 14(A) and 14(B) are circuit diagrams showing a conventional pulse generating circuit for a discharge excited pulse laser as disclosed in Japanese Patent Application No. Heisei 2-34251. In the figures, reference numeral 42 designates a charge reactor; 43 a charge diode; 44 a main capacitor for charge and discharge; 45 a charge resistor; 46 a peaking capacitor; and 47 a discharge tube (laser tube) for generating a laser output by heating and evaporating metal (e.g., copper) contained therein through the gas discharge. A switch 415 for pulse generation consists of a number of FETs (field effect transistors) 49 as solid-state switch elements. Those FETs are connected in parallel to one another, and those parallel connections are connected in series. One specific FET 49A (also called an overvoltage protecting FET) of those FETs 49 of each parallel connection is connected such that the gate of the FET 49A is not connected to the gates of the other FETs 49.

A series connection of a Zener diode 411 and a diode 412 is connected between the gate and drain of the overvoltage protecting FET 49A. A resistor 413 is connected between the gate and source of the FET 49A. The Zener diode 411, the diode 412, and the resistor 413 make up a dynamic clamper. A diode 420, coupled with the drain of the FET 49A, is a reverse-current blocking diode.

When a gate signal is applied to the series-parallel connected FETs 49, the FETs 49 are turned on. A large charge voltage across the main capacitor 44 is applied through those FETs 49 to the discharge tube 47, feeding the discharge current thereto. If the coincidence among the switch timings of the FETs 49 is lost in an FET series connection, for example, a switch time $t_1$ of one of the FETs 49 in the first series-connection stage $S_1$ among those stages $S_1$ to Sn is behind the switch time $t_0$ of each of the FETs 49 of the remaining series-connection stages (FIG. 15(a)), a large voltage is concentrically applied across the source-drain paths of the FETs in the first series-connection stage (FIG. 15(b)). Under this condition, the FETs 49 in the first series-connection stage will possibly be damaged. When the overvoltage in excess of the Zener voltage Vb shown in FIG. 16 is applied to the Zener diode 411 connected between the drain and gate of the FET 49A, which is connected across the FET 49 in the first series-connection stage, since the diode cannot withstand the voltage exceeding the voltage Vb, current flows through the diode 412 to the resistor 413. The current $i_b$ flowing into the resistor 413 is as shown in FIG. 15(d). Accordingly, the voltage across the resistor 413 rises and the gate voltage also rises (FIG. 15(c)). When the gate voltage exceeds the threshold voltage, the drain-source path of the FET 49A immediately becomes conductive. Under this condition, the current, which otherwise is to be shunted into the respective FETs of the first series-connection stage, concentrically flows through the drain-source path of the FET 49A. Meanwhile, stray inductance 421 is parasitic on the source of the FET 49, and parallel stray inductance 422 is parasitic on the source of the FET 49A, as shown in FIG. 14(b). In the FIG. 14 circuit, the arrangement of circuit components are usually laid out so that the stray inductance 422 has a small value. If not so laid out, the rise of the current $i_b$ flowing through the resistor 413 becomes dull, and the rise of the gate voltage of the FET 49 becomes gentle. The conduction of the FET 49A retards, making its protecting function ineffectual. It is for this reason that the stray inductance 422 is selected to be smaller than the stray inductance 421. Accordingly, immediately after the FET is switched, the reverse current will flow into the FET 49A of the lower inductance by the electric energy stored in the stray inductances 421 and 422. The reverse-current blocking diode 420 blocks the rush of the reverse current into the FET 49A, thereby to protecting the FET 49A from being destroyed by the reverse current.

In the pulse generating circuit thus constructed, if the conduction timings of the series-parallel connected FETs are staggered, the FET (e.g., FET 49A) in the bank in which the conduction timing is behind may be destroyed by an overvoltage applied thereto. To cope with this, a dynamic clamper is connected in series to each FET, thereby to prevent the overvoltage being applied to the FET. However, since the overvoltage destruction of the FET is due to instantaneous electric energy, even the response delay of the Zener diode cannot be neglected. A slight response delay of the Zener diode, when combined with bad conditions, possibly leads to the overvoltage destruction.

FIGS. 17 and 18 are a side view and a perspective view showing a conventional discharge excited laser device as disclosed in Japanese Patent Application No. Heisei 2-163228. In the figure, reference numerals 1A and 1B indicate solid-state switch elements of 500 ns or less in switching time. Radiating plates 2A and 2B are provided for cooling the solid-state switching elements 1A and 1B. Conductive plates 3A, 3B, 60, 7A and 7B allow large current to pass therethrough. Numeral 2 designates a charge capacitor; 5 a case; 8 a peaking capacitor; and 9 discharge electrodes. FIG. 19 is an electric circuit showing the discharge portion in FIGS. 17 and 18. In the figure, reference numeral 10 designates a high voltage power source; and 11 and 12 charge reactors.

The operation of the discharge circuit shown in FIG. 19 is the same as that of the discharge circuit shown in FIG. 1 in which the thyratron 1 is used for the solid-state switch elements 1A and 1B. In the circuit shown in FIG. 19, the solid-state switching elements 1A and 1B are stacked in a multiple of stages, in order to obtain a high breakdown voltage. A number of banks of the switching elements are arrayed in parallel in the optical axis, in order to obtain a large current capacity. As viewed in the direction orthogonal to the optical axis, the switch groups are disposed on both sides of a phantom line passing through the paired discharge electrodes. Two discharge energy transfer loops are formed. One is a counterclockwise loop of charge capacitor 2 - conductive plate 60 - conductive plate 7A - solid-state switching element 1A - conductive plate 3A - conductive plate 60 - charge capacitor 2. The other is a clockwise loop of charge capacitor 2 - conductive plate 60 - conductive plate 7B - solid-state switching element 1B - conductive plate 3B - conductive plate 60 - charge capacitor 2. The direction of current flow of one loop is opposite to that of the other loop, so that the inductances caused by the currents are canceled out. Further, the switching elements 1A and 1B are disposed separately from each other in the optical axis direction. Such a layout of the switching elements successfully eliminates the phenomenon of the temporary current concentration, which may occur when the thyratron as a switch device is used. The result is a considerable reduction of the inductance of the charge transfer loop, and the consequent increase of dv/dt. Hence, a uniform and stable discharge can be obtained. For example, when the switch elements 1A and 1B of 40 ns in switching time is used, 100 nH or less of an overall inductance is attained.

In the solid-state switch device thus constructed, the portions of the switch device near the radiator plates is satisfactorily cooled, but the inner portion and some specific portions are unsatisfactorily cooled. As a result, a nonuniform temperature distribution appears in each of the solid-state switch elements (switches, such as FETs, IGBTs, and SITs, or other types of switches having a switching time comparable with that of the former switches) or in modules containing a plurality of switch elements. Accordingly, their switching characteristics are also not uniform, so that an overvoltage is applied to the switches turned on later. Extremely, those switches are destroyed.

FIG. 20 is a circuit diagram showing a conventional discharge excitated pulse laser device. FIG. 21 is a diagram showing waveforms for explaining the operation of the pulse laser device. In FIG. 20, reference numeral 141 designates a capacitor for storing energy for the main discharge; 142 a peaking capacitor; 143 a charge inductance; 144 a high voltage switch such as a thyratron for starting the discharge; 145 a first main electrode disposed within a laser medium 1410, the longitudinal direction of which coincides with the laser optical axis direction; 146 a second main electrode with a plurality of holes, which is disposed in opposition to and spaced by a predetermined distance from the first main electrode 145; 147 a dielectric material interposed between the second main electrode 146 and an auxiliary electrode 148 in a sandwich fashion; and 149 a high voltage generator. Letter A indicates a circuit used exclusively for a preparatory ionization. The circuit, provided for oscillation period adjustment, is made up of inductances 1411A, 1411B and a capacitor 1412 directly coupled with each other, for setting a time constant. Numeral 1413 represents a mid point between the time constant setting capacitor 1412 and the auxiliary electrode 148.

The operation of the discharge excited pulse laser device thus constructed will be described. The capacitor 141 is charged, with a high voltage, through the charge inductance 143, and the capacitor 1412 is charged, with a high voltage, through the charge inductances 1411A and 1411B. The charge current path for the capacitor 141 is denoted as 141X, and that for the capacitor 1412, as 141Y. Thereafter, the high voltage switch 144 is turned on. Voltage across the peaking capacitor 142, viz., voltage between the second main electrode 146 and the auxiliary electrode 148, rises like voltage V in FIG. 21. Current having a waveform denoted as $I_A$ in FIG. 21, which is for charging the peaking capacitor 142 and a capacitance formed of the second main electrode 146 and the auxiliary electrode 148, flows from the capacitor 141. A rate of the flow of the current 142X is determined by a combined capacitance of the capacitors 141 and 142, and the capacitor formed of the second main electrode 146 and the auxiliary electrode 148, and a stray inductance in the circuit, and rises within 50 to 100 ns, as current $I_B$ in FIG. 21. At the same time, the circuit, or the preparatory ionization dedicated circuit A, which is made up of the inductances 1411A and 1411B, and the capacitor 1412, which set a time constant, the auxiliary electrode 148, the dielectric material 147, the second main electrode 146, and the high voltage switch 144. The charge, which has been stored in the time constant setting capacitor 1412 and the capacitor constructed with the second main electrode 146, the dielectric material 147, and the auxiliary electrode 148, is discharged therefrom through a path 142Y. Through the discharge, a creeping discharge occurs at the plurality of holes of the second main electrode 146, so that a preparatory discharge is performed.

Assuming that the capacitance of the preparatory ionization dedicated circuit A is C, and the sum of the inductances of the same circuit is L, then the oscillation period is $2\pi\sqrt{LC}$.

Generally, a quantity of charge necessary for the preparatory ionization is approximately 1% of the quantity of charge for the main discharge. Therefore, by setting the C to be small, the oscillation period of the preparatory ionization dedicated circuit A may be 1/10 or less of the oscillation period of the main discharge circuit. Waveforms of the operation as stated above is shown in FIG. 21. As shown, until the main discharge occurs, current $I_B$ of the preparatory ionization oscillates two to three times, improving the uniformity of the preparatory ionization. Thus, the transfer of the main discharge to the arc is suppressed and hence uniform main discharge condition is set up.

Since the conventional discharge excited pulse laser device is thus constructed, if the thyratron is used for the high voltage switch for discharge start, the current of the discharge circuit concentrates at the electrodes to cause great inductance. The great inductance makes it difficult to switch at high speed. To cope with this, a measure has been taken in which the current of the main discharge circuit is temporarily restricted by a saturable reactor, for example, and the preparatory discharge is performed during the current restriction period. The measure makes the circuit construction complicated.

FIG. 22 is a circuit diagram showing a basic pulse generating circuit used for a conventional laser oscillator that is disclosed in IEEE Journal of Quantum Electronics, Vol. QE-15, No. 5, May, 1979, PP311–313. The pulse generating circuit includes a pulse circuit called an LC inverting circuit. In the figure, reference numeral 161 designates a thyratron used as a high voltage switch; 162 a first capacitor $C_1$; 163 a second capacitor $C_2$; 164 a high voltage power source; 165 a charge resistor; and 166 a discharge section.

In operation, the high voltage power source 164 feeds charge current into the following two charge loops; a first loop containing inductive element L, a diode D, the second capacitor 163, and the charge resistor 165; and a second loop including the inductive element L, the diode D, and the first capacitor 162. As the result of the current flow, charge is stored in both the capacitors. At this time, the voltage at point A is zero. Then, the thyratron 161 as a high voltage switch is closed, and the discharge is performed through a loop including the first capacitor 162 and the thyratron 161. As a result, the voltage at point A rises to be doubled. With progress of the above operation, the voltage between the main electrodes in the discharge section 166 rapidly rises and eventually a discharge space is broken down. The energy stored in the capacitor is fed into the discharge section 166. The gas in the discharge space is excited to emit a laser beam by the stimulated emission. In the LC inverting circuit, the charge voltage may be lower than the voltage necessary for the discharge section 166. Therefore, the switch of a low withstanding voltage may be used for the high voltage switch. Additionally, the size of the high voltage power source 164 and the like may be reduced.

FIG. 23 is a circuit diagram showing a discharge section of a conventional discharge excited laser device. This circuit additionally includes a magnetic saturation switch 167 and a peaking capacitor 168. In this circuit, the current flowing into the discharge section 166 is temporarily shut off by utilizing the characteristic of the magnetic saturation switch 167. As far as the magnetic member of the magnetic saturation switch 167 is not saturated, its impedance $\omega L$ is extremely high. When the magnetic member is saturated, the impedance is abruptly decreased. For example, when the thyratron 161 is turned on, the impedance $\omega L$ of the magnetic saturation switch 167 is large, so that the rise of the discharge current is delayed. When the magnetic saturation switch 167 is saturated, charge is transferred to the peaking capacitor 168, and its charge applies a high voltage to the discharge section 166 to cause it to start a discharge.

The conventional discharge excited pulse laser device is thus arranged. Accordingly, a pulse (high frequency) circuit including the inductive element is formed in the charge transfer loop including the thyratron, so that a response time of the loop is long. Thus, a charging time for voltage inversion in the loop including the first capacitor 162 and the thyratron 161 is long. As a result, the discharge is impelled to start before the voltage at point A is doubled. Accordingly, the charge fed into the discharge section is insufficient in amount, and the resultant oscillation efficiency of the laser device is unsatisfactory.

The magnetic saturation switch, when used, is advantageous in that the voltage at point A is doubled and the load for the thyratron is small. However, since the magnetic saturation switch is an active element, when the charge voltage is varied or ambient temperature is varied, the switching time also varies. In this respect, difficulty exists in using this type of the switch.

FIG. 24 is a circuit diagram showing a conventional exciting circuit for an excimer laser as discussed in "Electrical Society Technical Report (Part II), No. 217 (Present State of Shortwave Laser), page 5, issued April, 1986 (Showa 61). In the figure, reference numerals 171 and 172 designate a pair of main discharge electrodes; 173 a peaking capacitor connected in parallel to the main discharge electrodes 171 and 172; and 174 a pulse generating capacitor connected at one end to the main discharge electrode 171. A switch 175, for which a thyratron was used, is connected between the other end of the pulse generating capacitor 174 and the main discharge electrode 172. Numeral 176 represents a charge reactor connected in parallel to the peaking capacitor 173, and numeral 177 indicates a charge terminal.

The operation of the excimer laser exciting circuit thus arranged will be described. When a high positive voltage is applied to the charge terminal 177, a charge current $i_1$ flows through the charge reactor 176 to charge the pulse generating capacitor 174 with the polarities as shown. Under this condition, when the switch 175 is turned on at time point $t_0$, the voltages across the pulse generating capacitor 174 and the peaking capacitor 173 vary as shown in FIGS. 25(a) and 25(b). The pulse generating capacitor 174 at charge voltage $V_1$ starts to discharge, and current $i_2$ flows through the peaking capacitor 173, to perform the charge transfer.

During a period between $t_0 \leq t \leq t_1$, the charge stored in the pulse generating capacitor 174 is transferred to the peaking capacitor 173. At time point $t=t_1$, the discharge starts between the main discharge electrodes 171 and 172, and current $i_3$ flows in the direction of arrow. In the excimer laser, actually, a preparatory ionizing discharge is performed prior to the main discharge. The electrodes and circuit for the preparatory ionizing discharge are omitted in FIG. 24 for simplicity. During a period between $t_1 \leq t \leq t_2$, when energy is injected into the discharge section from the peaking capacitor 173, the main discharge is performed between the main discharge electrodes 171 and 172, to cause a laser oscillation. In the laser of a small discharge resistance (e.g., 0.2 $\Omega$), such as an excimer laser, the voltage $V_2$ across the peaking capacitor 173 takes an oscillation voltage waveform as shown in FIG. 25(b), and hence a voltage of the reversed polarity is caused ($t=t_2$ in FIG. 25(b)). At a time point where the oscillation almost terminates, a voltage having the polarity reverse to that of the voltage at the time of the charging, appears across the pulse generating capacitor 174 (Vr in FIG. 25(a)). The voltage Vr causes the reverse current $i_4$ to flow.

FIG. 26 is a circuit diagram showing another conventional exciting circuit for a pulse laser. In this circuit, the charge in the pulse generating capacitor 174 flows in the form of a charge current $i_{20}$ through a saturable reactor 178, which acts like a switch, and transfers to the peaking capacitor 173. This circuit, generally called an MPC (magnetic pulse compression) circuit, includes additionally another pulse generating capacitor 179 and a current restricting reactor 1710, in order to reduce a switching loss at the switch 175. Operating waveforms of the signals in the MPC circuit are as shown in FIGS. 11(a), 11(b) and 11(c). As in the conventional circuit of FIG. 24, at time point $t=t_1$, the discharge starts between the main discharge electrodes 171 and 172. Subsequently, the reverse current $i_4$ oscillates. Finally, the voltage Vr having the polarity reverse to that of the voltage at the initial stage, appears across the pulse generating capacitor 174.

In the conventional pulse laser device thus constructed, the reverse voltage Vr of the reversed polarity appears across the pulse generating capacitor, after the main discharge current flows. The reverse voltage energy ($=\frac{1}{2}CVr^2$) is consumed in the form of arc or streamer between the main discharge electrodes after a relatively long time (e.g., approximately 1 μs) from the main discharge occurrence. This is called an after-current, and does not contribute to the laser oscillation, but damages the main discharge electrodes to reduce the lifetime of the electrodes. Further, when the after-current flows, the laser device cannot oscillate at a high repetitive frequency.

FIG. 28 is a circuit diagram showing an electrical circuit of another conventional discharge excited pulse laser as disclosed in Electrical Society Technical Report (part II), No. 217 (Present State of Short Wave Laser), P5, issued April, 1986 (Showa 61). In the figure, reference numerals 181 and 182 designate paired main discharge electrodes disposed confronting each other; numeral 183 a peaking capacitor $C_2$ made of $SrTiO_3$ (titanic acid strontium) and disposed in parallel to the main discharge electrodes 181 and 182; numeral 184 a pulse generating capacitor $C_1$, one terminal of which is connected to the main discharge electrode 181. A switch 185 of a thyratron is connected between the other terminal of the capacitor 184 and the main discharge electrode 182. A charge reactor 186 is disposed in parallel to the peaking capacitor 183. Reference numeral 187 designates a high voltage power source. Numerals 188 and 189 indicate inductance components contained in the circuit.

In operation, when a positive high voltage is applied from the high voltage power source 187 to the pulse generating capacitor 184, charge current $i_1$ flows through the charge reactor 186 to charge the capacitor 184 with the polarity as shown. When the switch 185 is turned on, the charge of the capacitor ($C_1$) 184 flows, in the form of pulse current $i_2$, into the peaking capacitor ($C_2$) 183. In this way, the charge transfer is performed. Succeedingly, a discharge starts between the main discharge electrodes 181 and 182, and discharge current $i_3$ flows in the direction of an arrow. In the excimer laser device, a preparatory discharge is performed prior to the main discharge. The electrodes and electric circuit for the preparatory discharge are not illustrated here. When the energy is injected from the peaking capacitor ($C_2$) 183 into the discharge section, the main discharge occurs between the paired main discharge electrodes 181 and 182, causing a laser oscillation. In the laser device of a low discharge resistance (e.g., 0.2 $\Omega$), such as an excimer laser device, the voltage across peaking capacitor ($C_2$) 183 varies as indicated by an oscillation voltage waveform shown in FIG. 30(a). As seen, the voltage component of the inverted polarity is observed. The voltage component Vr of the inverted polarity causes an inverted current (after-current) as shown in FIG. 30(b), which in turn causes an arcing. As a result, the lifetime of the main discharge electrodes 181 and 182, and the laser gas are remarkably reduced.

FIG. 29 is a graph showing a characteristic curve representing a variation of the capacitance of the peaking capacitor ($C_2$) 183 vs. DC voltage, when the capacitor 183 is made of $SrTiO_3$. The graph shows that the capacitance hardly changes even if the voltage is decreased up to a value near to the rated voltage. This shows that after the discharge starts, energy is left in the peaking capacitor ($C_2$) 183, and the residual energy causes the arc discharge owing to the aftercurrent.

In the conventional discharge excited pulse laser device thus constructed, when the peaking capacitor ($C_2$) 183 is made of $SrTiO_3$, its capacitance hardly varies even if the voltage is increased up to approximately the rated voltage. Accordingly, after the discharge starts, energy is left in the peaking capacitor ($C_2$) 183, and the residual energy causes the arc discharge owing to the after-current.

In the charge transfer type circuit, when a voltage higher than the voltage Vo applied from the high voltage power source, is applied to the discharge section, if a ratio of $C_1/C_2$ is set large, the voltage applied to the discharge section can be increased up to a value two times the applied voltage Vo. However, also in this case, after the discharge starts, the amount of charge left in the peaking capacitor is large, so that arc discharge owing to the after-current tends to occur.

SUMMARY OF THE INVENTION

The present invention has been made to solve the above problems, and has an object to provide a switch device using high speed switch elements used for a laser device, which can reduce the circuit inductance of the switch device.

Another object of the present invention is to provide a switch device for a laser device, in which switching operations of respective switch elements contained in the switch device can be readily synchronized.

Still another object of the present invention is to provide a switch device for a laser device in which, to improve the response of a Zener diode of a dynamic clamper, a resistor and a capacitor are each connected in parallel to the Zener diode to accelerate avalanche phenomenon, thereby reducing the time lag between high speed switch elements such as FETs contained in the switch device so that the device is prevented from being damaged by an overvoltage.

Still another object of the present invention is to provide a switch device for a laser device, which can indicate shortcircuit trouble and a shortciruit location when series and/or parallel connected high speed switches are shortcircuited.

Still another object of the present invention is to provide a switch device for a laser device, which can reduce the number of wires.

Still another object of the present invention is to provide a switch device for a laser device, which radiates the heat of high speed switch elements such as FETs to a case.

Still another object of the present invention is to provide a switch device for a laser device, which is highly reliable, while avoiding thermal imbalance among the high speed solid-state switch elements, and improving the cooling efficiency.

Still another object of the present invention is to provide a switch device for a laser device, in which modules containing high speed switch elements can readily be stacked.

Still another object of the present invention is to provide a switch device for a laser device, which can provide an electrically and mechanically stable and firm connection of a control unit with solid-state switch elements or with modules containing the solid-state switch elements.

Still another object of the present invention is to provide a discharge excited pulse laser device in which a switch device consisting of a series-parallel connection of modules containing high speed solid-state switch elements such as FETs, is used for a high voltage switch, thereby reducing inductance and in which a pulse forming line capable of delaying a pulse signal is used for a preparatory ionization dedicated circuit, thereby enabling the start timing of the preparatory ionization to set at the timing of the main discharge.

Still another object of the present invention is to provide a discharge excited pulse laser device in which two separate switches are provided, one for starting main discharge and the other for starting preparatory discharge, and both switches may be turned on and off by a pulsar.

Still another object of the present invention is to provide a discharge excited laser device in which the overall oscillation efficiency is improved by using a switch device including a plurality of high speed switch elements series-parallel connected to reduce its inductance, and an exciting circuit is formed of only a current loop through which no transfer of energy is performed.

Still another object of the present invention is to provide a discharge excited pulse laser device which has improved laser oscillation efficiency, requires no magnetic saturation switch, and is simple and highly reliable.

Still another object of the present invention is to provide a discharge excited pulse laser device which can prevent the main discharge electrodes from being damaged, thereby elongating the lifetime of the electrodes, and can oscillate at a high repetitive frequency.

Still another object of the present invention is to provide a discharge excited pulse laser device which can reduce an after-current even if the ratio of $C_1/C_2$ is set large, and achieve a high oscillation efficiency, with a switch voltage lower than the voltage in the discharge section.

A switch device used for a laser device according to a first aspect of the present invention is constructed such that a plurality of high speed switch elements are fabricated into a module, and the modules are series-parallel connected.

Use of the modules reduces the number of wires and the circuit inductance.

A switch device used for a laser device according to a second aspect of the present invention is arranged such that a plurality of high speed solid-state switch elements and a plurality of trigger circuits for applying trigger signals to the plurality of solid-state switch elements are respectively interconnected by transmission lines of equal lengths.

Since the switch elements are respectively interconnected with the trigger circuits by means of transmission lines of equal lengths, the switching operations of all of the switch elements can be synchronized, thereby eliminating the damage of the switch elements owing to the intolerable asynchronism in the switching operations.

A switch device for a laser device according to a third aspect of the present invention comprises protecting circuits for parallel circuits of high speed solid-state switch elements, which are disposed more inside a current loop than the parallel circuit.

In the switch device, the inductance of the current loop, caused by an overvoltage, is minimized for the protecting circuit. Therefore, current flows through the protecting circuit before it flows into the solid-state switch elements, so that the switch elements are protected from the overvoltage.

A switch device for a laser device according to a fourth aspect of the present invention comprises serial/parallel connected high speed FET switch elements in which at least one overvoltage protecting FET is provided in a series-connection stage of the FET series-parallel connection, a gate of the protecting FET is separated from other FETs, a Zener diode and a diode are connected between the drain and gate of the overvoltage protecting FET and a resistor is inserted between the gate and source thereof, and in which a resistor and a capacitor, each connected in parallel between the drain and gate of the overvoltage protecting FET, are provided for quickening a response of the Zener diode In the switch device, the Zener current of the Zener diode and the discharge current of the capacitor are superposed to promote the Avalanche effect of the Zener diode and hence to quicken the response of the Zener diode. Therefore, the overvoltage applied to the FET, which arises from the response delay of the FET, is lessened, to protect the FET from being destroyed.

A switch device for a laser device according to a fifth aspect of the present invention includes a plurality of indicators for indicating whether or not the series connection, the parallel connection or the series-parallel connection of high speed switch elements is shortcircuited.

The indicators indicate a shortcircuit trouble in the series and/or parallel connection of the high speed switch elements forming a switch group. By the indicators, an operator can quickly know the shortcircuit trouble and a trouble location.

A switch device for a laser device according to a sixth aspect of the present invention is constructed such that modules with terminal plates are selectively and removably inserted between conductive plates disposed in parallel.

In the switch device, the modules are selectively and removably inserted between the conductive plates disposed in parallel. Therefore, the switch device may be constructed by using a desired number of modules. Electrical connection may be made by making the terminal plates of the modules contact with the conductive plates.

A switch device for a laser device according to a seventh aspect of the present invention is constructed such that one end of each drain electrode plate of each module is protruded from the module, and a plurality of modules are stacked with each drain electrode plate sandwiched by the adjacent modules and with the protruded portions arranged in the same direction.

In the switch device, the drain electrode plates, which are protruded from the portions between the stacked modules, serve as radiating fins.

A switch device for a laser device according to a eighth aspect of the present invention comprises a plurality of series-parallel connected high speed solid-state switch elements or a group of series-parallel connected switch modules each containing a plurality of solid-state switch elements: and heat pipes each arranged such that when the solid-state switch elements or the switch modules are arrayed on metal plates and are stacked into a multiple of stages of sandwich structures, and the metal plates serves as heat absorbing means of low thermal resistance, the end portion of each heat pipe is provided with radiating plates for cooling.

The switch device of the invention is free from the problem that some of the switch elements are turned on later than the remaining ones because of the thermal imbalance among the switch elements, so that the overvoltage is applied to the later turned on switches, ultimately destroying the switches.

A switch device for a laser device according to a ninth aspect of the present invention comprises modules each including a plurality of solid-state switch elements and a common conductive plate being connected to the plurality of solid-state switch elements with the same distance from each switch element.

In the switch device, the conductive plate is equidistantly separated from the plurality of solid-state switch elements in each module. Thus, when an electric current is supplied from the conductive plate, the inductances of the current loops for the respective solid-state switch elements are equal to one another. Therefore, the current will not concentrate on specific solid-state switch elements.

A switch device for a laser device according to a tenth aspect of the present invention is constructed such that thin-plate like first and second electrodes, common to a plurality of solid-state switch elements, being provided on the upper and lower surfaces of a module containing a circuit in which a plurality of solid-state switch elements are connected so as to be simultaneously turned on, and a third electrode provided on a surface of the module, which is different from the surfaces bearing the first and second electrodes, or on the same surface as that bearing the second electrode.

In the switch device, the thin-plate like first and second electrodes are provided on the upper and lower surfaces of the module. This feature is suitable for stacking a number of modules, and makes it easy to construct the switch device compact.

A switch device for a laser device according to an eleventh aspect of the present invention comprises modules each containing a plurality of solid-state switch elements, and a control unit. A groove is formed in a case housing the respective modules and terminal portions are provided in the inner surface of the grove. A part of the control unit is formed so as to be fitted into the groove. The control unit has also terminal portions. When the control unit is inserted into the groove of the case, the terminal portions of the groove are connected to the terminal portions of the control unit, respectively.

In the switch device, the part of the control unit is fitted into the groove of the module, so that the terminal portions of the control unit are electrically and mechanically connected to the terminal portions of the groove without fail.

A switch device for a laser device according to a twelfth aspect of the present invention comprises a switch section including a plurality of solid-state switch elements and a control unit, which are housed in a case thereby to form a single unit.

In the switch device, the switch section and the switch elements are packed into one unit. Therefore, the mechanical and electrical connection of the switch section and the switch elements are reliable. The drive times of the switch elements are uniform, providing a stable switching operation.

A switch device for a laser device according to a thirteenth aspect of the present invention comprises modules each provided with pin terminals, and a control unit. The pin terminals of the module are mechanically and electrically connected to the control unit by means of connector means.

From a mechanical standpoint, the connector means provides a firm and sable connection of the module with the control unit. From an electrical standpoint, the connection means provides equal lengths of the signal paths so that the nonuniformity of the switching times is reduced and a good switching characteristic is obtained.

A discharge excited pulse laser device according to a fourteenth aspect of the present invention comprises: main discharge electrodes, disposed within a laser medium, for performing a main discharge to generate a laser beam; a high voltage pulse circuit for causing the main discharge by pulse-discharging the charge stored in a capacitor; a solid-state switch device constructed with series-parallel connected solid-state switch elements, for starting the discharge of the charge from the capacitor; and a pulse forming line for deriving a circuit used exclusively for a preparatory ionization from the high voltage side of the switch device and connecting the circuit to an auxiliary electrode within the laser medium, thereby controlling the timing of inducing a preparatory ionization before the main discharge starts.

In the discharge excited pulse laser device, a high switching operation of the discharge start switch is realized and the preparatory ionization timing preceding to the main discharge can be adjusted.

A discharge excited pulse laser device according to a fifteenth aspect of the present invention comprises: main discharge electrodes, disposed within a laser medium, for performing a main discharge to generate a laser beam; a high voltage pulse circuit for causing the main discharge by pulse-discharging the charge stored in a capacitor; a first solid-state switch device for starting the discharge of the charge stored in the capacitor; a second solid-state switch device for starting a preparatory ionization, before the main discharge, through a circuit used exclusively for a preparatory ionization; and a pulsar for generating trigger pulses to turn on the first and second solid-state switch devices.

In the discharge excited pulse laser device, two switches are independently provided, the first solid-state switch device for the discharge start and the second solid-state switch device for starting a preparatory ionization, and trigger signals to turn on the two switches are generated by the pulsar. Therefore, start timing of the preparatory ionization suitable for performing effective main discharge can be obtained.

A discharge excited excimer laser device according to a sixteenth aspect of the present invention comprises: a capacitor connected in series to a discharge section of the laser device, the capacitor being charged by a high voltage power source; and a solid-state switch device connected in series to a loop for pulse-discharging the energy charged in the capacitor into a discharge section, the switch containing a plurality of high speed switch elements connected in a series-parallel fashion.

In the laser device, the inductance thereof is small, the direct discharge is allowed, and a steep waveform pulse can be obtained.

A discharge excited pulse laser device according to a seventeenth aspect of the present invention comprises a capacitor forming an LC inverting circuit and a switch device causing a pulse discharge within a discharge tube with charging the capacitor with a high voltage applied from a high voltage power source, wherein the switch device includes a plurality of series-parallel connected and simultaneously controlled solid-state switch elements each having a switching function.

The solid-state switch elements, as a high voltage switch for the LC inverting circuit, are, for example, series-parallel connected FET modules. The switch inductance can be reduced, providing a high response performance. Thus, the voltage can be doubled not using a magnetic saturation switch.

A discharge excited pulse laser device according to a eighteenth aspect of the present invention comprises: a pulse generating capacitor connected at one end to one of main discharge electrodes for generating a laser beam through the main discharge, and at the other end to a charge terminal; a peaking capacitor, connected in parallel to the main discharge electrodes, for causing a main discharge of the laser output upon receipt of the charge of the pulse generating capacitor; a switch device connected between the charge terminal and the other terminal of the main discharge electrodes; and a reverse current arresting circuit for arresting the reverse current which is caused by the reverse voltage applied to the main discharge electrodes after the main discharge.

In the laser device, to arrest the reverse current caused by the reverse voltage applied to the main discharge electrodes after the main discharge, the reverse current arresting circuit is connected to a circuit location where the reverse voltage can be reduced. Provision of the reverse current arresting circuit restricts or divides the reverse current flowing through the circuit including the pulse generating capacitor so as to inhibit the reverse voltage from appearing between the main discharge electrodes.

A discharge excitated pulse laser device according to a nineteenth aspect of the present invention comprises: a switch device; a peaking capacitor to which the energy stored in a pulse generating capacitor is transferred through the switch device; and main discharge electrodes for discharging the energy that is transferred to and stored in the peaking capacitor, to emit a laser beam; the peaking capacitor being a voltage dependent capacitor, the capacitance of which decreases as the charge voltage increases.

In the laser device, the peaking capacitor made of titanic acid barium, used as the voltage dependent capacitor, operates such that until the voltage applied to the capacitor is increased up to the rated voltage, its capacitance is reduced to be approximately the half of that before it is charged. Because of this property of the capacitor, even if the $C_1/C_2$ is set large, the after-current after the start of the discharge is suppressed, so that no arcing occurs and the lifetime of the main discharge electrodes is elongated. Further, the voltage of the discharge section can be achieved by using the lower voltage of the switch section. This feature reduces the required number of the series connections of the solid-state switch elements.

BRIEF DESCRIPTION OF THE DRAWINGS

FIGS. 15(a) to 15(d) shows waveforms of key signals in the discharge excited conventional pulse generating circuit;

FIG. 16 is a graph showing a characteristic of a Zener diode;

FIG. 26 is a circuit diagram showing another conventional discharge excited pulse laser device;

FIGS. 27(a) to 27(c) show voltage waveforms useful in explaining the operation of the laser device of FIG. 26.

FIGS. 41 and 42(a) to 42(d) are graphs showing waveforms of key signals in the circuit of FIG. 39;

FIG. 48(c) is a longitudinal sectional view taken on line B-B' in FIG. 48(b);

DETAILED DESCRIPTION OF THE PREFERRED EMBODIMENTS

Figure 1:
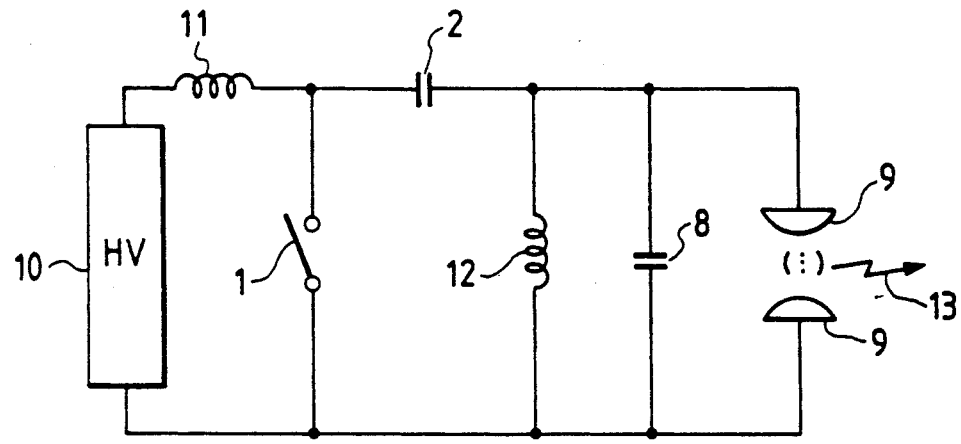
FIG. 1 is a circuit diagram showing a discharge circuit used in a conventional laser device.
Figure 3:
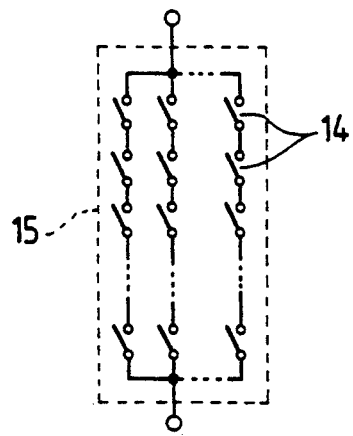
FIG. 3 is a schematic illustration of a conventional switch device used for a laser device, which consists of a number of FETs.
Figure 31:
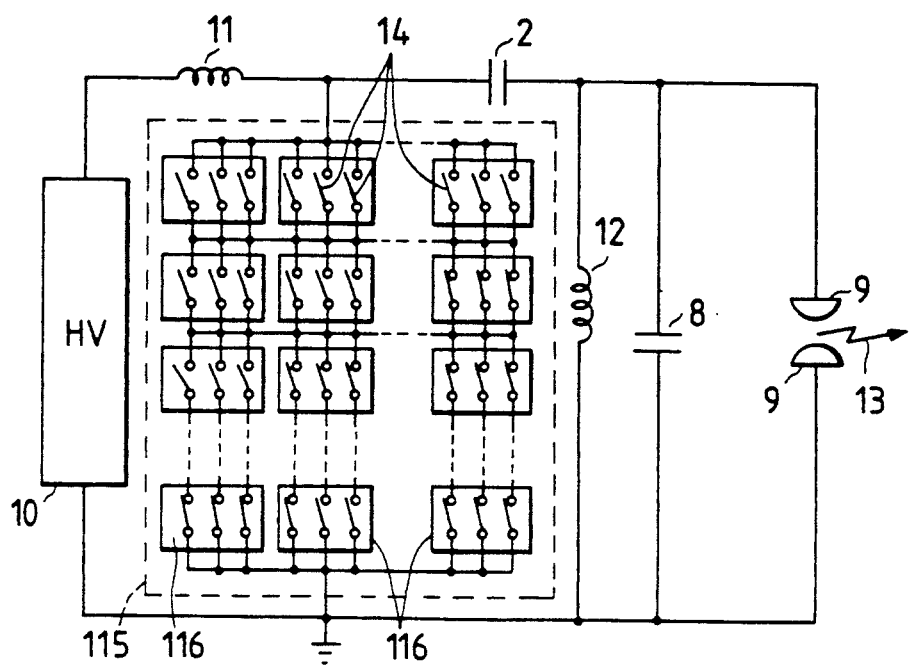
FIG. 31 is a circuit diagram showing a discharge circuit incorporating a switch device for a laser device according to a first embodiment of this invention.

A switch device used for a laser device according to a first embodiment of the present invention will be described with reference to the accompanying drawings. In FIG. 31, like reference symbols are used for designating like or equivalent portions in FIGS. 1 and 3. In this embodiment, field effect transistors (FETs) are used for the high speed switch elements 14.

Figure 32:
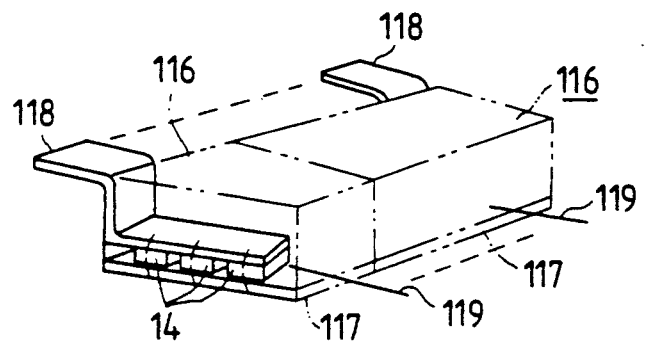
FIG. 32 is a perspective view showing a module unit constituting the switch device of FIG. 31.

In FIG. 32, reference numeral 116 designates a module containing a plurality of FETs 14 connected in parallel (three FETs are illustrated). In this embodiment, the switch device 115 for a laser device is constructed with a number of modules 116 series-parallel connected as shown.

FIG. 32 is a perspective view showing a module unit 116 in which a plurality of modules 116 are arrayed.

A drain electrode plate 117 as a first electrode is provided on one side wall of the module unit 116. A source electrode 118 as a second electrode, shaped like L, is protruded from another side wall of the module unit 116. Linear or pin-like gate electrodes 119 as third electrodes are planted on yet another side wall of the module unit. A parallel circuit of three FETs 14 is contained in the module 116. The drain electrodes of those FETs 14 are connected together to the drain electrode plate 117. The source electrodes of the FETs are connected together to the inside extended portion of the source electrode plate 118. The gate electrodes of the FETs are connected together to the gate electrode 119.

The operation of the switch device thus constructed will be described.

A drive circuit (not shown) applies a trigger signal to the gate electrode 119 of the module 116. The FETs 14 contained in the module 116 are turned on, so that current flows from the drain electrode 117 to the source electrode 118. Accordingly, in the discharge circuit of FIG. 31, if a trigger signal is simultaneously applied to the gate electrodes 119 of all the modules 116, the whole of the switch 115 is turned on, so that the charge stored in the capacitor 2 can be transferred to the capacitor 8.

As described above, since the switch device 115 is constructed with a number of series-parallel connected modules 116, the required number of wires is reduced. Further, since the drain electrode 117 and the source electrode 118 are shaped like a plate, the circuit inductance can be reduced, improving the switching characteristic.

Figure 33A:
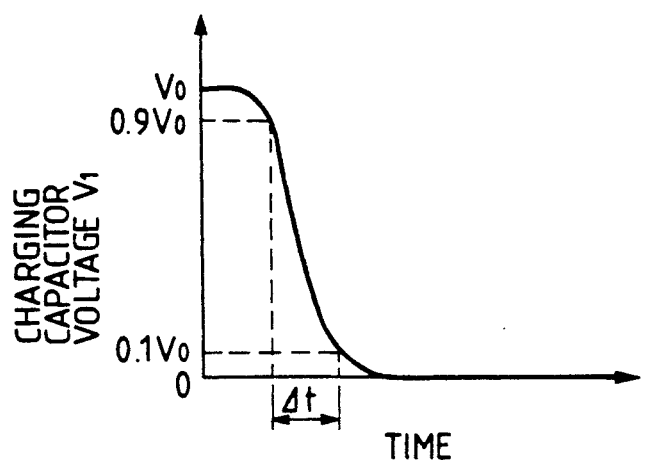
FIGS. 33(a) and 33(b) show graphs depicting switching characteristics.
Figure 33B:
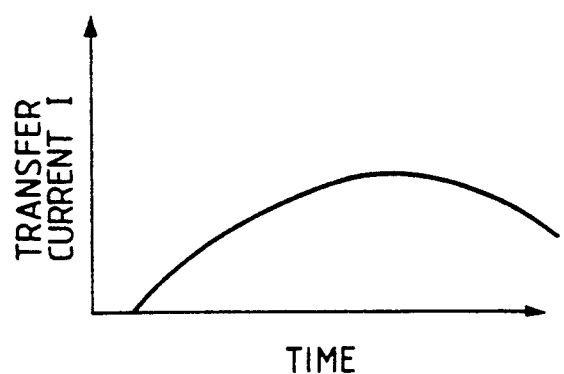

FIGS. 33(a) and 33(b) show graphs depicting the switching characteristics of voltage and current in the circuit of FIG. 31. In the graph of FIG. 33(a) $\Delta t$ indicates a switching time required for reducing the initial voltage from 90 to 10% of its full amplitude. In this embodiment, use of the modules can satisfactorily reduce the switching time $\Delta t$.

Figure 34A:
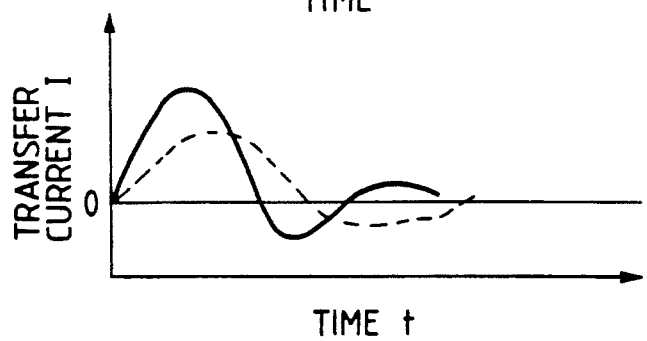
FIGS. 34(a) and 34(b) show graphs comparatively depicting current vs. time and voltage vs. time characteristics of the discharge circuit according to the invention and the conventional one.
Figure 34B:
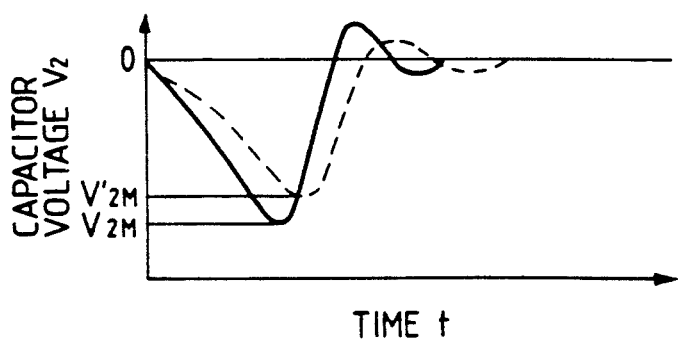

FIGS. 34(a) and 34(b) show graphs depicting characteristics useful in explaining the effects of the embodiment. In the figures, a curve indicated by a dotted line represents the characteristic of the switch device constructed not using the modules. A curve indicated by a solid line represents the characteristic of the module switch device. In the case of the module switch device, the inductance of the switch portion is reduced. As a result, the peak value $V_{2M}$ of the voltage across the capacitor 8 rises and the exciting efficiency of the laser medium is increased. Thus, a laser output can be efficiently produced.

Figure 35:
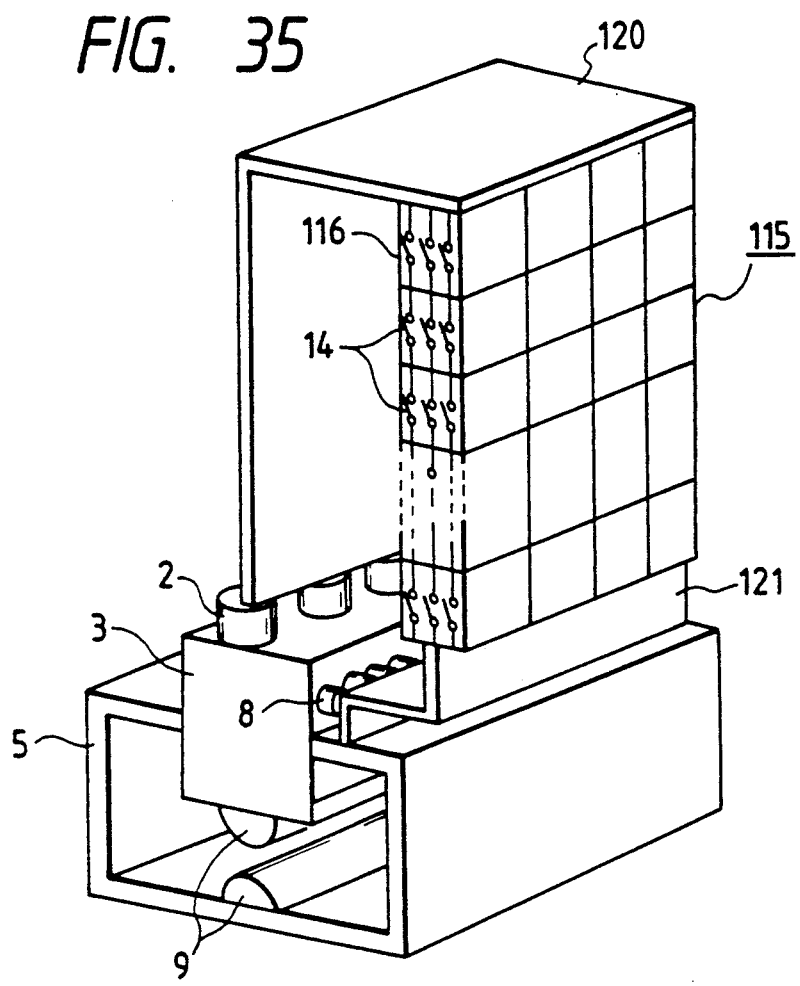
FIG. 35 is a perspective view of an excimer laser device incorporating the switch device of the invention.

FIG. 35 is a perspective view of an excimer laser device incorporating the switch device 115 for a laser device according to the first embodiment. In the figure, like reference symbols are used for designating like or equivalent portions in FIG. 2.

In FIG. 35, the switch device 115 is constructed with a stack of a number of modules 116. The switch device 115 is supported by two conductive plates 120 and 121. The conductive plate 120, shaped like an L in cross section, is connected at the fore end to the uppermost module 116, and at the lower end to the charge capacitor 2. The conductive plate 121, shaped in a zig-zag fashion, is connected at the fore end face to the lowermost module 116, and at the lower end to the container 5 and the capacitor 8.

With such an arrangement, after the capacitor 2 is charged, a module drive unit (not shown) controls all the modules 116 to turn on all the FETs 14. The result is to transfer the charge stored in the capacitor 2 through the conductive plate 120, the switch device 115 and the conductive plate 121 to the capacitor 8.

In the embodiment as mentioned above, the FETs 14 are used for the high speed switch elements, but those may be replaced with other switch elements, such as IGBTs and thyristors.

Further, the FETs 14 in the module 116 are connected in parallel, but those may be connected in a series or series-parallel fashion.

As seen from the foregoing description, a plurality of high speed switch elements are fabricated into a module. Modules are connected into a series-parallel circuit. Therefore, the circuit inductance is reduced. A high speed switching characteristic is obtained. Further, the wiring and maintenance work is easy.

Figure 8:
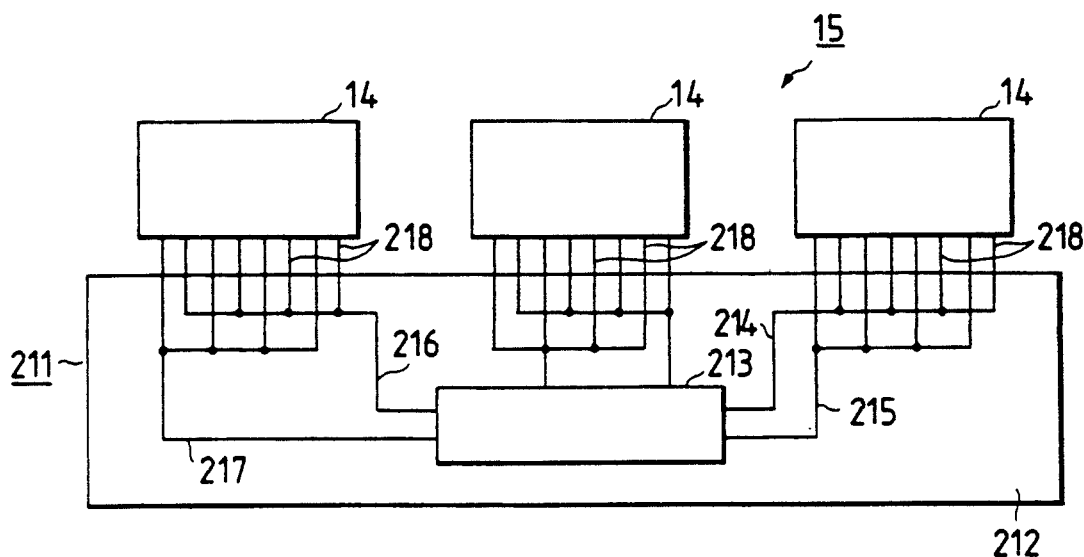
FIG. 8 is a block diagram showing a conventional switch device.
Figure 9:
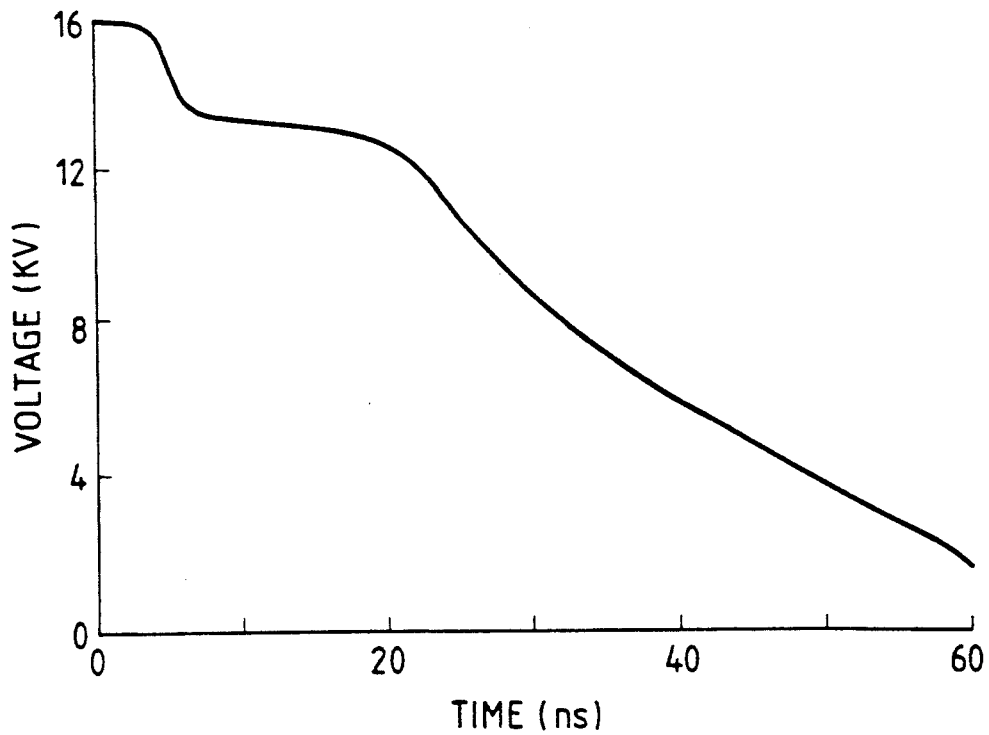
FIG. 9 is a graph showing a switching characteristic of the conventional switch device of FIG. 8.
Figure 10:
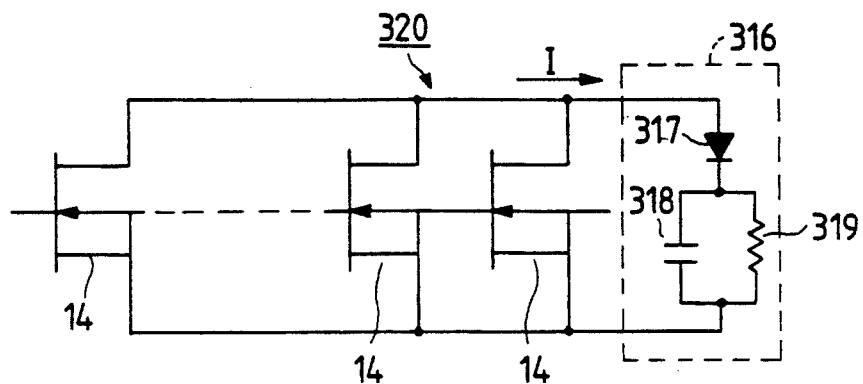
FIGS. 10 and 11 are circuit diagrams showing protecting circuits used for a conventional switch device.
Figure 11:
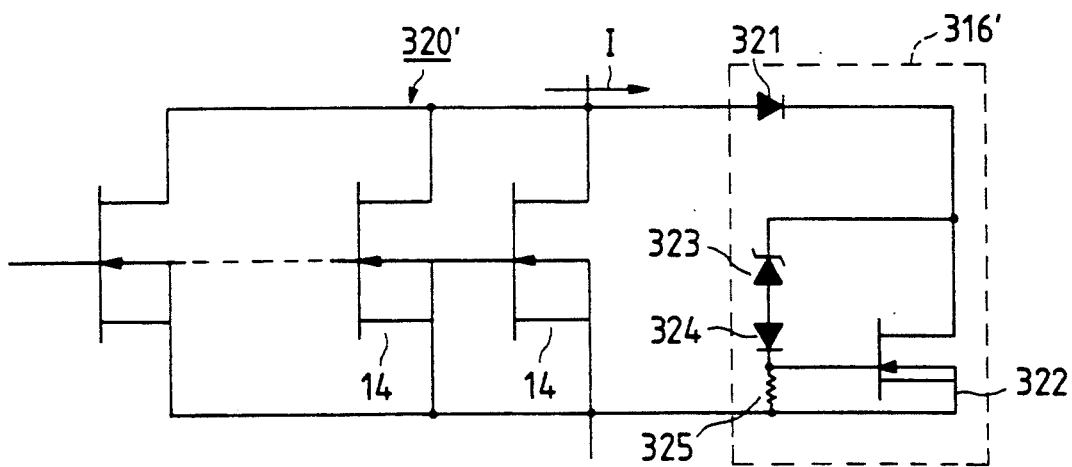
Figure 36:
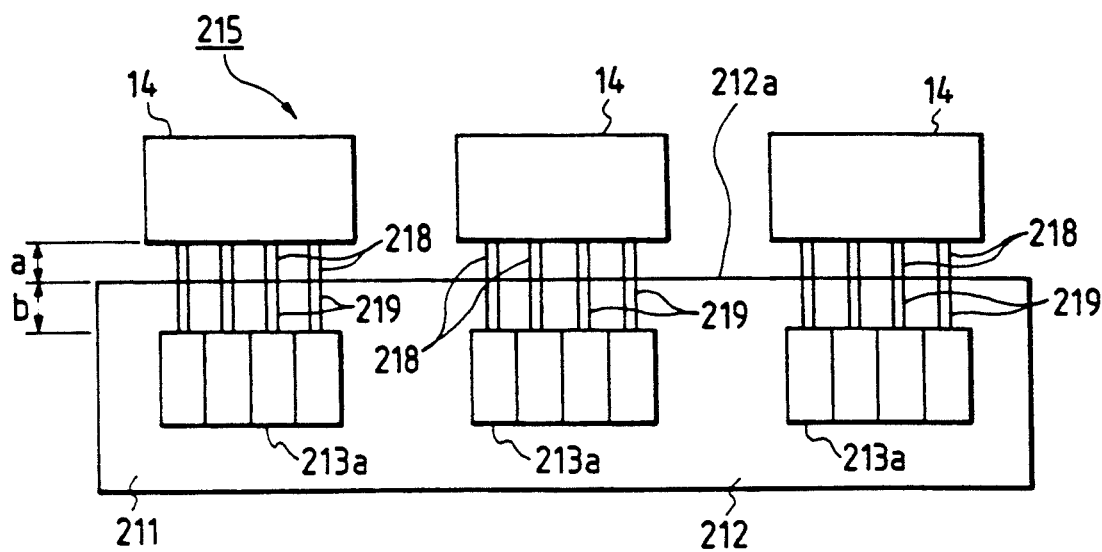
FIG. 36 is a circuit diagram showing a second embodiment of a switch device according to this invention.
Figure 37:
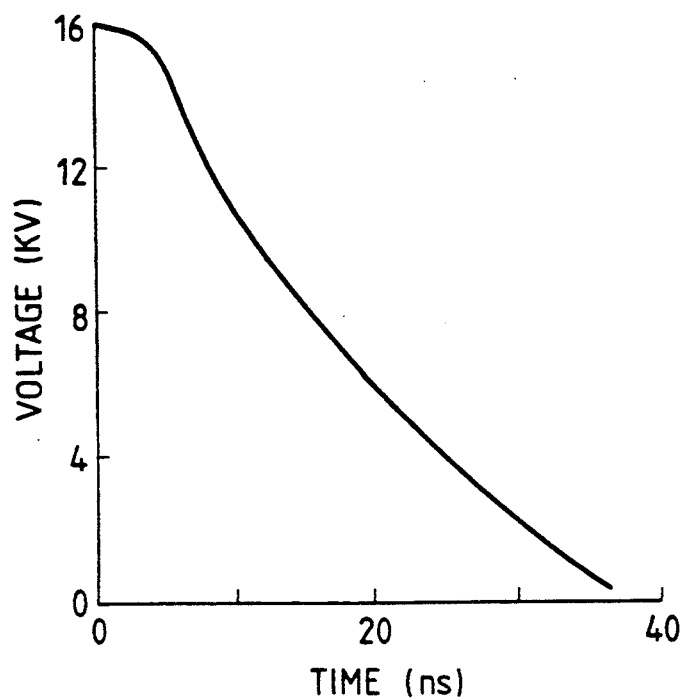
FIG. 37 is a graph showing a switching characteristic of the switch device of FIG. 36.

A second embodiment of this invention will be described with reference to the accompanying drawings. In FIG. 36, like reference symbols are used for designating like or equivalent portions in FIG. 8.

In FIG. 36, a plurality of trigger circuits 213a, provided respectively for switch elements 14, are formed on a substrate 212. Signal lines 219 of equal lengths "b" are extended from the trigger circuits 213a to the leading edge 212a of the substrate 212. Trigger terminals 218 of the switch elements 14, having equal lengths "a", are respectively connected to the signal lines 219.

One signal line 219 and one trigger terminal 218 make up one transmission line of length "a+b".

The operation of the switch device 215 thus arranged will be described.

In the switch device arranged as shown in FIG. 36, the trigger circuits 213a apply trigger signals to the switch elements 14 through the signal lines 219 of equal lengths and the trigger terminals 218 also having equal lengths. With this, the switching operations of the switch elements 14 can be synchronized within a required switch time (for example, 50 ns). Therefore, the switch elements 14 can be protected from damage. Also, when the switch device is applied to a laser device, a stable discharge is ensured.

As seen from the foregoing description, in the switch device of the second embodiment, the trigger circuits are respectively provided for the switch elements, and interconnected with the switch elements by means of transmission lines of equal lengths. Accordingly, the switching operations of all the switch elements can be synchronized. Thus, the problem of damaging the switch elements can be solved, and a stable discharge of a laser device, when the switch device is applied thereto, is obtained.

Figure 38:
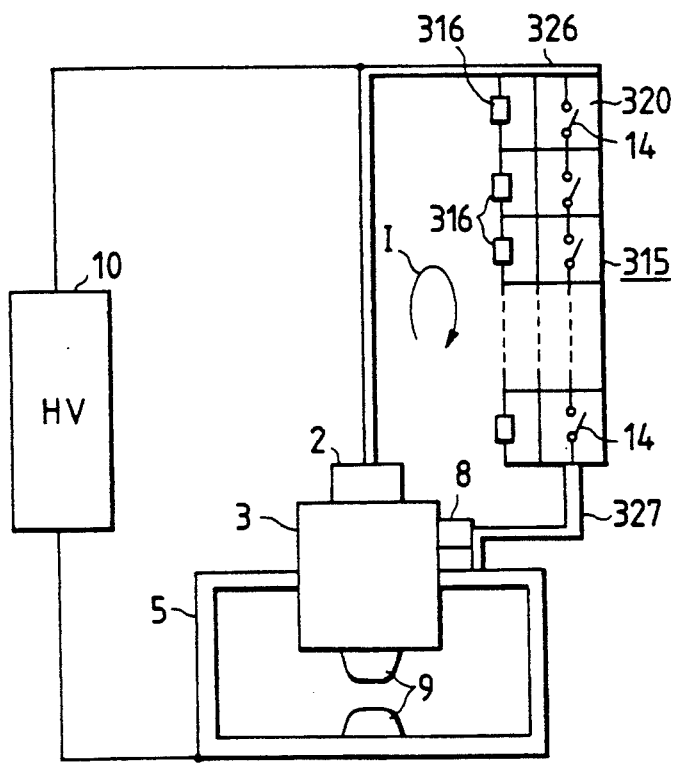
FIG. 38 is a block diagram showing a laser device into which a third embodiment of a switch device according to the invention is incorporated.

A third embodiment of the present invention will be described with reference to the accompanying drawings. FIG. 38 is a block diagram showing an excimer laser device in which a switch device 315 is applied. In the figure, like reference symbols are used for designating like or equivalent portions in FIGS. 1, 2, 10, and 11.

In FIG. 38, a conductive plate 326 shaped like an L in cross section is connected at the lower end to the capacitor 2. Another conductive plate 327 is connected at the lower end to the capacitor 8.

The switch device 315 of this embodiment is supported at the top and bottom by the two conductive plates 326 and 327. The conductive plates 326 and 327 extend in the direction orthogonal to the surface of the drawing of FIG. 38. The parallel circuits 320 of a number of the FETs 14 are disposed between the extended portions of the conductive plates. The high voltage power source 10 is inserted between the conductive plate 326 and the case 5.

In this embodiment, the protecting circuits 316 are connected in parallel to the parallel circuits 320, at the end of the parallel circuit 320, which is closer to the capacitor 2 as the power source for the parallel circuit. The protecting circuits 316 have the construction shown in FIG. 10 or 11.

The operation of the excimer laser thus arranged will be described.

The capacitor 2 is charged through the conductive plate 326 by the high voltage power source 10, and then the switch device 315 is turned on. The switch device 315 is controlled by a control circuit, not shown, in a manner that the control circuit applies a trigger signal to a gate terminal common to the FETs 14 of each parallel circuit, to turn on all the FETs 14. When the switch device 315 is turned on, the charge stored in the capacitor 2 is transferred to the capacitor 8, through the conductive plate 326, the switch device 315, and the conductive plate 327. Consequently, a discharge occurs between the paired electrodes 9, to emit a laser beam.

Let us suppose that when the switch device 315 is conductive, the conduction timing of a specific parallel circuit 320 delays behind that of the remaining ones. The voltage across the capacitor 2 is applied to the specific parallel circuit 320. Until the specific parallel circuit 320 becomes conductive, the voltage grows to be an overvoltage. The current caused by the overvoltage flows into the parallel circuit. It is noted that the protecting circuit 316 is disposed at the location closer to the capacitor 2 as the power source than the FETs 14 of the parallel circuit 320. Therefore, the inductance of the current loop of the current I for the protecting circuit 316 is lower than those for any other FETs 14. Accordingly, the current I first flows into the protecting circuit 316, thereby protecting the FETs 14 against the overvoltage.

It is evident that the FETs for the solid-state switch elements may be replaced by any other switch elements, such as IGBTs and thyristors.

As described above, in this embodiment, the protecting circuits for the parallel circuits consisting of the solid-state switch elements are each disposed close to the power source of the parallel circuit. Accordingly, when one parallel circuit conducts late behind the remaining ones and an overvoltage is applied to the parallel circuit, the current caused by the overvoltage necessarily flows into the protecting circuit. Therefore, the solid-state switch elements can be protected against the overvoltage without fail.

Figure 14A:
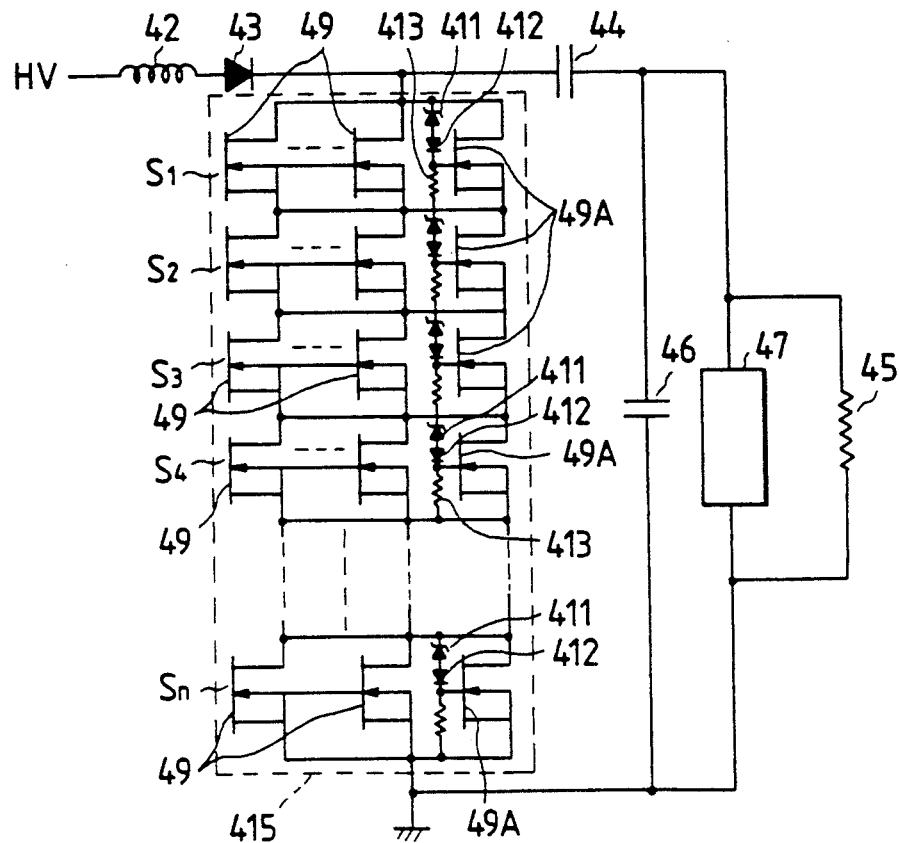
FIG. 14(a) is a circuit diagram showing a conventional discharge excited pulse generating circuit.
Figure 14B:
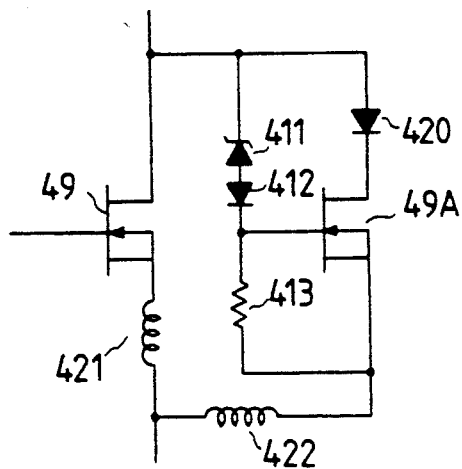
FIG. 14(b) is a circuit diagram showing a conventional overvoltage protecting circuit used in the conventional discharge excited pulse generating circuit.
Figure 39:
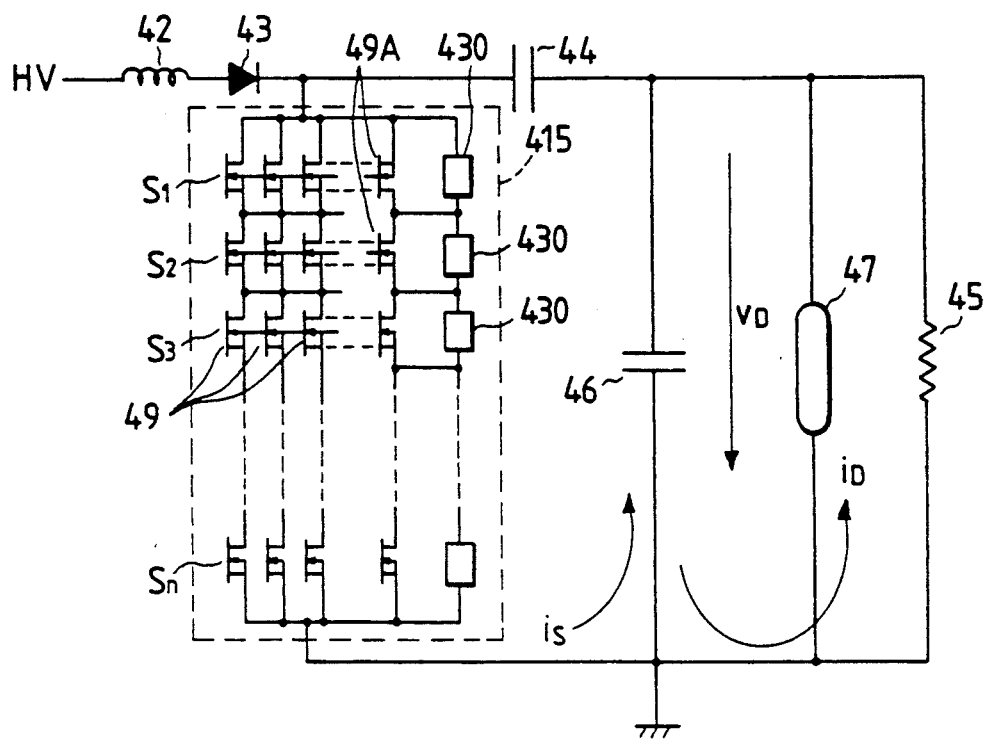
FIG. 39 is a circuit diagram showing a fourth embodiment of the present invention.
Figure 40:
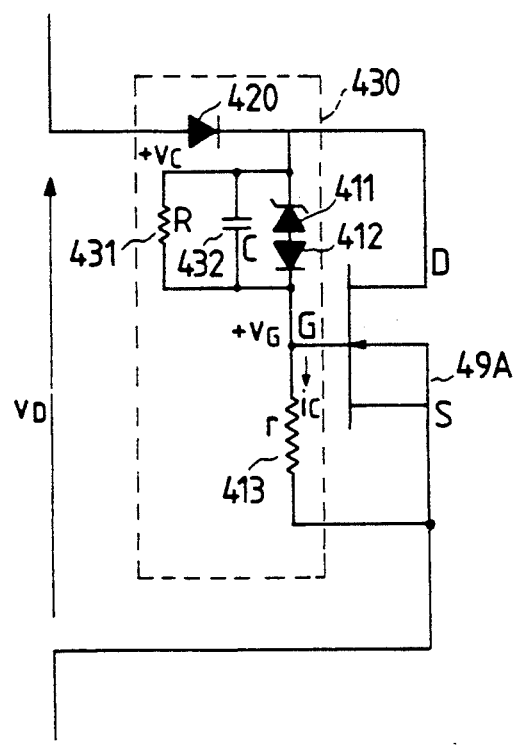
FIG. 40 is a circuit diagram showing a circuit including an overvoltage protecting FET used in the circuit of FIG. 39.

A fourth embodiment of the present invention will be described with reference to the accompanying drawings. In FIGS. 39 and 40 in which like or equivalent portions are designated by like reference symbols in FIG. 14, reference numeral 430 designates a high speed dynamic clamper; 431 a resistor; and 432 a capacitor.

The operation of the pulse generating circuit thus arranged will be described. The circuit operation for generating a laser beam is the same as that of the FIG. 14(a) circuit, and hence the detailed description thereof is omitted here. In the FIG. 39 circuit, normally, voltage $v_0$ is uniformly distributed to the series-connection stages $S_1$ to $S_n$. When the switch 415 is turned on, and discharge current $i_3$ flows from the capacitor 44 into the peaking capacitor 46. After a preset time elapses from then, the discharge tube 47 starts to discharge and send out a pulsative discharge current $i_0$. However, at this time, if the instantaneous response times of the FETs 49 become noncoincident in the series-connection stage, the current, which otherwise is to be shunted into the FETs 49 in the first stage, concentrically flows into the source-drain path of the FET 49A, causing an overvoltage. One measure, which has been taken for the overvoltage problem, is to protect the FETs 49 by destroying the FET 49A by the overvoltage, when it occurs, that is, the FET 49A is used as a fuse. Another measure in which the destruction of the FET 49A can be avoided, has also been taken. One of the possible effective ways to reduce the concentric current by lessening the overvoltage is to quicken the response time of the FET 49A as high as possible, to thereby reduce the destructive instantaneous electric energy. The delay of the response of the FET 49A depends largely on the delay of the response of the Zener diode 411. Bearing this in mind, in this embodiment, the high speed dynamic clamper 430 is provided in which, as shown in FIG. 40, the resistor 431 and the capacitor 432 are each connected in parallel to the series connection of the Zener diode 411 and the diode 412. As shown in FIGS. 42(a)–42(d), even when the series-connection stage $S_1$ of the FET 49A is turned on with a slight delay behind the turning on of the series-connection stages $S_2$ to $S_n$ of the FETs 49, the high speed dynamic clamper 430 reduces the on-time.

As shown in FIG. 41, the FET 49A is charged at charge voltage $v_c$. The charge voltage is equal to the voltage of the series-connection stage $S_1$ at time point $t_0$. If the series-connection stages $S_2$ to $S_n$ are conductive at time point $t_0$, the voltage $v_D$ of the series-connection stage $S_1$ will abruptly rise. At this time, as the voltage $v_D$ increases, current flows into the capacitor 432. The current passes through the resistor 413, causing voltage $v_G$. When the voltage $v_G$ reaches the threshold value at time point $t_x$, the FET 49A starts to conduct and to stop the increase of the voltage $v_D$. That is, the capacitor 432 functions like a Zener diode. The voltage $v_D$ slightly increased during the period between time points $t_0$ and $t_x$ is discharged by the resistor 431 till the next repeating switching time. Since the capacitor generally has no response delay, it can compensate for the response delay of the Zener diode.

As described above, in this embodiment, a Zener diode and a diode, connected in series, are inserted between the drain and gate of the overvoltage protecting FET, the gate of which is separated from the remaining FETs. A resistor and a capacitor are each connected in parallel to the series connection of the diodes. A resistor is connected between the gate and source of the overvoltage protecting FET. With such an arrangement, the Zener current and the discharge current from the capacitor are superposed to promote the avalanche phenomenon. As a result, the response of the Zener diode is quickened, to lessen the overvoltage which may destroy the FET when its response is slow.

A switch device for a laser device according to fifth and sixth embodiments will be described with reference to the accompanying drawings.

Figure 43:
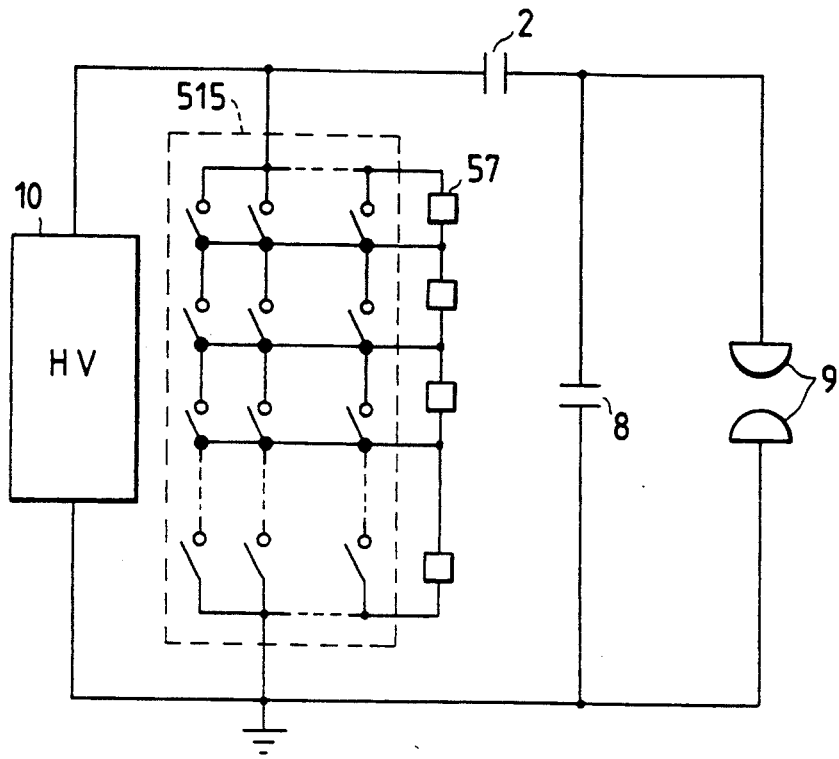
FIG. 43 is a circuit diagram showing an exciting circuit for discharge excited pulse laser device, which incorporates a switch device for a laser device according to a fifth embodiment of the invention.
Figure 44:
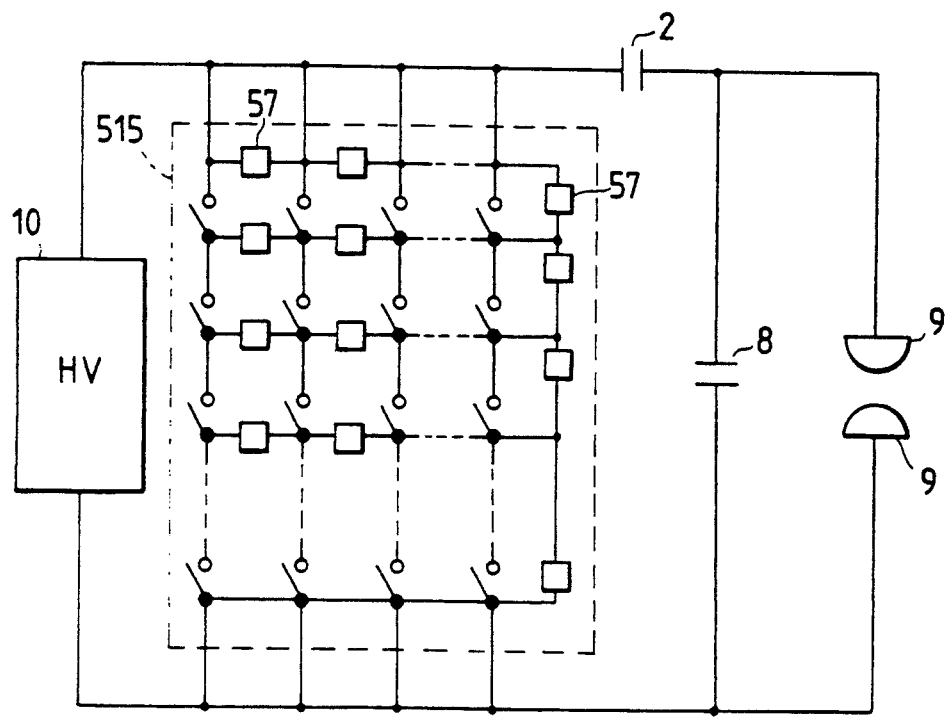
FIG. 44 is a circuit diagram showing an exciting circuit for a discharge excited pulse laser device, which incorporates a switch device for a laser device according to a sixth embodiment of the invention.
Figure 45:
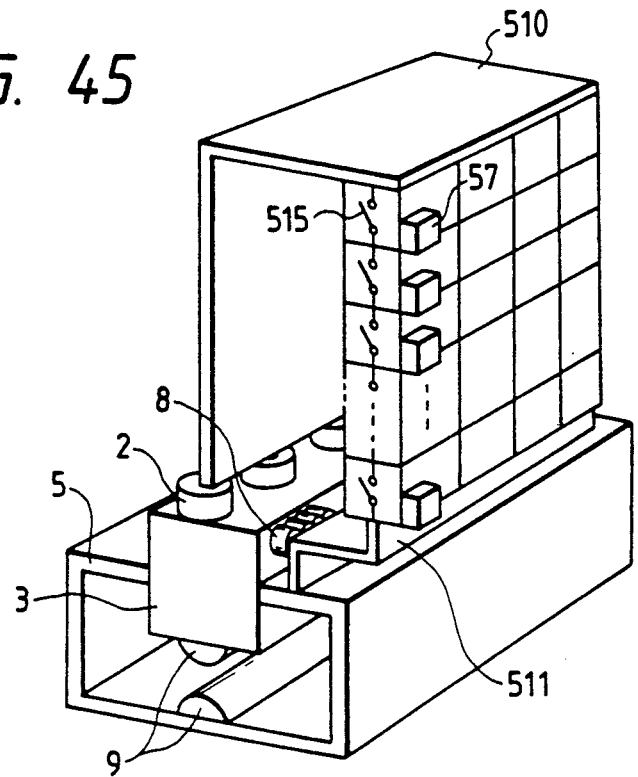
FIG. 45 is a perspective view showing a discharge excited pulse laser device using a switch device of the invention.

FIG. 43 is a circuit diagram showing an exciting circuit for a discharge excited pulse laser device, which incorporates a switch device for a laser device according to a fifth embodiment of the invention. FIG. 44 is a circuit diagram showing an exciting circuit for a discharge excited pulse laser device, which incorporates a switch device for a laser device according to a sixth embodiment of the invention. FIG. 45 is a perspective view showing a discharge excited pulse laser device using a switch device of the embodiment. In those figures, like reference symbols are used for designating like or equivalent portions in FIGS. 1 and 3.

In the figures, a high voltage power source 10 supplies discharge energy. A charge capacitor 2 stores charge from the high voltage power source 10, and discharges the charge toward a pair of discharge electrodes 9. A peaking capacitor 8 makes the waveform of discharge energy be sharp. A switch device 515 interruptedly controls a high voltage applied from the charge capacitor 2 through the peaking capacitor 8 to the paired discharge electrodes 9. The switch device 515 is constructed with series, parallel, or series-parallel connected semiconductor high speed switches such as FETs, IGBTs, and SITs. Indicators 57 as light emitting elements such as photodiodes and semiconductor lasers, are inserted between the series, parallel or series-parallel connection of the semiconductor switch elements. The indicators indicate whether or not each high speed switch element is shortcircuited. Reference numeral 3 designates a conductor; numeral 5 a laser case; and 510 and 511 conductive plates.

The operation of the switch device thus constructed will be described.

The indicators 57 are each inserted between the series, parallel or series-parallel connection of the semiconductor switch elements so that they can indicate the trouble of any high speed switch or switches and the trouble location.

The switch device of the embodiments is substantially the same as the conventional one except that the indicators 57 are provided. With the provision of the indicators, when some of the high speed switches come into trouble and are shortcircuited, one can know the trouble and its location.

Figure 46:
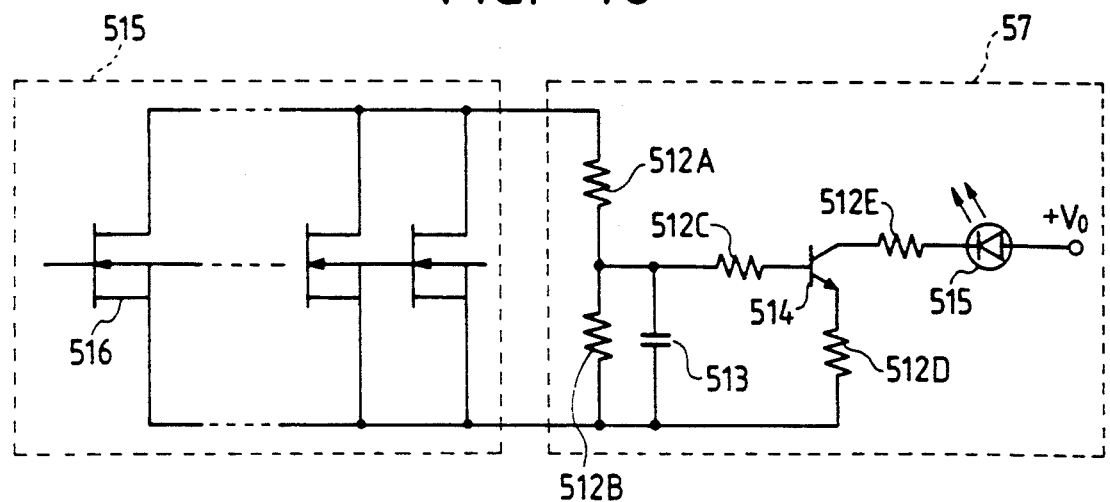
FIG. 46 is a circuit diagram showing an indicator and its related circuit, which may be used in the switch device of the invention.

FIG. 46 is a circuit diagram showing one indicator 57 and its related circuitry. In FIG. 46, each high speed switch of the switch device 515 is an FET, and a photodiode is used for the indicator 57. In the figure, reference symbols 512A to 512E indicate resistors; numeral 513 a bias capacitor; 514 a transistor for detecting a shortcircuit or disconnection of the FETs to turn on and off the photodiode; 515 the photodiode; and 516 an FET. In operation, if any of FETs 516 is shortcircuited, the transistor 514 detects the shortcircuit trouble through the resistors 512A and 512B, and turns off the photodiode 515. In this instance, the photodiode 515 is normally lit on.

As seen from the foregoing description, in the embodiments, a plurality of indicators are inserted between the series, parallel or series-parallel connection of the semiconductor switch elements. Therefore, if a trouble occurs at any location in those connections, one can know the trouble and its location. The invention can improve a reliability of the switch device with a simple construction.

A seventh embodiment of a switch device according to the present invention will be described with reference to the accompanying drawings.

Figure 47:
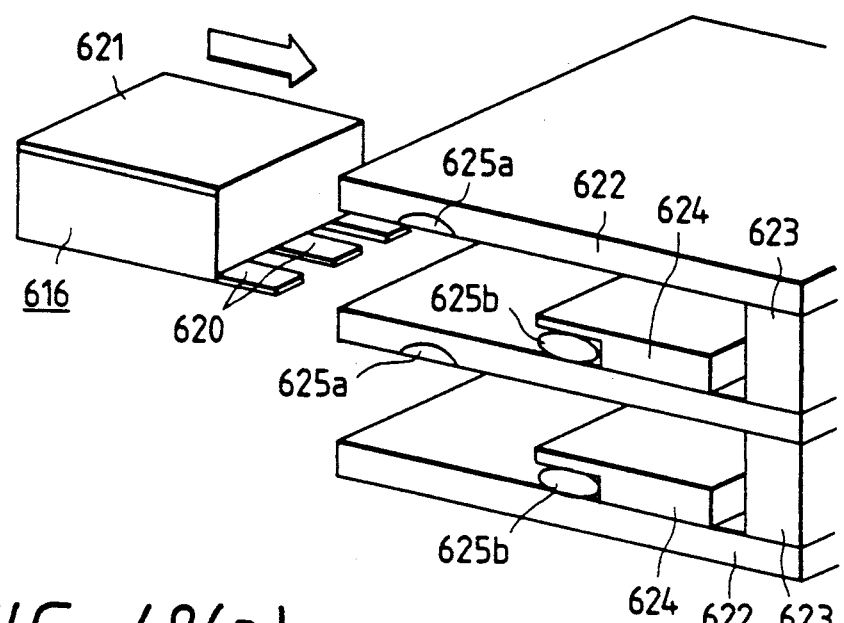
FIG. 47 is a perspective view of a seventh embodiment of a switch device according to this invention.
Figure 48A:
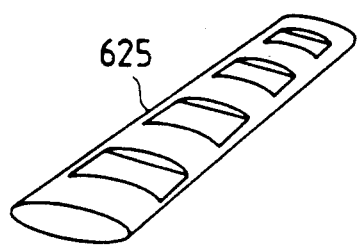
FIG. 48(a) is a perspective view of a contact member used in the switch device of FIG. 47.
Figure 48B:
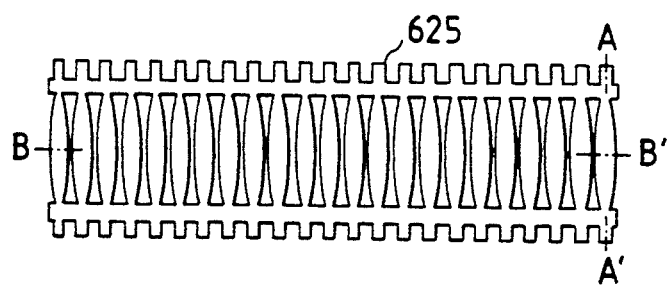
FIG. 48(b) is a plan view showing the contact member.
Figure 48D:
FIG. 48(d) is an enlarge cross sectional view taken on line A-A' in FIG. 48(b)

In FIG. 47, reference numeral 620 designates terminal plates as first terminal plates projected from the side wall of the module 616. Reference numeral 621 designates a terminal plate as a second terminal plate disposed on the upper surface of the module 616. Reference numeral 622 represents a plurality of conductive plates arrayed in parallel to one another; 623 insulating members each inserted between the ends of the adjacent conductive plates 622; and 624 fixed plates respectively provided on the conductive plates 622.

A conduction contact member 625a is fitted in a groove formed in the portion close to the fore end of the conductive plate 622. A conductive contact member 625b is fitted in an elongated space, shaped like L in cross section, formed in the fore end portion of the fixed plate 624. In FIGS. 48(a) to 48(d), the contact members 625a and 625b are generally designated by reference numeral 625. With a configuration shown, the contact member is resilient vertically with respect to FIG. 47.

Figure 49:
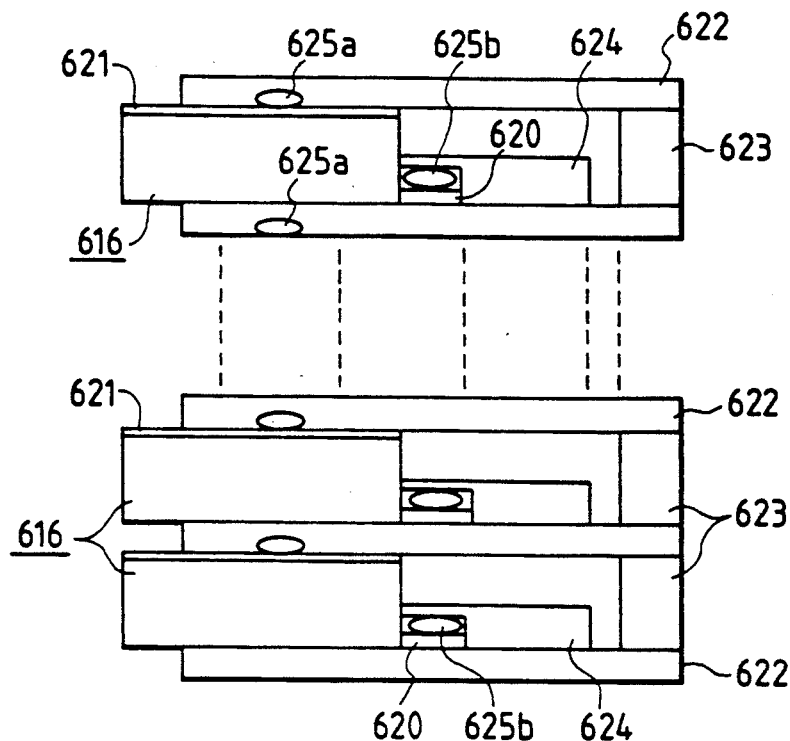
FIG. 49 is a side view showing the switch device of FIG. 47.

FIG. 49 is a side view showing the switch device 615 in which modules 616 are each inserted into a space defined between the adjacent conductive plates 622. The conductive plates 622 and the insulating member 623 cooperate to form a module holder.

The operation of the switch device 615 thus constructed will be described.

In FIG. 47, the modules 616 are inserted into the spaces defined by the conductive plates 622 in the direction of an arrow, thereby to form the switch device shown in FIG. 49. Under this condition, the terminal plates 621 of the modules 616 resiliently contact with the contact member 625a, thereby setting up an electrical contact. Also, the terminal plates 620 resiliently contact with the contact members 625b, thereby setting up an electric contact. Each module 616 hits against the fixed plate 624 and is positioned thereat. As described above, the switch device 615 is assembled. The module 616 can be readily removed from the space between the adjacent conductive plates 622. Accordingly, the number of the modules 616 can be properly selected.

Figure 4:
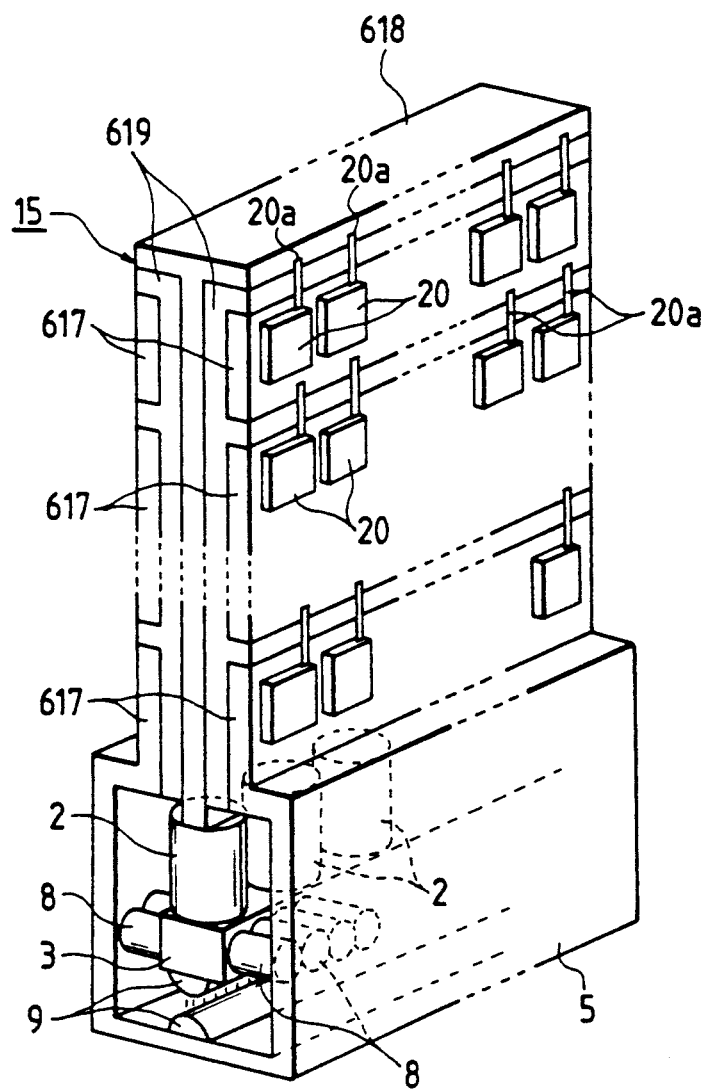
FIG. 4 is a perspective view showing a laser device using a conventional switch device.
Figure 50:
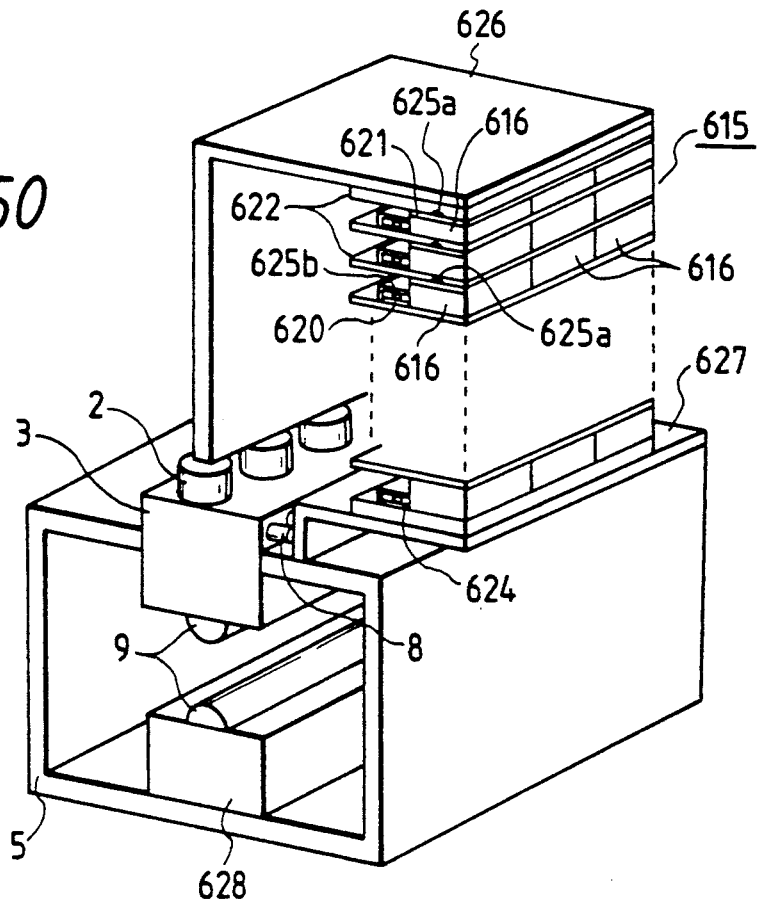
FIG. 50 is a perspective view showing a laser device to which the switch device of FIG. 47 is applied.

FIG. 50 is a perspective view showing a discharge excited laser device to which the switch device 615 is applied. In the figure, like reference symbols are used for designating like or equivalent portions in FIG. 4.

In FIG. 50, the switch device 615 is supported by the two conductive plates 626 and 627. The conductive plate 626, shaped like L in cross section, is connected at the fore end face to the uppermost conductive plate 622, and at the lower end face to the charge capacitors 2. The conductive plate 627, also shaped like L in cross section, is connected at the fore end face to the lowermost conductive plate 622, and at the lower end face to the case 5 and the capacitor 8.

With the construction, the capacitors 2 are charged, and a module driver (not shown) controls all the modules 616 to turn on all the FETs. Then, the charge are transferred from the capacitors 2 to the capacitor 8 through the conductive plate 626, the switch device 615, and the fixed plates 624.

Figure 51:
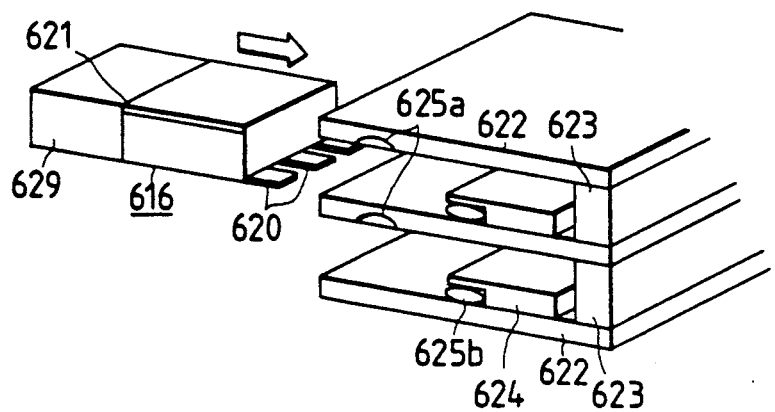
FIGS. 51 to 53 are perspective views of the switch devices according to eighth to tenth embodiments of this invention.

FIG. 51 is a perspective view showing an eighth embodiment of a switch device according to the present invention. As shown, a module drive block 629 containing a module drive circuit is attached to the rear side of the module 616. With provision of the drive block, the number of modules can readily be changed.

Figure 52:
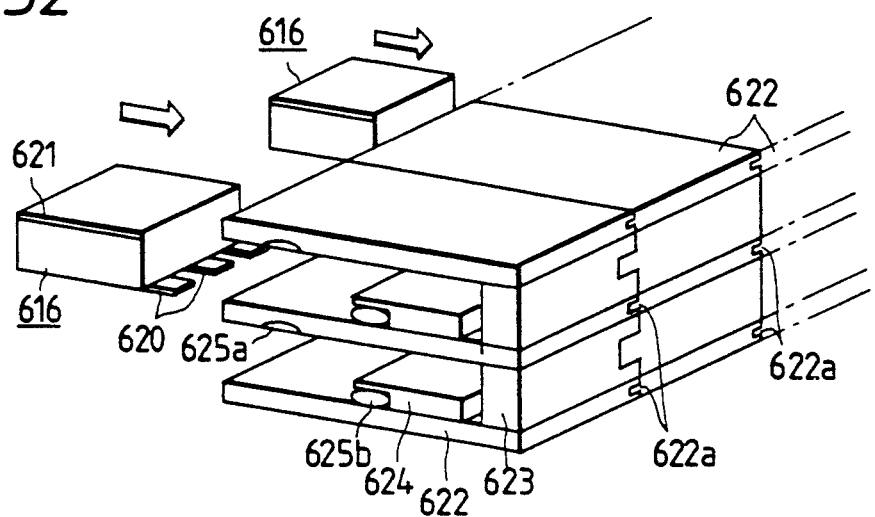

FIG. 52 is a perspective view showing a ninth embodiment of a switch device according to the present invention. As shown, short conductive plates 622 are coupled with one another in an interdigitating manner. To this end, the side walls of the conductive plates are protruded and grooved as indicated by reference numeral 622a.

Figure 53:
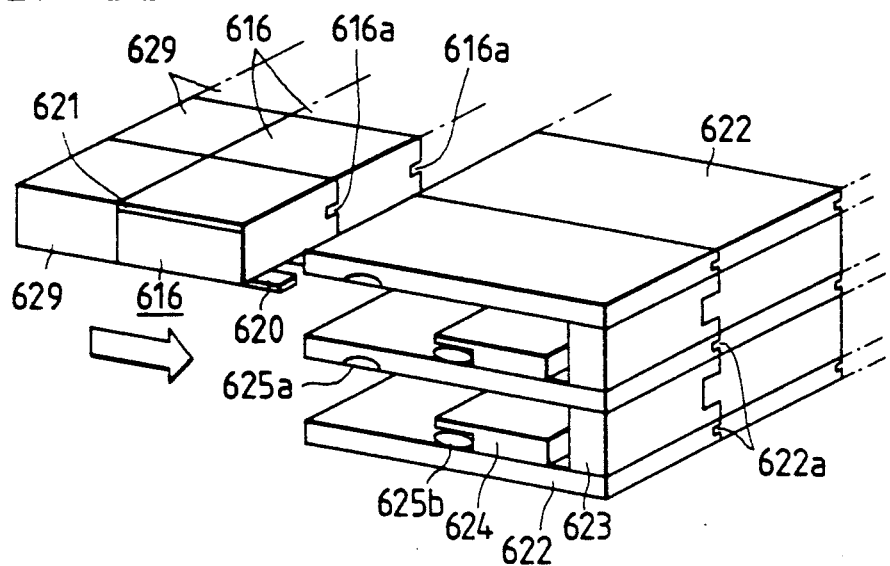

FIG. 53 is a perspective view showing a tenth embodiment of a switch device according to the present invention. As shown, the side walls of the conductive plates 622 are protruded and grooved as indicated by reference numeral 622a. The side walls of the modules 616 are also protruded and grooved as indicated by reference numeral 616a. Those modules 616 are interdigitated.

Figure 54:
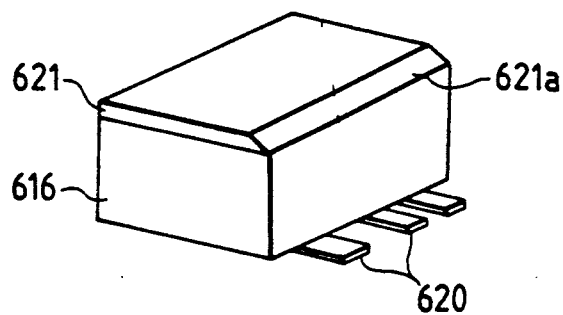
FIG. 54 is a perspective view showing a modification of a module.

FIG. 54 is a perspective view showing a modification of the module 616. The front edge of the terminal plate 621, placed on the top surface of the module 616, is tapered to form an inclined surface 621a. The inclined surface 621a guides the module 616 when it is inserted into the space between the adjacent conductive plates 622. If necessary, the conductive plates 622 may have similar inclined surfaces as the guides.

While in the above-mentioned embodiments, FETs are used for the solid-state switch elements, other elements such as thyristors and IGBTs may be used in place of them.

As seen from the foregoing description, the modules 616 having the terminal plates 621 are removably inserted into the spaces each defined between the adjacent conductive plates 622. The modules 616 are electrically connected through the face contact, so that little wiring work is required. Therefore, the circuit inductance is reduced, the maintenance work is easy, the number of modules may be readily changed, and the reliability of the switch device is improved.

Figure 55:
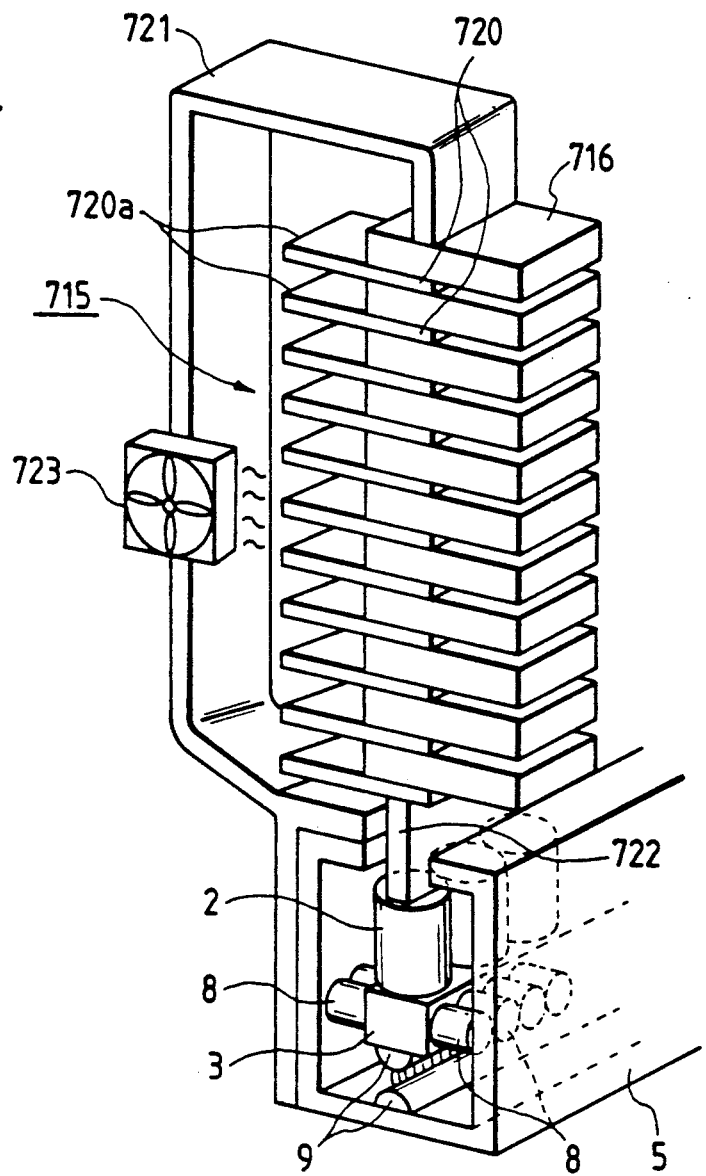
FIG. 55 is a perspective view showing a laser device incorporating a switch device according to an eleventh embodiment of the invention.

An eleventh embodiment of a switch device according to the present invention will be described with reference to the accompanying drawings. In FIG. 55, like reference symbols are used for designating like or equivalent portions in FIG. 4.

In FIG. 55, reference numeral 720 designates a drain electrode plate provided on the bottom of each module 716. Numeral 720a represents a heat radiating fin as an extension of a drain electrode plate 720, which is protruded from one side edge of the module 716.

The switch device 715 consists of a stack of modules 716, the adjacent ones of which sandwich each drain electrode plate 720. The fins 720a of the drain electrode plate 720 are extended in the same direction. Each module 716 contains FETs connected so as to be simultaneously turned on and off. The drain electrode plate 720 is provided common to all the FETs connected so as to be turned on and off simultaneously. A source electrode (not shown) and a gate electrode (not shown) common to the modules 716 are also provided. Reference numeral 721 designates a conductive plate connecting the source electrode of the uppermost module 716 to a case 5. Numeral 722 indicates a conductive plate for connecting the drain electrode plate 720 of the lowermost module 716 to the capacitor 2. Numeral 723 stands for a fan for cooling the respective modules 716. The portion of the stacked modules 716, which includes the drain electrode plates 720, makes up a switch section.

The operation of the laser device incorporating the switch device thus constructed will be described.

After the capacitor 2 is charged, all the FETs of the modules 716 are turned on. Then, the charge that has been stored in the capacitor 2, is transferred to the capacitor 8, through the conductive plate 722, switch device 715, conductive plate 721, and the case 5. With this charge transfer, a discharge occurs between the paired electrodes 9, to emit a laser beam.

The heat generated by the operating FETs is radiated through the fins 720a, and will not damage the FETs. If necessary, the switch device 715 can be cooled by using the fan 723.

While a single stack of modules 716 is used in the above-mentioned embodiment, a plurality of module stacks, arrayed in the longitudinal direction of the case 5, may be used if required.

The FETs, which are used as the solid-state switch elements in the above-mentioned embodiment, may be substituted by any other switch element, such as thyristors and IGBTs.

In the embodiment, the drain electrode plates of the modules are protruded from the modules and each one is sandwiched by adjacent modules, the protruding portions being arranged in the same direction and serving as radiating fins arrayed one upon the other. Therefore, the heat generated from a number of operating FETs can be effectively reduced to such a value as not to damage the FETs.

Figure 17:
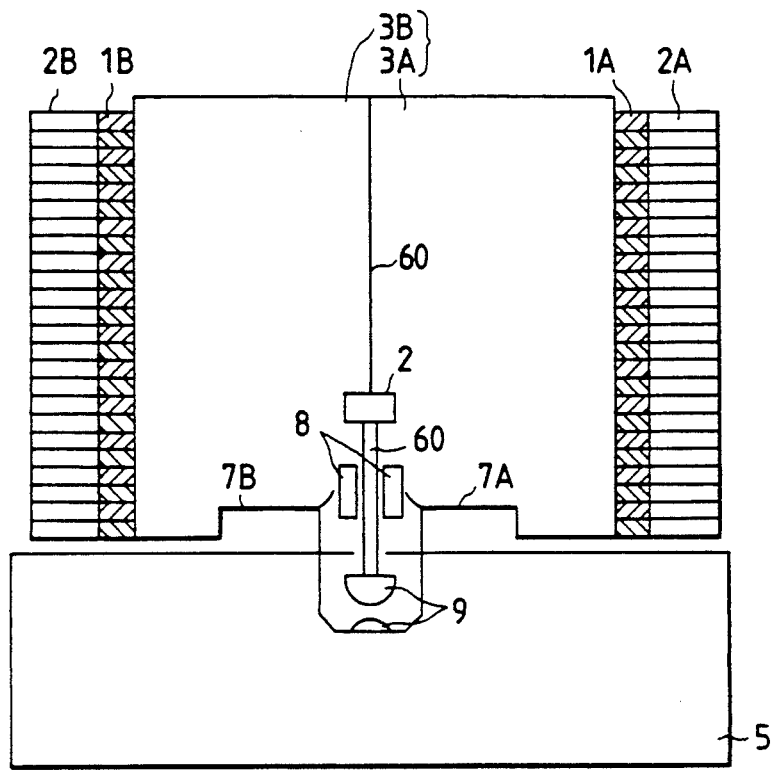
FIG. 17 and 18 are a side view and a perspective view showing a conventional solid-state switch device.
Figure 18:
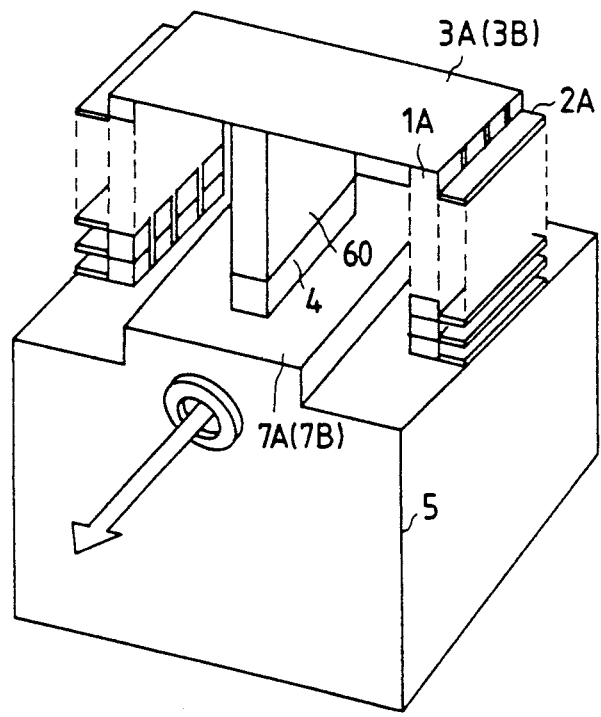
Figure 19:
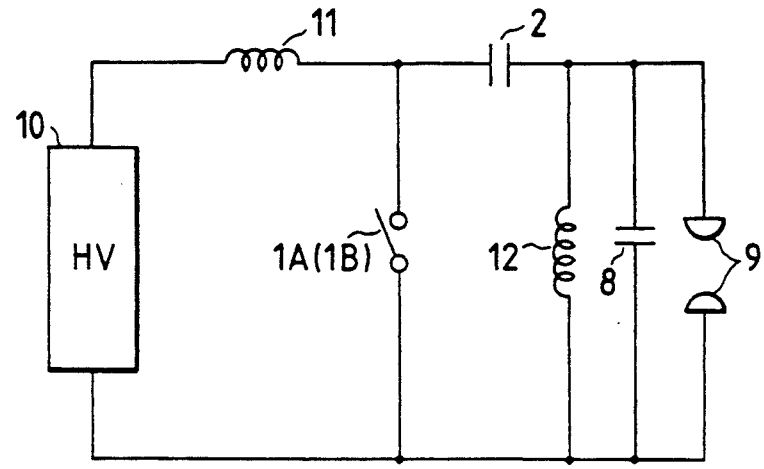
FIG. 19 is a circuit diagram showing a conventional discharge excited laser device.
Figure 56:
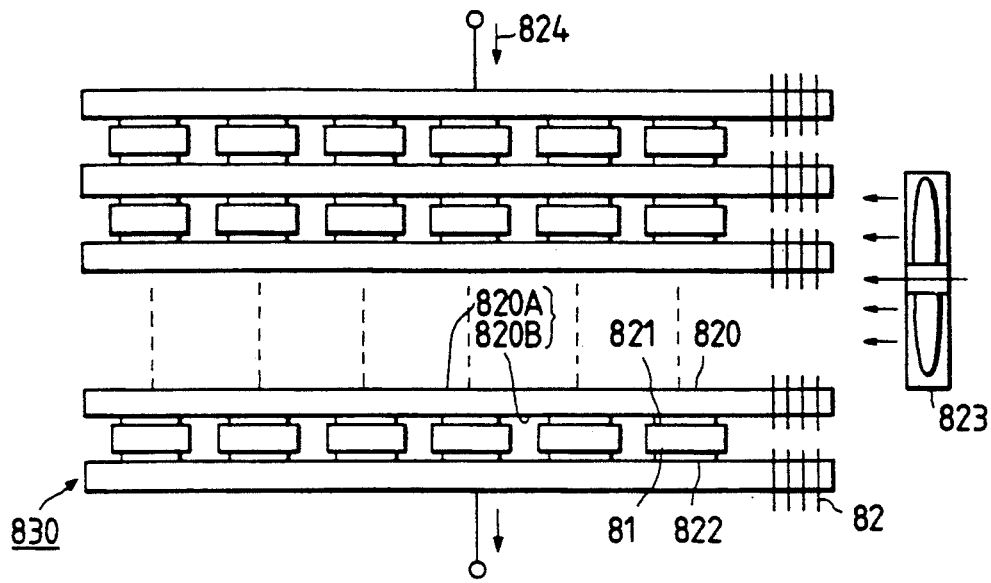
FIG. 56 is a side view showing a solid-state switch device according to a twelfth embodiment of the invention.

A twelfth embodiment of switch device according to the present invention will be described with reference to the accompanying drawings. In FIG. 56, like reference symbols are used for designating like or equivalent portions in FIGS. 17 through 19. In FIG. 56, reference numeral 820 designates a heat pipe with metal plates 820A and 820B. A plurality of solid-state switch elements 81 are arrayed and sandwiched between the metal plate 820A of a heat pipe and the metal plate 820B of another heat pipe adjacent to the former. Such sandwich structures are stacked into a switch device having a multiple of stages of switch elements. Radiating plates 82 are provided on the end portion of the heat pipe 820. A plurality of solid-state switch elements 81 or switch modules each containing a plurality of solid-state switch elements 81 are made of, for example, FETs, and reference numeral 821 designates a drain jointed to the metal plate 820B with a low thermal resistance. A source 822 is jointed to the metal plate 820A simultaneously when the drain is jointed. Those drain and source 821 and 822 make up a switch module group 830. Numeral 823 indicates a cooling fan, and 824 a current flowing into the switch module group 830.

The operation of the switch device will be described. Generally, the heat pipe is advantageously featured in that the structure is simple and has no mechanical moving part, and is capable of radiating a relatively large amount of latent heat under a small temperature difference. The structure and functions of the heat pump follow. The inner wall of the heat pipe 820 is coated with porous material (e.g., screen), called wick. After the pipe is evacuated, a proper amount of fluid (called working fluid) is put into the pipe in a hermetical condition. The working fluid within the evacuated pipe evaporates, so that the pipe is filled with vapor at the pressure equal to a saturated vapor pressure at temperature at that time. When one end of the heat pipe is heated by heat generated by the solid-state switch elements 81, a temperature difference is produced between both ends of the pipe, since the other end of the pipe is cooled by the fan 823. In the heating section of the pipe, the liquid permeated in the wick evaporates and the resultant vapor travels through a vapor path by a slight pressure difference, and reaches a cooling section including the radiator plate 82. The vapor is condensed here to radiate a great amount of latent heat.

Through the above operation, the solid-state switch elements are thermally balanced. Accordingly, in the switch module group 830 in which the switching timings must be settled into a range within +1 second, the on-times of the switch elements are uniform, removing the overvoltage application to specific switch elements.

As seen from the foregoing description, in the switch device of the embodiment, switch module groups of a plurality of series-parallel connected solid-state switch elements or a series-parallel connected switch modules each including a plurality of solid-state switch elements are stacked into multiple stages in such a way that each switch module group is sandwiched by the adjacent metal plates of heat pipes. Cooling radiating plates are provided on the end portions where no sandwich structure exists. Accordingly, the switch device is free from the problem that some of the switch elements are turned on later than the remaining ones because of the thermal imbalance among the switch elements, and the overvoltage is applied to the later turned on switch elements, ultimately destroying the switch elements. Further, a high response switch device can be realized because it can be fabricated into a higher density package, and the switch inductance is low.

A thirteenth embodiment of a switch device according to the present invention will be described with reference to the accompanying drawings.

Figure 59A:
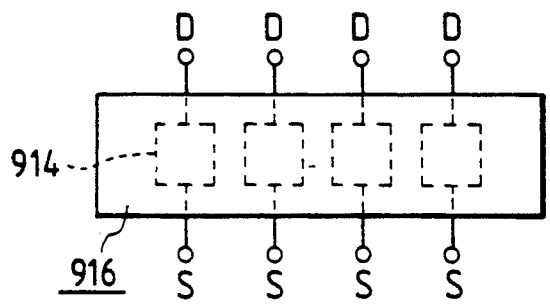
FIGS. 59(a) and 59(b) are a plan view and a side view of a module used in the switch device of FIG. 57.
Figure 59B:
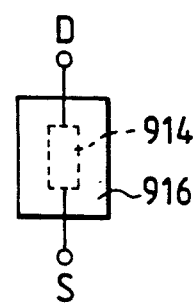

In FIGS. 59(a) and 59(b) showing an instance of a module containing a plurality of FETs 914, four FETs 914 are contained in a module 916. Drains D and sources S having equal lengths are led from the FETs 914.

Figure 57A:
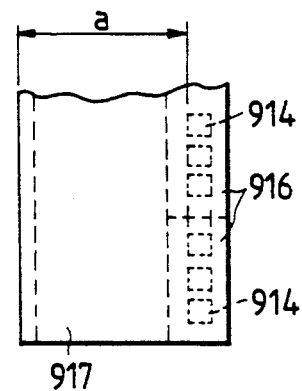
FIGS. 57(a) and 57(b) are a plan view and a side view of a laser device using a switch device according to a thirteenth embodiment of this invention.
Figure 57B:
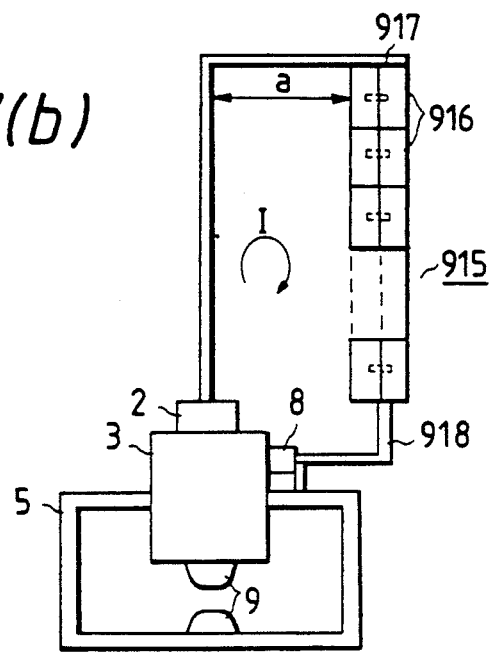
Figure 58:
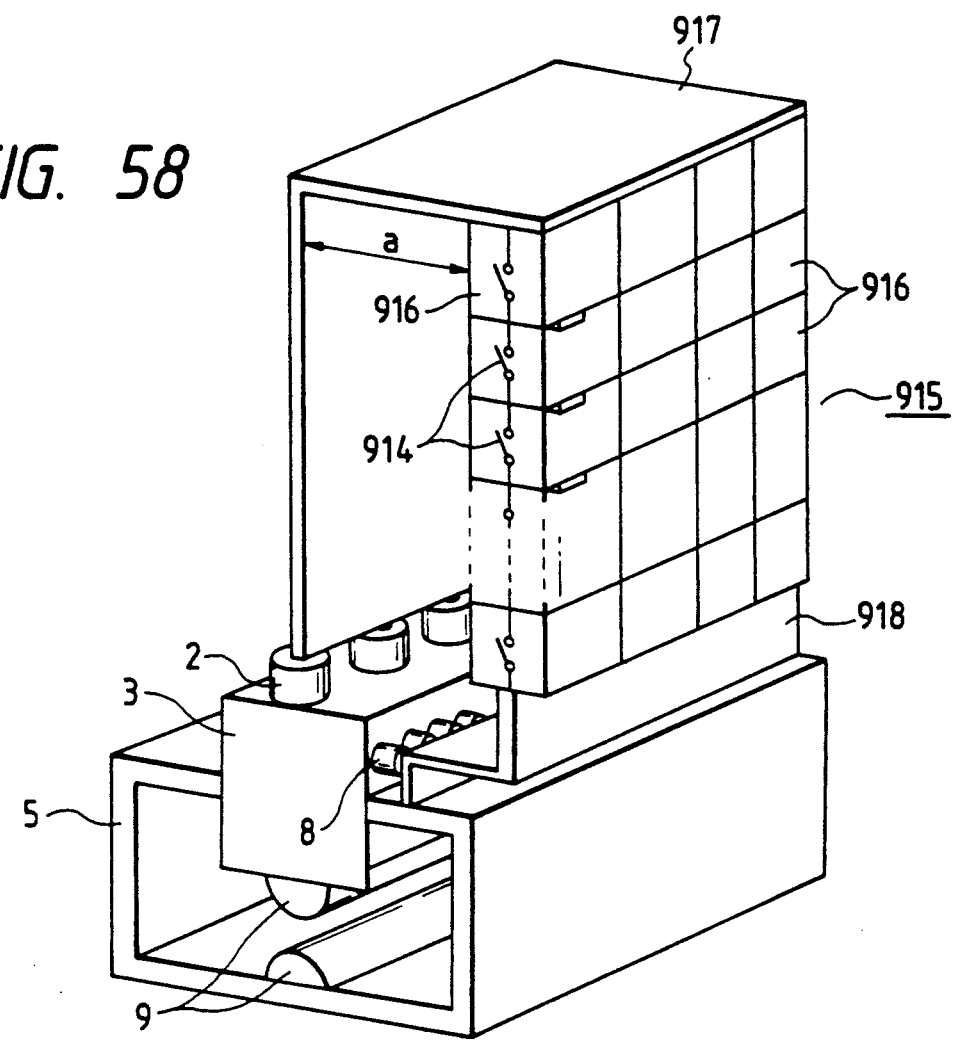
FIG. 58 is a perspective view showing the laser device of FIG. 57.

FIGS. 57(a) and 57(b) are a plan view and a side view of an excimer laser device incorporating a switch device 915 consisting of a plurality of modules constructed as above, which is the thirteenth embodiment of the present invention. FIG. 58 is a perspective view of the laser device. In the figure, like reference symbols are used for designating like or equivalent portions in FIGS. 59 and 2. In FIG. 58, the FETs 914 are illustrated in the form of switches. In FIG. 57, reference numeral 917 designates a conductive plate with a L-shaped cross section, and the lower end thereof is connected to the capacitor 2. Reference numeral 918 designates a conductive plate, the lower end of which is connected to the capacitor 8.

The switch device 915 of the embodiment is vertically supported by the two conductive plates 917 and 918. The switch device 915 is formed of a number of modules each constructed as shown in FIG. 59. Those modules are stacked in the series direction and the parallel direction. In FIG. 57, three FETs 914 are contained in the module 916. The drains of the uppermost modules 916 are connected to the horizontal part of the conductive plate 917. The vertical part of the conductive plate 917 is equidistantly separated from all the modules 916. A distance therebetween is denoted as "a". The sources of the lowermost modules 916 are connected to the conductive plate 918.

The operation of the laser device including the switch device thus constructed will be described.

After the capacitor 2 is charged, the switch device 915 is turned on. A control circuit, not shown, sends a trigger signal to the common gate terminal (not shown) of the FETs 914 of each module 916, to turn on all the FETs 914. Upon turning on of the switch device 915, the charge that has been stored in the capacitor 2 is transferred to the capacitor 8 through the conductive plate 917, the switch device 915, and the conductive plate 918. As a consequence, discharge occurs between the paired electrodes 9, to emit a laser beam.

Figure 12:
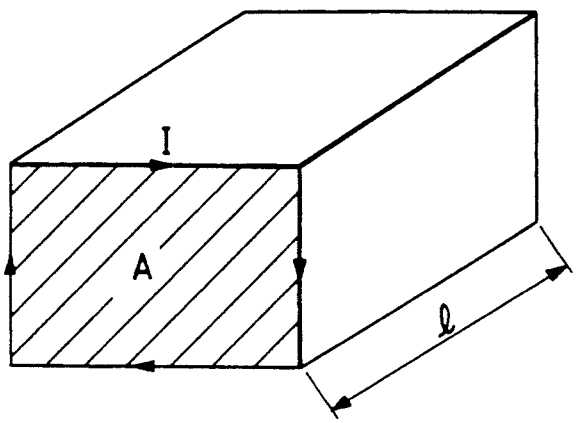
FIG. 12 is a diagram useful in explaining the operation of the protecting circuit.
Figure 13:
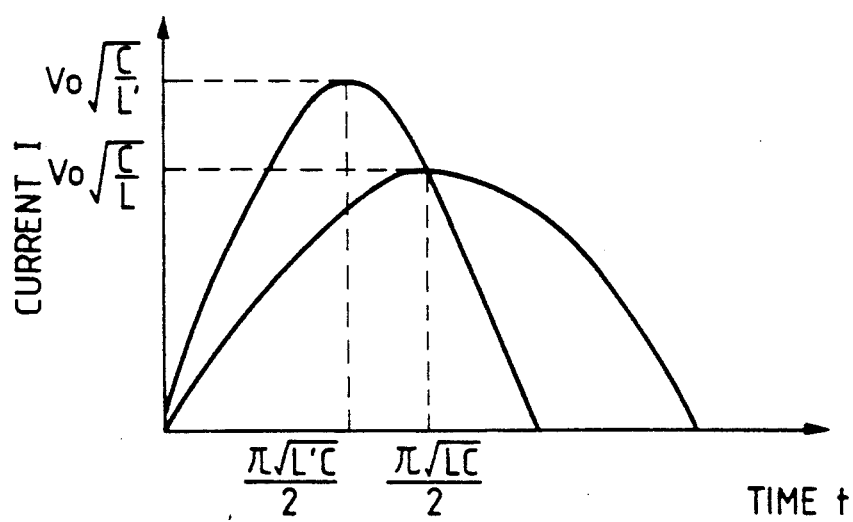
FIG. 13 is a graph showing waveforms of the current for two different inductances.

When the switch device 915 becomes conductive, the inductances of the current loops of the current I flowing through the conductive plate 917 and the switch device 915 are equal for all the parallel connected FETs 914. This results from the fact that the conductive plate 917 is spaced from all the parallel connected FETs 914 of all the modules 916 by the equal distance "a". In other words, the areas A in FIG. 12 are equal for all the FETs 914. The "l" in FIG. 12 corresponds to the length of the modules in FIG. 57 or 59 as viewed in the parallel direction.

Thus, the problem that the current concentrates on the specific FETs 914 of the module 916 to destroy the FETs, is successfully solved.

Figure 60A:
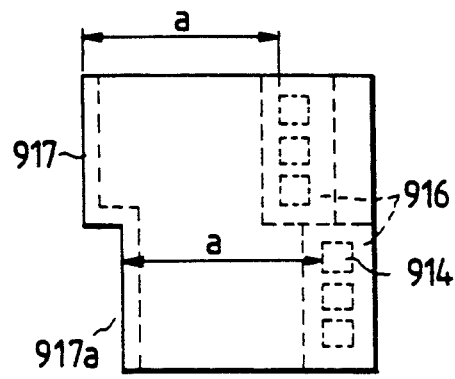
FIGS. 60(a) and 60(b) are a plan view and a side view of a laser device using a switch device according to a fourteenth embodiment of this invention.
Figure 60B:
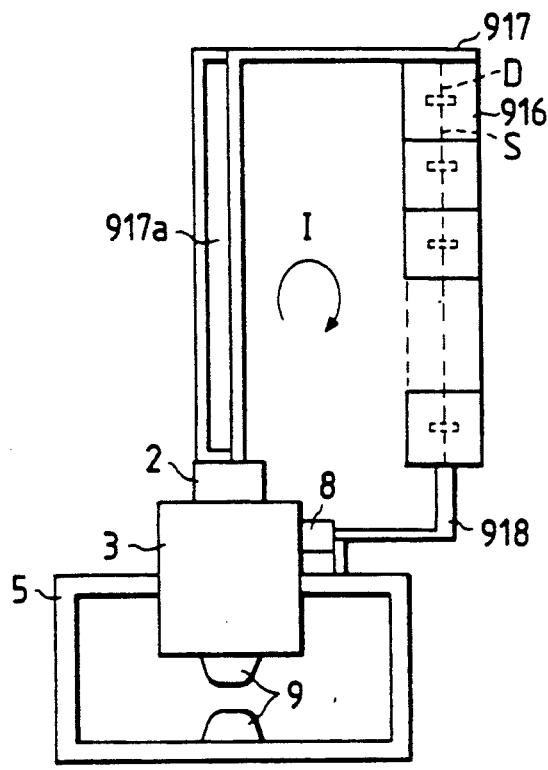

FIGS. 60(a) and 60(b) are a plan view and a side view of a fourteenth embodiment of a switch device according to the present invention. In this embodiment, a cut-out 917a is formed in the conductive plate 917. In assembling the switch device 915 into a laser device, spatial and layout requirements in connection with the adjacent parts and components sometimes require some deformation of the conductive plate 917. For example, formation of the cut-out 917a as shown is required. In this case, the modules 916 are dislocated according to the configuration of the cut-out 917a so that the equal distance "a" is secured, providing equal inductances of the current loops for all the FETs 914.

Figure 61:
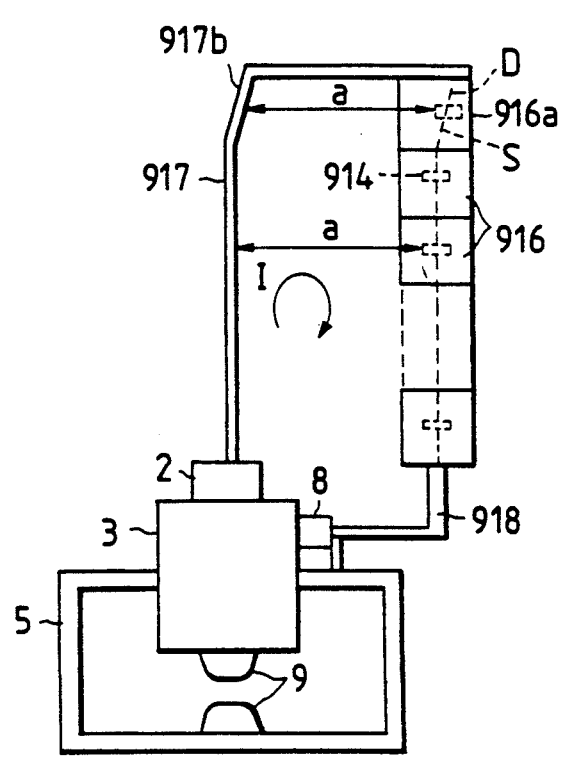
FIG. 61 shows a side view of a laser device using a switch device according to a fifteenth embodiment of this invention.
Figure 62A:
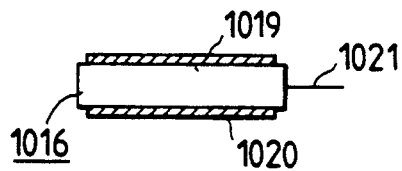
FIGS. 62(a) to 62(d) show a front view, a plan view and a bottom view of a sixteenth embodiment of a module for forming a switch device according to the invention.
Figure 62B:
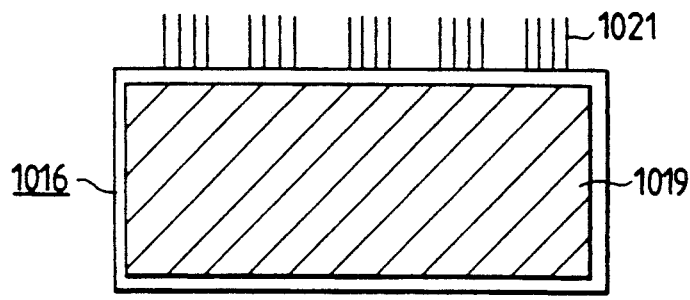
Figure 62C:
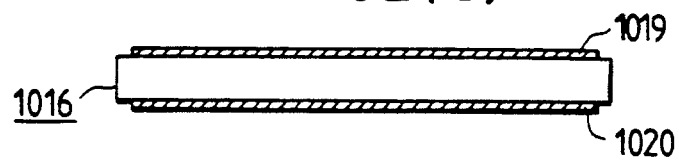
Figure 62D:
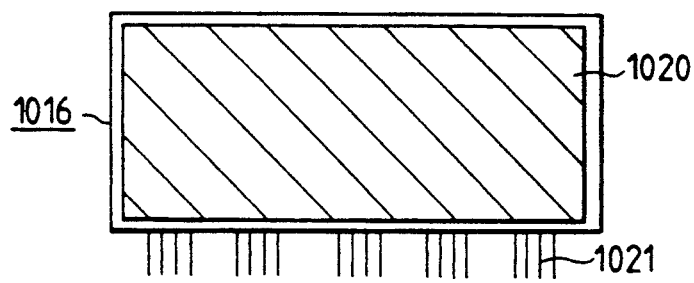
Figure 63A:
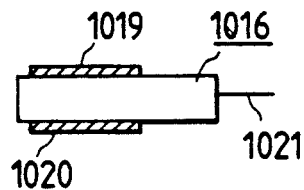
FIGS. 63(a) to 63(d) show a front view, a plan view, a side view and a bottom view of a seventeenth embodiment of a module for forming a switch device according to the invention.
Figure 63B:
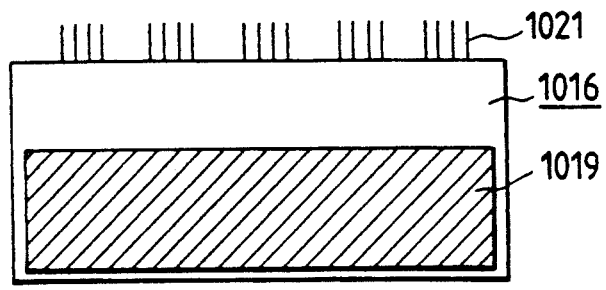
Figure 63C:
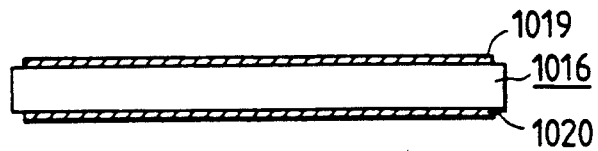
Figure 63D:
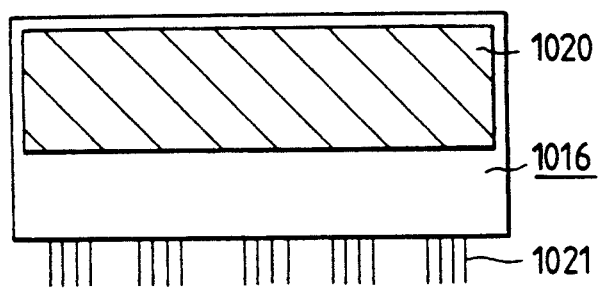

FIG. 61 shows a side view of a fifteenth embodiment of a switch device according to the present invention. In this embodiment, the conductive plate 917 is formed to have an inclined surface 917b because of the same reason as described above. The drain D and source S of the FETs 914 in a module 916a, which confronts the inclined surface 917b, are shaped to incline at the same angle as that of the inclined surface 917b so that the inclined surface and the inclined plane including the drain and source are parallel to each other. In this way, the equal distance "a" is secured.

In the embodiments as mentioned above, the FETs 914 are used for the solid-state switch elements, but may be replaced by any of other types of switch elements, such as IGBTs and thyristors.

As seen from the foregoing description, the conductive plate is equidistantly separated from the solid-state switch elements of the modules. Accordingly, the inductances of the current loops for the respective solid-state switch elements, when the current is fed thereto from the conductive plate, are equal to one another. Therefore, the current is equally distributed to the FETs, thereby preventing destruction of the FETs.

Figure 5:
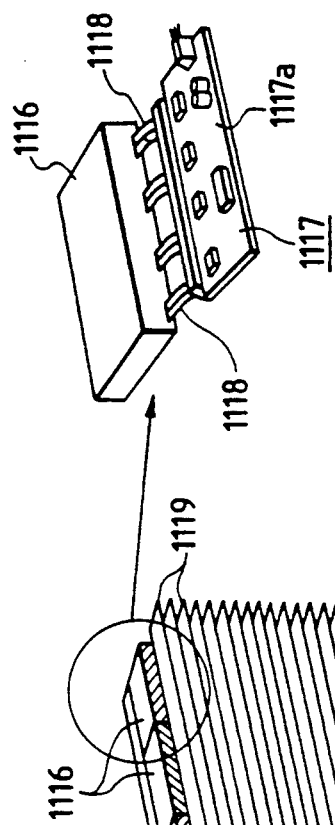
FIG. 5 is a front view showing a conventional module.

Sixteenth to eighteenth embodiments of the invention will be described with reference to the accompanying drawings. In FIGS. 62 through 65, like reference symbols are used for designating like or equivalent portions in FIG. 5.

In the sixteenth embodiment shown in FIGS. 62(a) to 62(d), a thin-plate like drain electrode 1019 as a first electrode is provided over the substantially entire upper surface of the module 1016. A thin-plate like source electrode 1020 as a second electrode is provided over the substantially entire lower surface of the module 1016. Pin-terminal like gate electrodes 1021 as third electrodes are provided on the surface of the module 1016, which is different from the upper and lower surfaces of the module.

In a seventeenth embodiment shown in FIGS. 63(a) to 63(d), thin-plate like drain and source electrodes 1019 and 1020 covers the areas of the upper and lower surfaces of the module 1016, which occupy substantially halves of the surfaces and are located apart from gate electrodes 1021.

Figure 64:
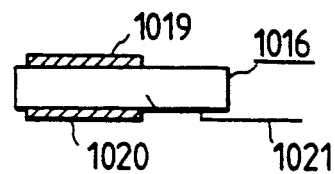
FIG. 64 shows a front view of a eighteenth embodiment of a module for forming a switch device according to the invention.

In an eighteenth embodiment shown in FIG. 64, a thin-plate like drain electrode 1019 covers the area of the upper surface of the module 1016, which is substantially half of the upper surface. A thin-plate like source electrode 1020 and pin-terminal like gate electrodes 1021 are provided on the lower surface of the module.

Figure 65:
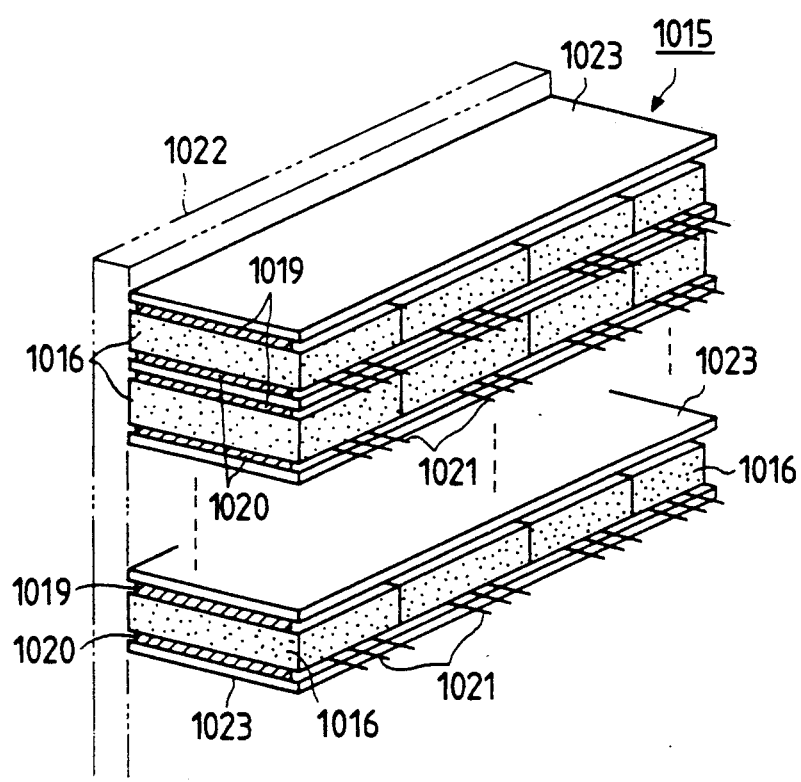
FIG. 65 is a perspective view showing a switch device constructed with a number of modules.

FIG. 65 is a perspective view showing a switch device 1015 constructed with a number of the modules according to the eighteenth embodiment.

In FIG. 65, a plurality of drain plates 1023, mounted on one side of a conductive plate 1022, extends outwardly, to form a shelf-like assembly. A plurality of modules 1016 are placed on the drain plates 1023, respectively. Those modules 1016 are stacked in a manner that the drain electrode 1019 on the upper surface of one module 1016 contacts with the drain plate 1023 above the module, and the source electrode 1020 on the lower surface of the module contacts with the drain plate 1023 below the module. The gate electrodes 1021 are each lead out of a gap between each drain plate 1023 and the module 1016. The lower end of the conductive plate 1022 is connected to the capacitor 2 shown in FIG. 4.

The operation of the laser device including the switch device thus constructed will be described.

After the capacitor 8 is charged, all the FETs of the switch device 1015 are simultaneously turned on. The charge from the capacitor 8 is transferred to the capacitors 2 through the conductive plate 1022, the switch device 1015, and the case 5 shown in FIG. 4, and the like.

The drain electrode 1019 and the source electrode 1020 of the module 1016 are shaped like thin plates. Accordingly, when a number of modules are stacked as shown in FIG. 65 or those are combined by another method, all the modules 1016 may be stacked or combined while being in contact with one another. Because of this feature, the resultant switch device can be made compact in size.

It is evident that the switch device 1015 as shown in FIG. 65 may be constructed with the modules 1016 of the sixteenth and seventeenth embodiments. Various types of switch devices may be constructed using a plurality of modules 1016 according to the sixteenth to eighteenth embodiments.

The FETs, which are used as the solid-state switch elements in the above-mentioned embodiments, may be substituted by any other switch element, such as thyristors and IGBTs.

As seen from the foregoing description, in these embodiments, the thin-plate like electrodes are provided on the upper and lower surfaces of the module. Accordingly, a switch device may readily be constructed by combining a number of modules. This feature is suitable particularly for the case of stacking the modules into a switch device. Down-sizing of the switch device may readily be realized. Additionally, the circuit inductance may be reduced.

Figure 66:
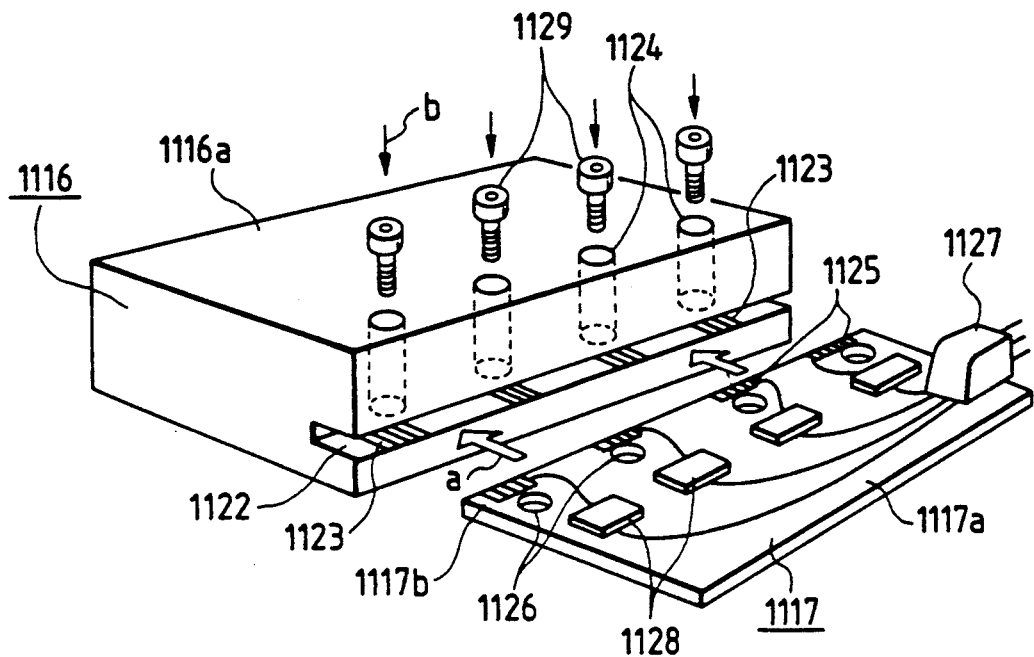
FIGS. 66 and 67 are perspective views showing nineteenth and twentieth embodiments of a switch device according to the invention.

A nineteenth embodiment of a switch device according to the present invention will be described with reference to the accompanying drawings. In FIG. 66, like reference symbols are used for designating like or equivalent portions in FIG. 6.

In FIG. 66, reference symbol 1116a designates a case of a module 1116; 1122 a groove formed in the case 1116a; and 1123 terminal portions which are formed on the upper and lower inner surfaces of the groove 1122, and connected to the gates of the FETs in the module 1116. Mounting holes 1124 are formed in the case 1116a, to reach the groove 1122.

In the control unit 1117, symbol 1117b indicates a fitting portion occupying the fore end portion of a substrate 1117a; numeral 1125 terminal portions formed on both sides of the fitting portion 1117b; numeral 1126 threaded holes; numeral 1127 a trigger signal input portion formed in the substrate board 1117a; numeral 1128 controllers connected between the trigger signal input portion 1127 and the terminal portions 1125 on the substrate 1117a; and numeral 1129 screws.

In operation, in FIG. 66, the control unit 1117 is moved in the direction of an arrow "a" to fit the fitting portion 1117b into the groove 1122 of the module 1116. The result is that the terminal portions 1123 and 1125 are connected, and the mounting holes 1124 are aligned with the threaded holes 1126, respectively. Then, the screws 1129 are inserted in the direction of an arrow "b" and tightly screwed into the threaded holes 1126. The module 1116 and the control unit 1117 are electrically and mechanically connected to each other and the connection is reliable.

Under this condition, an external drive unit, not shown, applies a trigger signal to the trigger signal input 1127. Then, the controllers 1128 are driven to produce control signals. The control signals are applied to the gates of the FETs in the module 1116 through the terminal portions 1123 and 1125 to turn on the FETs. It is noted here that the signal paths through which the control signals travel are substantially equal to one another. Therefore, the nonuniformity of the drive times of the FETs is lessened, resulting in good switching characteristic. Further, no FET destruction occurs and a high speed switching operation is ensured.

Figure 67:
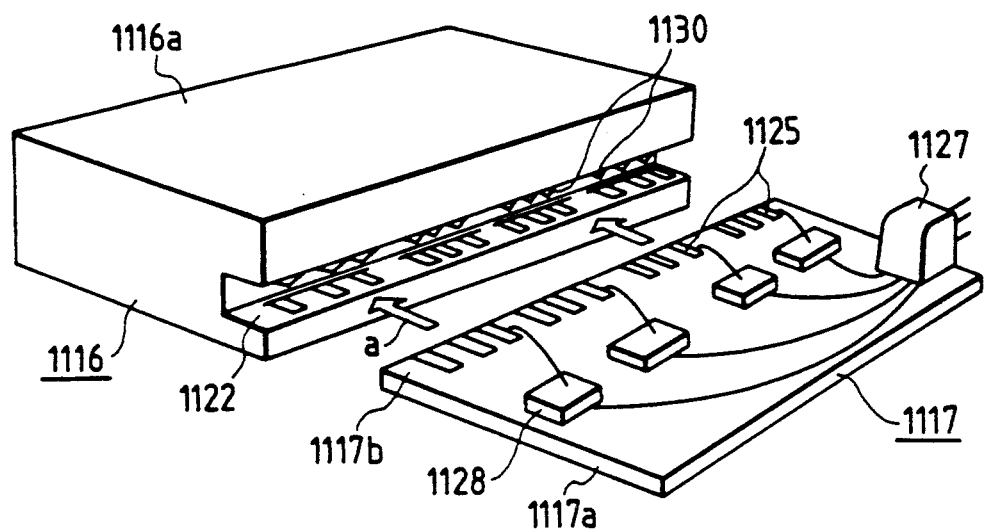

FIG. 67 is a perspective view showing a twentieth embodiment of a switch device according to the present invention. In the figure, like reference symbols are used for designating like or equivalent portions in FIG. 66.

In FIG. 67, terminal portions 1130 are formed on the upper and lower inner surfaces of the groove 1122 of the module 1116. The terminal portions are formed of plate springs with substantially V-sharped cross section.

With such a construction, the control unit 1117 is moved in the direction of an arrow "a", to fit the fitting portion 1117b into the groove 1122. When fitted, the fitting portion 1117b is resiliently and firmly fastened by the plate springs of the terminal portions 1130, and the terminal portions 1130 and 1125 are connected to each other.

The FETs, which are used as the solid-state switch elements in the above-mentioned embodiments, may be substituted by any other switch element, such as thyristors and IGBTs.

As seen from the foregoing description, the terminal portions are formed in the groove of the module, and the terminal portions are also formed in the fitting portion of the control unit. By fitting the fitting portion into the groove, the module and the control unit are electrically and mechanically connected to each other. Therefore, from a mechanical standpoint, the connector means according to the embodiments provides a firm and sable connection of the module with the control unit. Also, from an electrical standpoint, the equal lengths of the signal paths reduces the nonuniformity of the switching times, providing a good switching characteristic.

Figure 68:
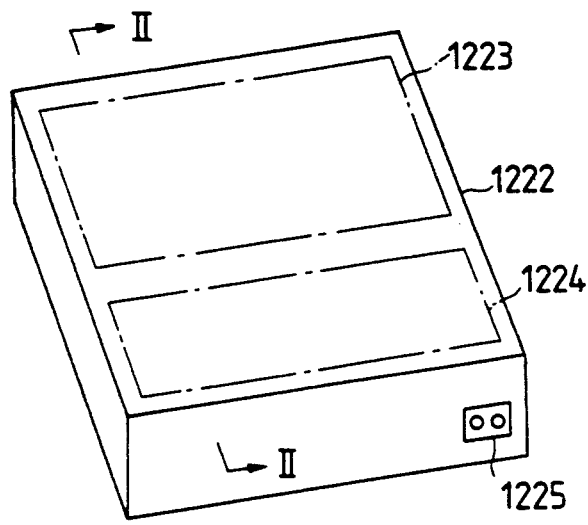
FIG. 68 is a perspective view showing a 21st embodiment of a switch device according to the invention.
Figure 69:
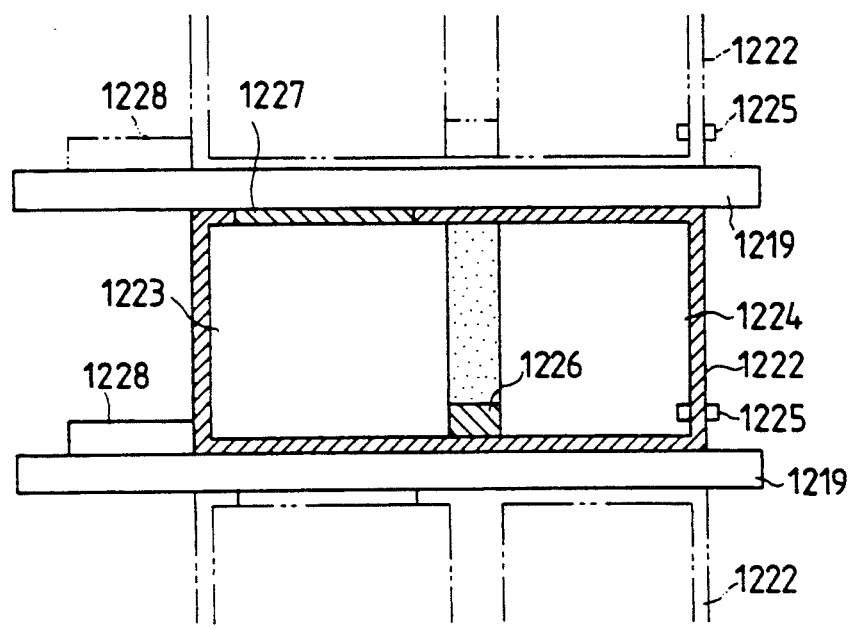
FIG. 69 is a sectional view taken on line II—II in FIG. 68.

A switch device according to a 21st embodiment of the present invention will be described with reference to the accompanying drawings. In FIGS. 68 and 69, reference numeral 1222 designates a case. Numeral 1223 is a switch section contained in the case 1222. In the switch device, a plurality of FETs are series or parallel connected so as to be simultaneously turned on. The switch section 1223 corresponds to the module 1116 in FIGS. 6 and 7. A control unit 1224 for controlling the switch section 1223 corresponds to the control unit 1117 in FIG. 6, and also is contained in the case 1222. The control unit 1224 is provided with a trigger signal lead-in portion 1225.

As shown in FIG. 69, a plurality of cases 1222 each containing the switch section 1223 and the control unit 1224 are stacked in a manner that the case 1222 is sandwiched between the adjacent conductive plates 1219. The conductive plate 1219 corresponds to the conductive plate 1119 in FIG. 7. In FIG. 69, a gate electrode 1226 as a first electrode applies a gate signal to the FETs of the switch section 1223. A drain electrode 1227 as a second electrode, common to the FETs, is provided on the control unit 1223 and connected to the conductive plate 1219 on the case 1222. A source electrode 1228 as a third electrode is connected to the conductive plate 1219 under the case 1222.

In operation, a trigger signal is applied from a drive unit (not shown) to the trigger signal lead-in portion 1225 of the case 1222. The control unit 1224 is driven to apply a control signal through the gate electrode 1226 to the switch section 1223. Then, all the FETs in the switch section 1223 are simultaneously turned on. Current flows from the upper conductive plate 1219 to the switch section 1223, source electrode 1228, and the lower conductive plate 1219.

Figure 6:
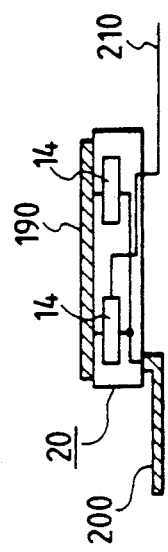
FIG. 6 is a perspective view showing the conventional combination of a module and a control unit for control the module.
Figure 7:
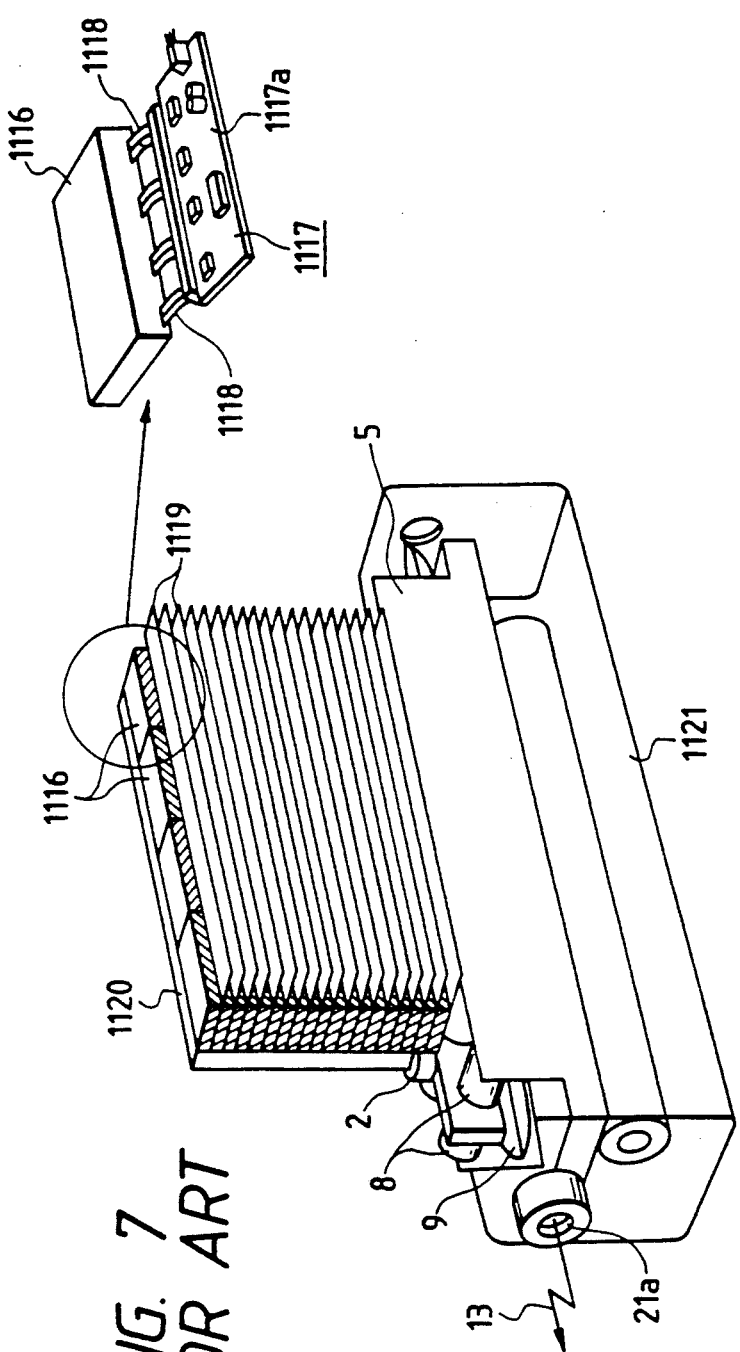
FIG. 7 is a perspective view showing a laser device using a conventional switch device.

It is noted that the switch section 1223 and the control unit 1224 are contained in the same case 1222, while being interconnected through the gate electrode 1226. With this construction, the nonuniformity of the drive times of the FETs due to the different lengths of the lead wires 1118, which is inherent in the prior art shown in FIG. 6, is successfully solved. Accordingly, the simultaneous turn-on of the FETs is realized, improving the switching characteristic.

The FETs, which are used as the solid-state switch elements in the above-mentioned embodiment, may be substituted by any other switch element, such as thyristors and IGBTs.

As seen from the foregoing description, the switch section including a plurality of solid-state switch elements and the control unit for controlling the switch section are housed in a single case, thereby forming a single unit. Therefore, the mechanical and electrical connection of the switch section and the switch elements are reliable. The drive times of the switch elements are uniform, providing a stable switching operation.

Figure 70:
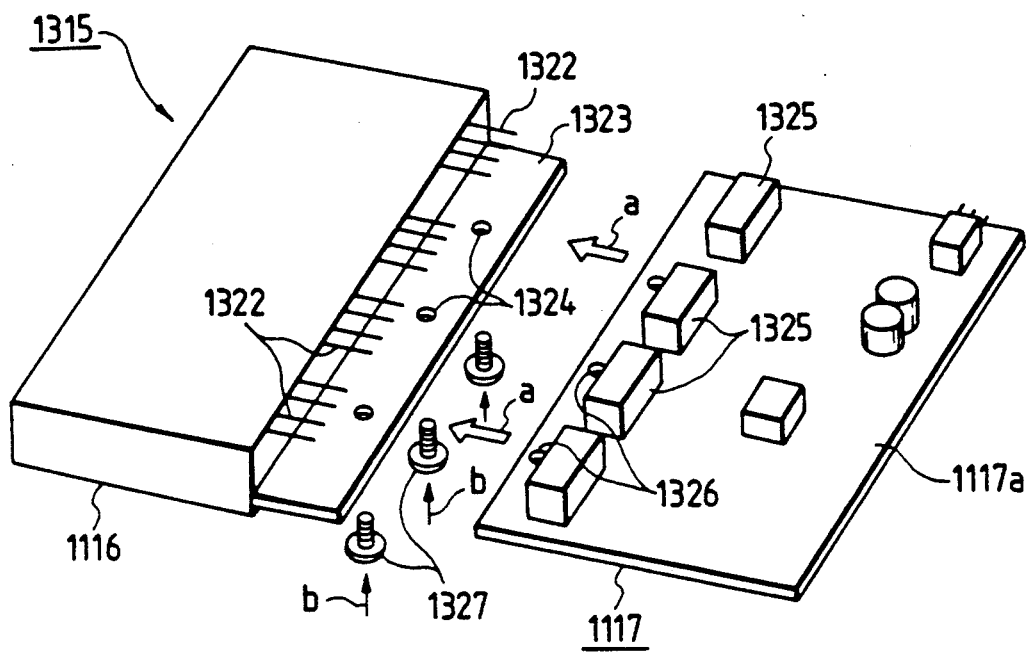
FIGS. 70, 71 and 72 are perspective views showing 22nd to 24th embodiments of a switch device according to the invention.

A 22nd embodiment of a switch device according to the present invention will be described with reference to the accompanying drawings. In FIG. 70, like reference symbols are used for designating like or equivalent portions in FIG. 6.

In FIG. 70, reference numeral 1322 designates a plurality of pin terminals, which are planted in one side wall of a modules 1116, and receive control signals from a control unit 1117. Numeral 1323 indicates a mounting plate protruded from one side wall of the modules 1116. Numeral 1324 represents a plurality of mounting holes formed in the mounting plate 1323.

Numeral 1325 stands for a plurality of sockets, linearly arrayed on a substrate 1117a of the control unit 1117, for receiving the pin terminals 1322 for the mechanical and electrical connection. Reference numeral 1326 designates a plurality of mounting holes linearly arrayed in the fore end portion of the substrate 1117a in correspondence with the mounting holes 1324. Numeral 1327 indicates screws screwed into the holes 1324 and 1326. In the 22nd embodiment, the sockets 1325, the mounting holes 1324 and 1326, and like make up connector means.

The operation of the switch device thus constructed will be described.

In FIG. 70, the control unit 1117 is moved in the direction of an arrow "a" and the fore end of the substrate 1117a is put on the mounting plate 1323 of the module 1116. Then, the pin terminals 1322 are inserted into the sockets 1325 and the mounting holes 1324 and 1326 are aligned with each other. The screws 1327 are tightly screwed into the holes 1324 and 1326. As a consequence, the module 1116 and the control unit 1117 are mechanically firmly connected and electrically stably connected with each other.

Under this condition, the control unit 1117 applies control signals to the module 1116 through the sockets 1325 and the pin terminals 1322, so that a plurality of FETs contained in the module 1116 are turned on. It is noted that the signal paths for the control signals to the module 1116 are substantially equal. Therefore, the nonuniformity of the switching times is lessened, providing a good switching characteristic. The result is that the destruction problem of the FETs is solved and a high speed switching is ensured.

Figure 71:
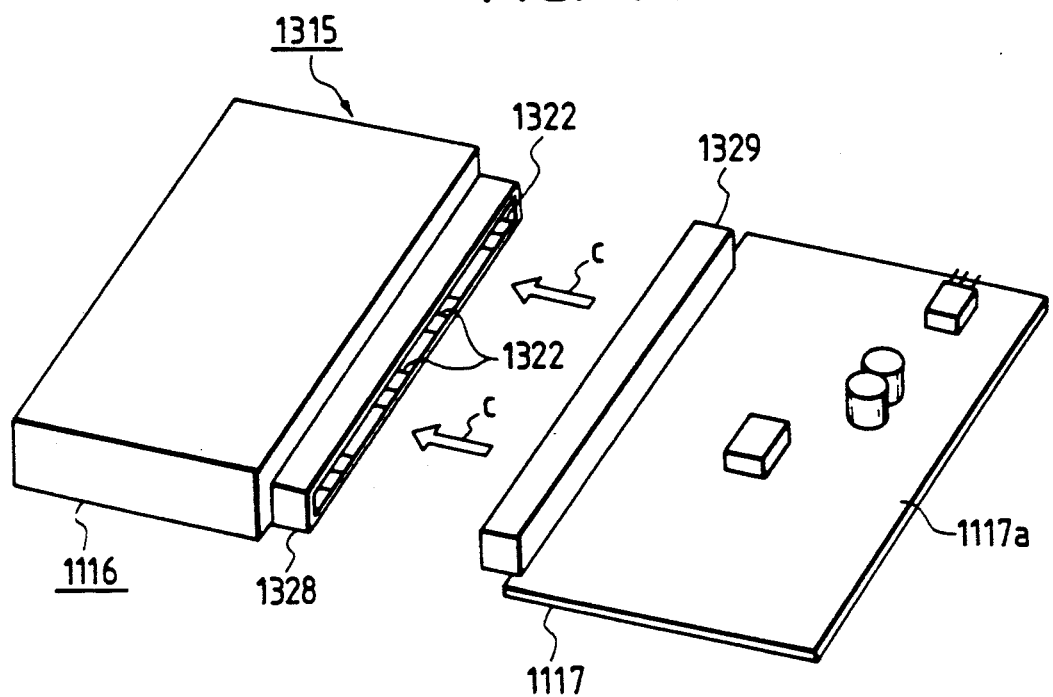

FIG. 71 is a perspective view showing a 23rd embodiment of a switch device according to the present invention. The module 1116 is provided with a connector 1328 which encircles all the pin terminals 1322. A socket 1329, which is to be coupled with the connector 1328 and the pin terminals 1322, is provided on the fore end portion of the substrate 1117a of the control unit 1117. The socket 1329 and the connector 1328 represent one embodiment of a connector means.

For assembling the switch device, the control unit 1117 is moved in the direction of an arrow "c", and the socket 1329 is coupled with the connector 1328 and the pin terminals 1322, providing the electrical and mechanical connection of the control unit 1117 with the module 1116.

Figure 72:
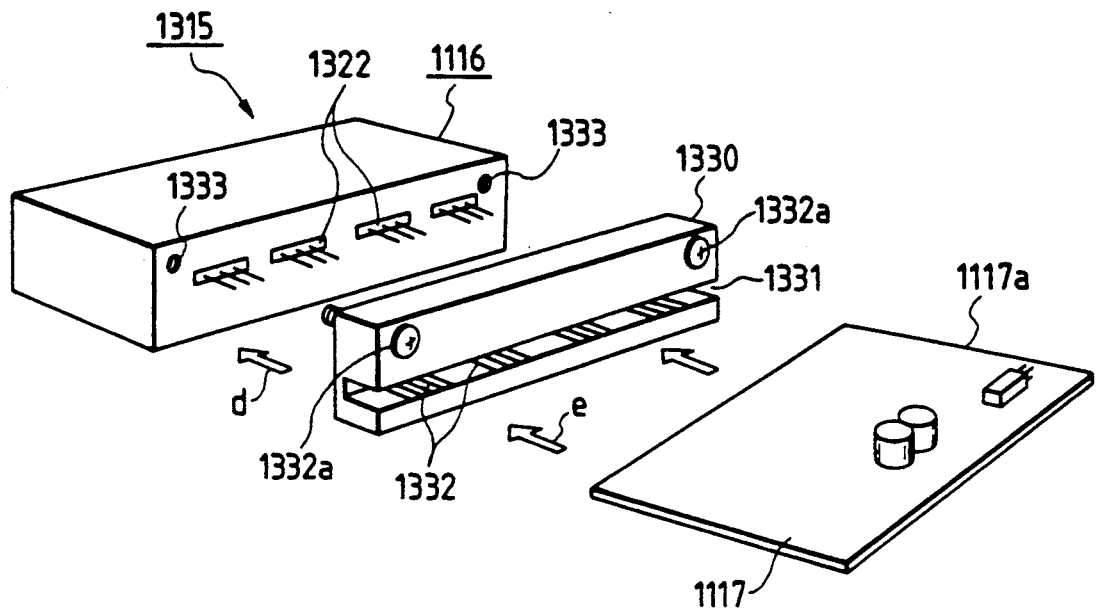

FIG. 72 is a perspective view showing a 24th embodiment of a switch device according to the present invention. In this embodiment, a connector unit 1330 is separately provided between the module 1116 and the control unit 1117 to connect the two. A groove 1331 is formed on the side wall of the connector unit 1330, which confronts the control unit 1117. Terminals 1332 are formed on the bottom surface of the groove 1331. Holes (not shown) into which screws 1332a are inserted, are further formed in the connector unit. Terminals connecting to the terminals 1332 are formed on the fore end of the reverse side (not shown) of the substrate 1117a of the control unit 1117. Mounting holes 1333 into which the screws 1332a are to be inserted, are also formed in the module 1116. A connector is provided on the side wall (not shown) of the connector unit 1330, which stands in front of the pin terminals 1322 of the module 1116.

For the assembling the switch device, the connector unit 1330 is first moved in the direction of an arrow "d", to connect the connector with the pin terminals 1322. Then, the control unit 1117 is moved in the direction of an arrow "e", to insert the fore end of the control unit into the groove 1331 of the connector unit 1330, thereby to connect the terminal 1332 with the terminal of the substrate 1117a. Consequently, the module 1116 is electrically and mechanically connected with the control unit 1117 by means of the connector unit 1330.

As seen from the foregoing description, according to the embodiments, the module is provided with the pin terminals, and a connector means is provided, which can electrically and mechanically connect and disconnect the module to and from the control unit. Therefore, from a mechanical standpoint, the connector means according to the embodiments provides a firm and stable connection of the module with the control unit. From an electrical standpoint, the equal lengths of the signal paths reduces the nonuniformity of the switching times, providing a good switching characteristic.

Figure 20:
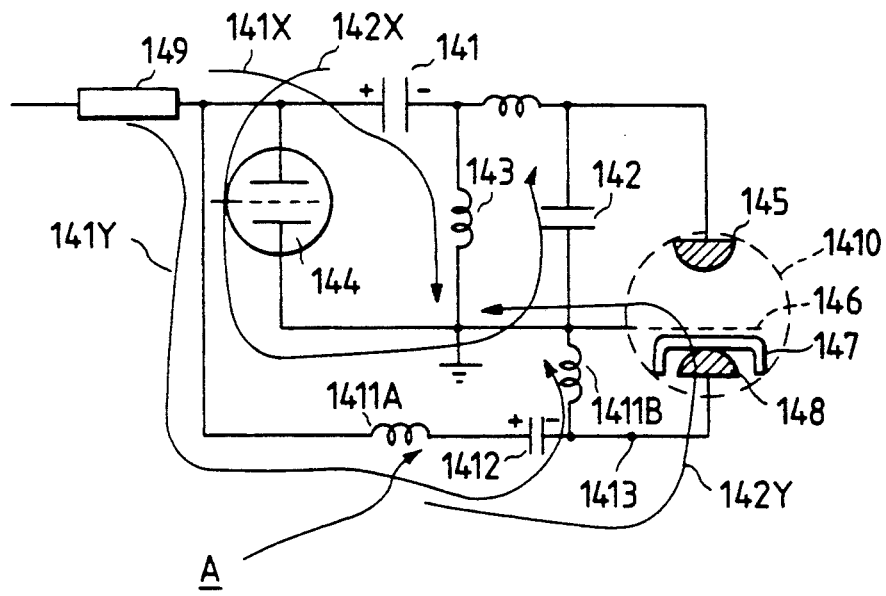
FIG. 20 is a circuit diagram showing a conventional discharge excited pulse laser device.
Figure 21:
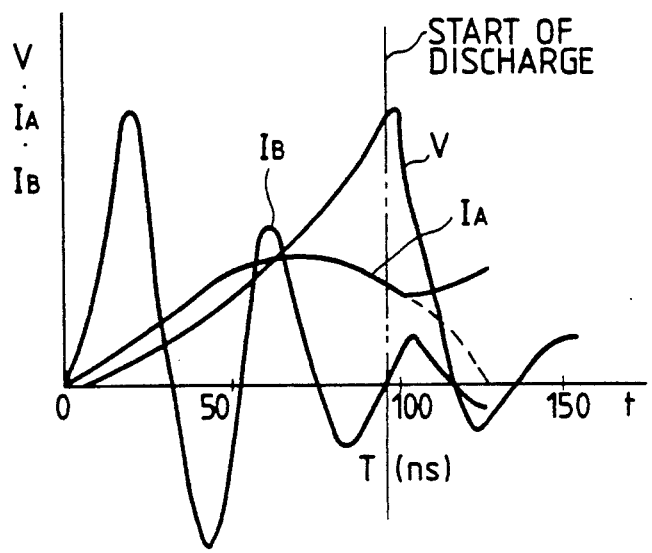
FIG. 21 is waveforms useful in explaining the operation of the laser device of FIG. 20.
Figure 73:
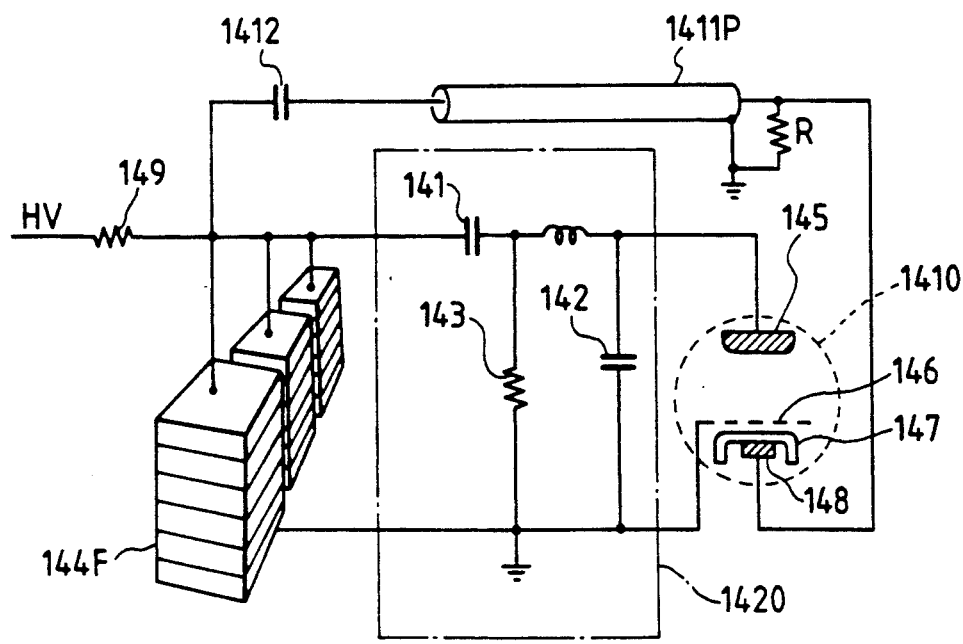
FIG. 73 is a circuit diagram showing a 25th embodiment of the present invention.

A 25th embodiment of the present invention will be described with reference to the accompanying drawings. In FIG. 73 in which like portions are designated by like reference numerals in FIG. 20, 144F designate a solid-state switch device consisting of FET (field effect transistor) modules; 1411P a pulse forming line (PFL) for delaying a pulse, which is disposed in a preparatory ionization dedicated circuit; and 1420 a high voltage pulse circuit made up of a capacitor 141, a peaking capacitor 142, and a charge inductance 143, and the like.

The operation of the discharge excited pulse laser device thus arranged will be described. In this embodiment, the high voltage switch is the solid-state switch device 144F in place of a hot cathode gas-contained discharge tube, which is conventionally used as the high voltage switch for start of discharge. The switch 144F consists of FET modules as solid state elements, connected in a series-parallel fashion. In this circuit, a large instantaneous current flowing into the high voltage pulse circuit 1420 is distributed into many elements series-parallel connected, with an enlarged current flow area. Therefore, the total inductance is extremely reduced. The delay factor is improved and hence a high switching operation of the high voltage switch is realized. Meanwhile, the conventional preparatory ionization dedicated circuit A (FIG. 20) is made up of the inductances 1411A and 1411B, and the capacitor 1412, which are for setting a time constant. Accordingly, it is difficult to adjust the timing of the current oscillation for causing the preparatory discharge. In this embodiment, the inductance is reduced to approximately 20 nH from approximately 200 nH which is the figure in the conventional device. To this end, the preparatory ionization dedicated circuit is branched from the high voltage side of the switch device and the pulse forming line 1411P is provided to adjust its length. With this, the current delay adjustment is possible, and the timing of ionization can be controlled. Therefore, stored electrons can be derived at a maximum density, and be applied to the main discharge portion at a proper time. Use of the pulse forming line 1411P improves the oscillation periods of the current pulse about three times, providing a high speed operation.

Figure 74:
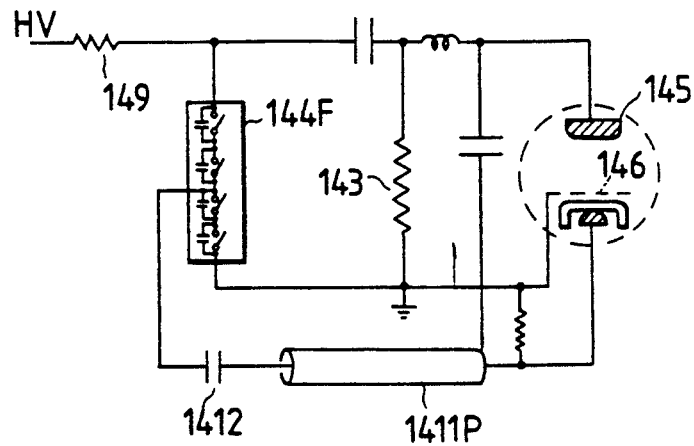
FIGS. 74 and 75 are circuit diagrams of 26th and 27th embodiments of the present invention.

FIG. 74 shows 26th embodiment of the present invention. A lead wire is derived from a point near a mid point of the solid-state switch device 144F of series connection, and is connected to the preparatory ionization dedicated circuit. In this circuit, the voltage applied to the preparatory ionization dedicated circuit is reduced, minimizing damage of the dielectric material inserted between the second main electrode 146 and the auxiliary electrode 148.

Figure 75:
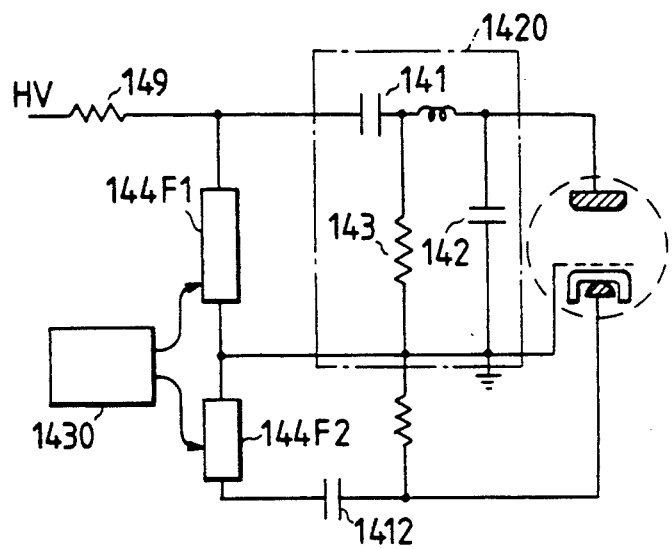

FIG. 75 shows a 27th embodiment of the present invention. In the arrangement of this embodiment, the first and second solid state switch devices 144F1 and 144F2 are separately provided so as to apply control instructions separately to the high voltage pulse circuit 1420 and the preparatory ionization dedicated circuit. When the FET modules are used for the first and second solid state switch device 144F1 and 144F2, the oscillation period can readily be set up in the high speed response. Accordingly, a trigger pulse can be produced from a pulser 1430 at good timing to perform the preparatory discharge. In the embodiments mentioned above, the capacitance transfer circuit is used for the high voltage discharge circuit. If required, an LC inverting circuit or a bloom line circuit may be used for the same. The FET modules for the solid state switch device may be replaced by any of transistors, thyristors, thyratrons, spark gaps, and the like.

In the 25th and 26th embodiments, the switch for starting the main discharge due to the charge stored in charges the capacitor, is constructed with the solid state switch device consisting of series-parallel connected solid state switch elements. The high voltage side of the solid state switch device is connected to the auxiliary electrode through the preparatory discharge dedicated circuit including the pulse forming line. The start timing of the preparatory discharge prior to the start of the main discharge can be controlled by adjusting the length of the pulse forming line. Therefore, a higher switching is realized, and the uniform preparatory discharge can be performed in harmony with the main discharge timing.

In the 27th embodiment, the first solid state switch device for starting the main discharge and the second solid state switch device for starting the preparatory discharge are provided, and turned on by the pulser. Therefore, the start timing of the preparatory discharge for performing the main discharge in the best conditions can be set.

Figure 76:
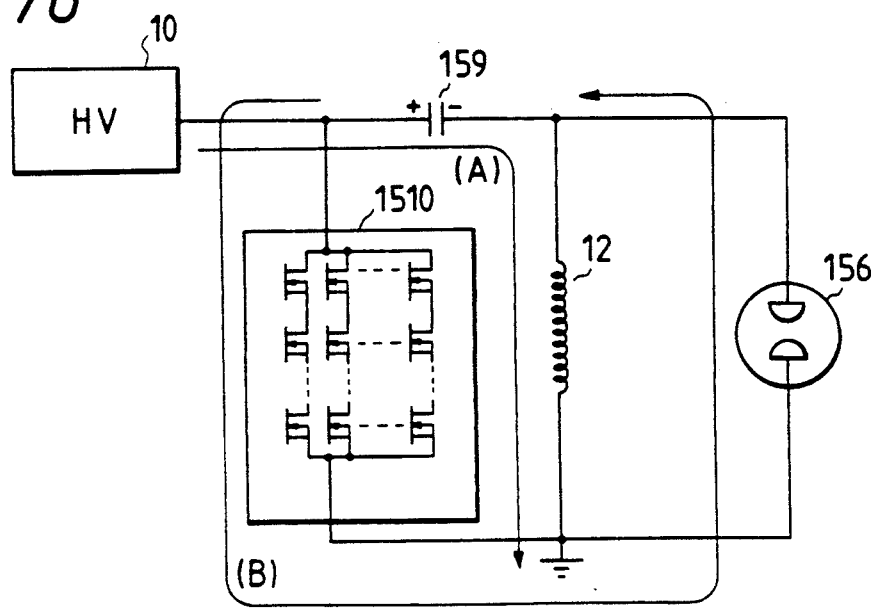
FIG. 76 is a circuit diagram showing a 28th embodiment of the invention.

A 28th embodiment of the present invention will be described with reference to the accompanying drawings. In FIG. 76, like reference symbols are used for designating like or equivalent portions in FIG. 1. A capacitor 159 is charged by the high voltage power source 10. A solid-state switch device 1510 contains a plurality of high speed switch elements series-parallel connected (into, e.g., a multiple of stages).

In operation, the high voltage power source 10 charges the capacitor 159 through a loop A including the capacitor 159 and the reactor 12. Then, the solid-state switch device 1510 as a high voltage switch is turned on. Upon the turn-on of the switch, the charge stored in the capacitor 159 is directly pulse-discharged through a loop B of capacitor 159 - solid-state switch device 1510 - discharge section 156. It is noted here that the solid-state switch device 1510 is incorporated in series into the discharge loop B. Through the pulse discharge operation, the voltage between the main electrodes provided in the discharge section 156 sharply rises, and a discharge space is broken down, so that the energy stored in the capacitor 159 is fed into the discharge section 156. In turn, the gas in the discharge space is excited to emit a laser beam by the stimulated emission.

Solid-state switch elements, such as FET (field effect transistor) modules, are directly stacked in a series-parallel connection fashion, to form a single block. The capacitor 159 is fabricated into the switch block. The switch block is mounted on the discharge section 156, to form a unit structure. In this case, the related components are interconnected wirelessly, to minimize the current flow paths and hence to reduce the inductance.

As seen from the foregoing description, the solid-state switch device is connected in series to the discharge loop for pulse-discharging the energy stored in the capacitor to the discharge section. The plurality of high speed switch elements in the solid-state switch device are series-parallel connected. Therefore, the inductance of it is small, so that a steep pulse discharge current can be obtained, with a good overall efficiency.

Figure 22:
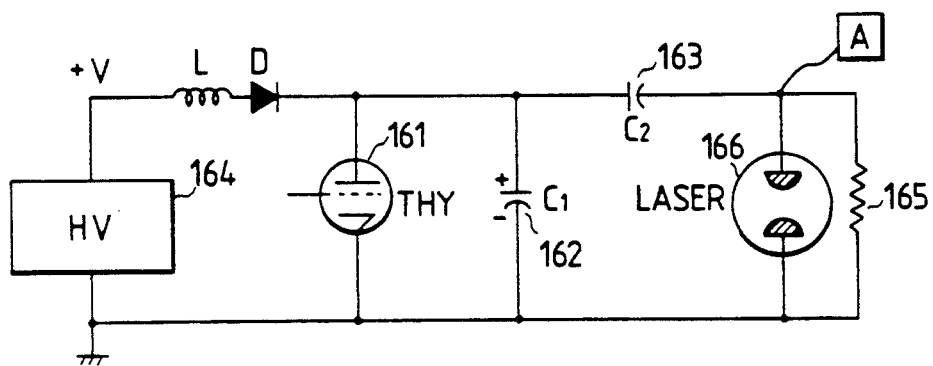
FIGS. 22 and 23 are circuit diagrams showing electrical circuits of conventional discharge excited pulse laser devices.
Figure 23:
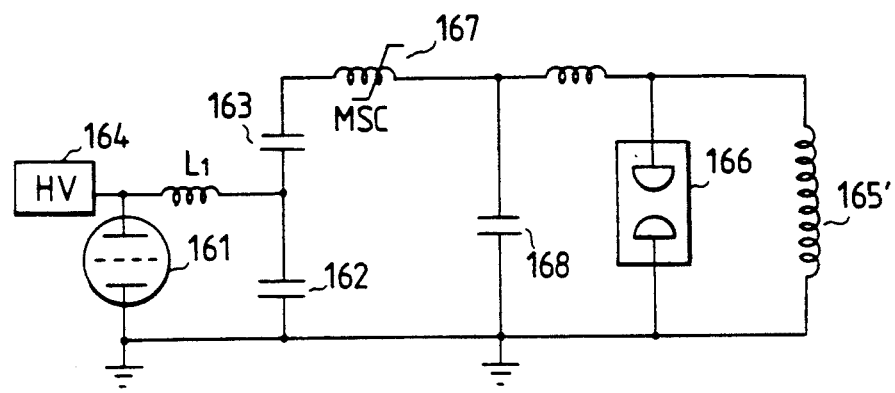
Figure 77A:
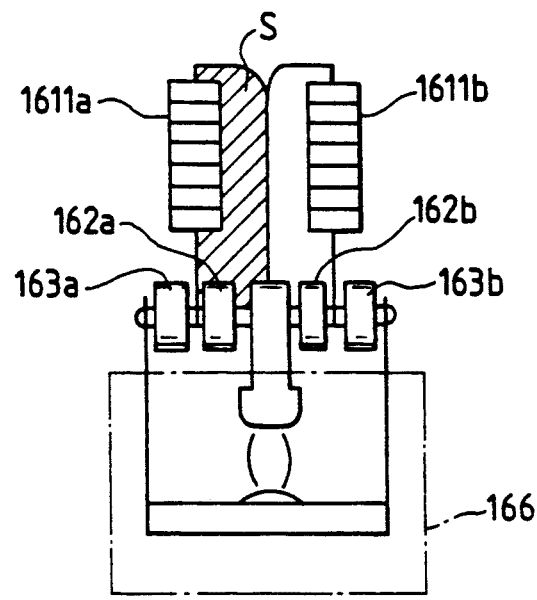
FIGS. 77(a) and 77(b) are a side view and a perspective view showing a 29th embodiment of the invention.
Figure 77B:
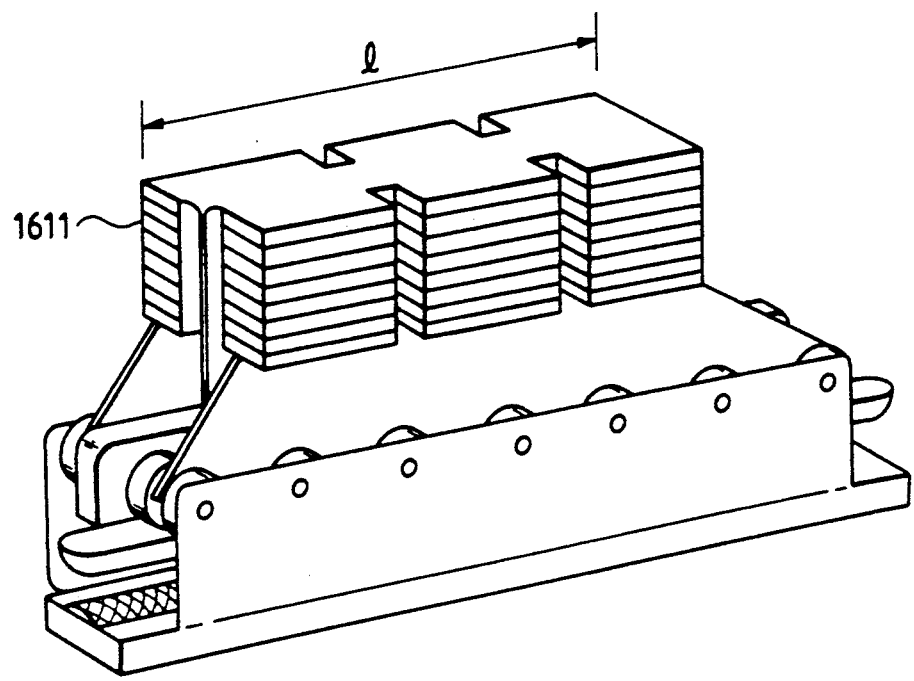
Figure 78:
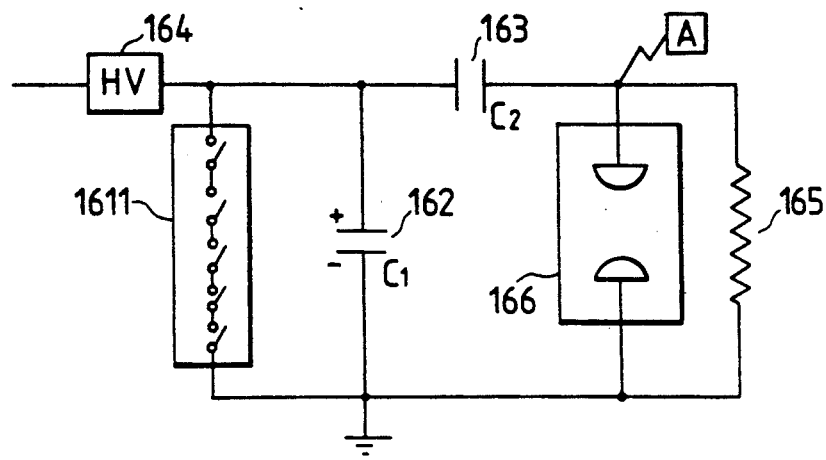
FIG. 78 is a circuit diagram showing an electrical circuit contained in the laser device.

A 29th embodiment of the present invention will be described with reference to the accompanying drawings. In FIGS. 77 and 78, like reference symbols are used for designating like or equivalent portions in FIGS. 22 and 23. High voltage switches 1611a and 1611b as solid-state switch element groups are constructed with stacks of series-parallel connected FET (field effect transistor) modules. Reference numerals 162a and 162b designate the capacitor $C_1$ and numerals 163a and 163b the capacitor $C_2$.

In operation, in FIG. 78, the high voltage power source 164 charges the capacitors 162 and 163 through the charge resistor (or inductive element) 165 of the LC inverting circuit. At this time, the voltage at point A is zero. Then, the high voltage switch device 1611 is simultaneously turned on. Discharge starts through a loop including the first capacitor 162 and the high voltage switch device 1611. With progress of the discharge, the voltage at point A rises up to a value two times the charge voltage. And the voltage between the main electrodes rapidly rises and the discharge space is broken down. The energy of the capacitor is fed into the discharge space. The gas in the discharge space is excited to emit a laser beam by the stimulated emission. In the LC inverting circuit, the charge voltage may be lower than the voltage necessary for the discharge section 166. Therefore, the down-sizing of the power source may be realized.

Figure 2:
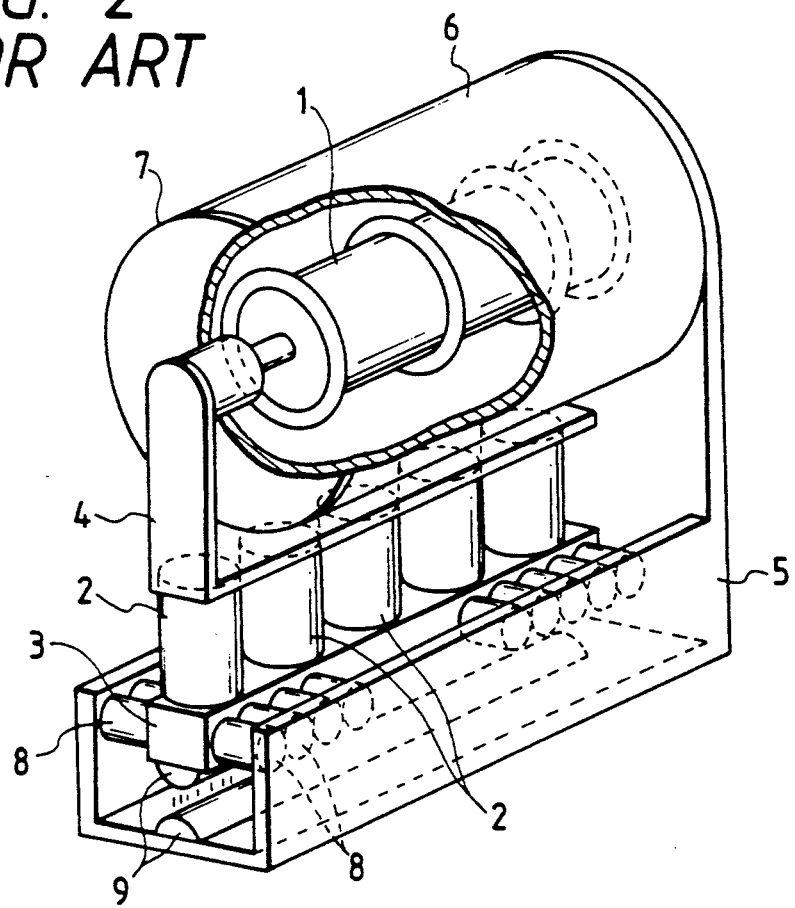
FIG. 2 is a perspective view showing a conventional laser device using a thyratron.

As stated above, the high voltage switch device 1611 is preferably a stack of series-parallel connected FET modules as the switching elements. FIGS. 77(a) and 77(b) show how the FET modules are stacked. As seen, in this embodiment, the switch consists of seven stages of modules arrayed in series, and six stages of modules in parallel. The FET modules are arranged along the discharge section 166. This arrangement reduces the stray inductance of the high voltage switch device. In a case where the cross sectional area of the loop including the high voltage switch 1611 and the first capacitor 162 is $S=2$ m$^2$, and its length "l" in the discharge direction is 0.5 m, the circuit inductance is 50 nH. This figure is substantially equal to the inductance anticipated from the relation $L=\mu S/l$. Division of the high voltage switch device 1611 into two sections as shown further reduces the inductance up to 25 nH. This small figure of the inductance cannot be achieved in the conventional switch device using the thyratron. When the high voltage switch device 1611 is applied for the LC inverting circuit, the voltage can be rapidly increased before the discharge. Therefore, the laser oscillation efficiency can be improved, and use of the magnetic saturation switch as described with reference to FIG. 2 is not required.

Meanwhile, when the product of the voltage applied to the discharge space and its application time reaches a given value, the electron multiplication starts, so that the impedance of the discharge space is decreased. A finite time is taken until the decrease of the impedance terminates. In the switch device of the invention, since the inductance is small, the voltage can be doubled within a short time. In this case, however, the voltage-time product does not yet reach a predetermined value. Under this condition, the current from the capacitor cannot flow into the discharge space because the impedance is still high in the discharge space. Then, the current returns to the original place through the high voltage switch device 1611, and the voltage drops. For this reason, an excessive reduction of the inductance also reduces the oscillation efficiency. From this, it is readily seen that the best oscillation efficiency can be achieved by selecting the inductance of the circuit including the high voltage switch device 1161 and the capacitance of the capacitor 162 so that the product of the voltage and the time t $(=\pi\sqrt{LC})$ in which the voltage is doubled, is equal to the voltage-time product proper to the discharge space.

Figure 79:
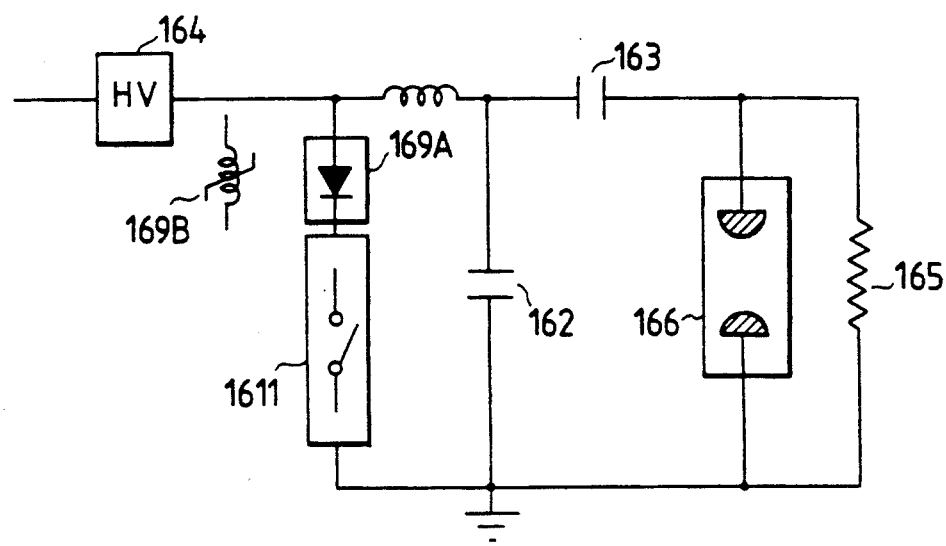
FIGS. 79 to 81 are circuit diagrams showing other electrical circuits according to 30th to 32nd embodiments of this invention.

FIG. 79 shows a 30th embodiment of the present invention. In the embodiment, a diode 169A is inserted between the high voltage power source 164 and the high voltage switch device 1611. The circuit shown in FIG. 79 can prevent the voltage once raised from dropping again. The diode 169A may be replaced by a magnetic saturation switch 169B. The circuit can double the voltage applied to the discharge space, and keep the doubled voltage until the discharge starts (electron multiplication starts). Therefore, the improvement of the oscillation efficiency is realized.

Figure 80:
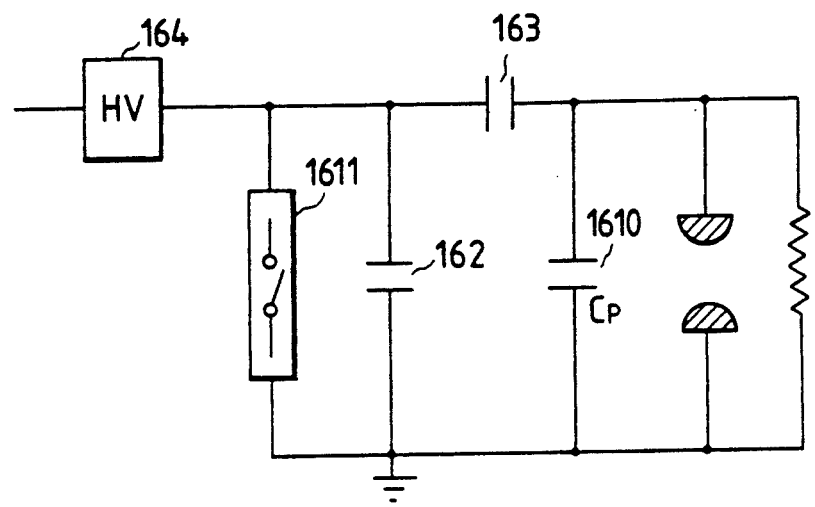

FIG. 80 shows a 31st embodiment of the present invention, in which a peaking capacitor 1610 is provided close to the discharge section. A more steep voltage can be applied to the discharge section.

Figure 81:
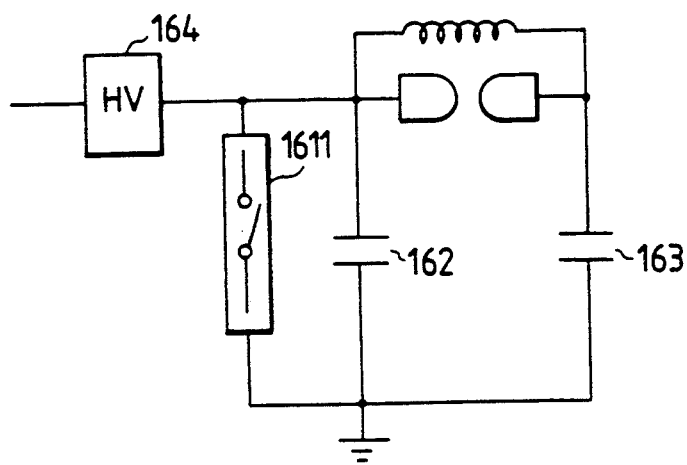

FIG. 81 shows a 32nd embodiment of the present invention. The circuit arrangement shown in FIG. 81 is frequently used in a nitrogen laser, for example. Also in this circuit, to increase the voltage applied to the discharge section to a high voltage, a time constant of the circuit must be set small. To realize this, it is effective to use a plurality of semiconductor switch elements for the high voltage switch 1611.

The series-parallel connected FET modules, to reduce the circuit inductance, are used for the high voltage switch in the embodiments as mentioned above. However, the high voltage switch may be constructed with another type of series-parallel connected components, such as thyratrons as the conventional switch, spark gaps, thyristors, and transistors. Also, in this case, the inductance can be made small. Further, semiconductor switches may be made into an IC so that one switch has a plurality of switching functions.

As seen from the foregoing description, in the embodiments, solid-state element switch groups each consisting of a plurality of FET modules are used for the high voltage switch for LC inverting circuit. Therefore, the switch inductance is reduced, providing a high response performance of the high voltage switch. Thus, a laser device of high oscillation efficiency can be obtained.

Figure 24:
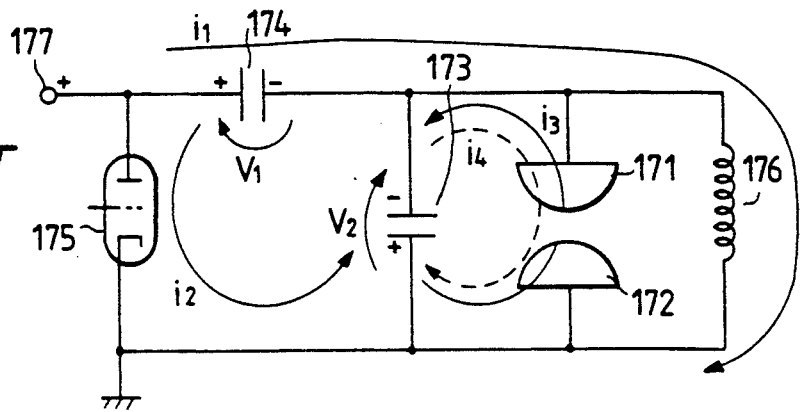
FIG. 24 is a circuit diagram showing a conventional discharge excited pulse laser device.
Figure 25A:
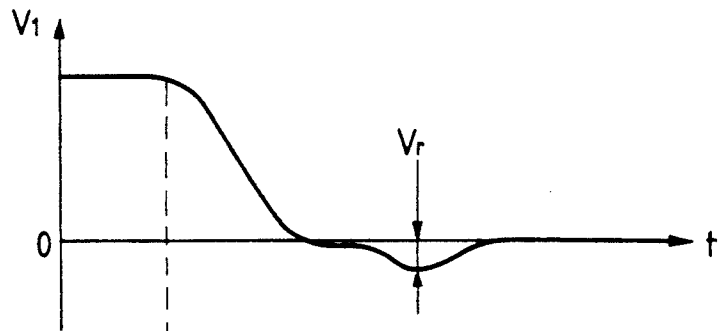
FIGS. 25(a) and 25(b) show voltage waveforms useful in explaining the operation of the laser device of FIG. 24.
Figure 25B:
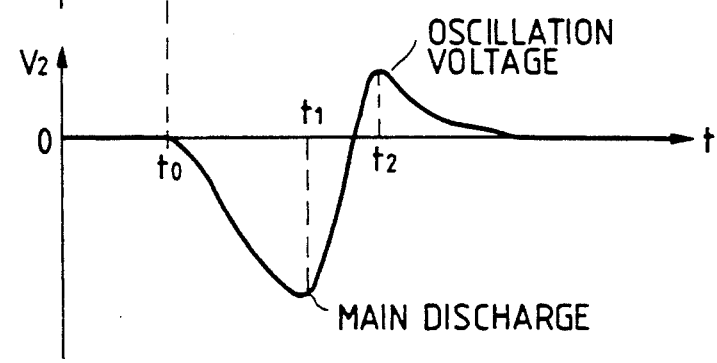
Figure 82:
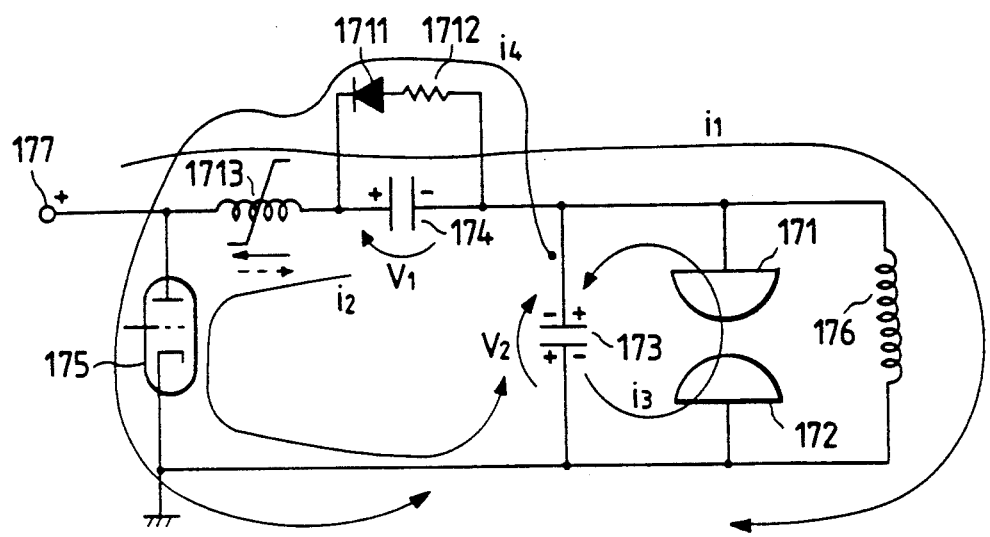
FIG. 82 is a circuit diagram showing a 33rd embodiment of the present invention.

A 33rd embodiment of the present invention will be described with reference to the accompanying drawings. In FIG. 82, like reference symbols are used for designating like or equivalent portions in FIG. 24 or 26. In the figure, reference numeral 1711 designates a diode, and numeral 1712 a resistor. A series connection of the diode 1711 and the resistor 1712 is connected in parallel to the pulse generating capacitor 174. The diode 1711, when connected, is directed to be nonconductive for the charge polarity of the voltage applied to the charge terminal 177. A switch 1713 consists of a saturable reactor, connected between the pulse generating capacitor 174 and the switch 175 constructed with a thyratron. A series connection of the pulse generating capacitor 174, the thyratron switch 175, and the saturable reactor switch 1713, is connected in parallel to the main discharge electrodes 171 and 172.

The circuit made up of the diode 1711 and the resistor 1712 is called a reverse current arresting circuit.

Figure 83A:
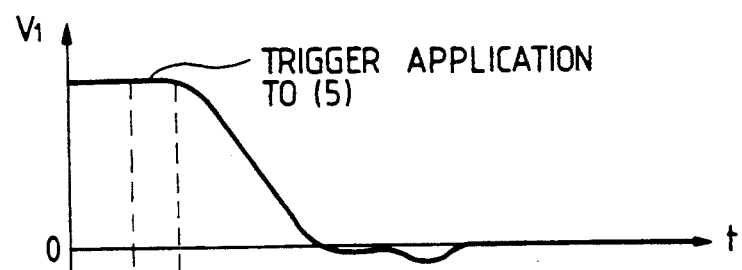
FIG. 83(a) and 83(b) show voltage waveforms useful in explaining the operation of the laser device of FIG. 82.
Figure 83B:
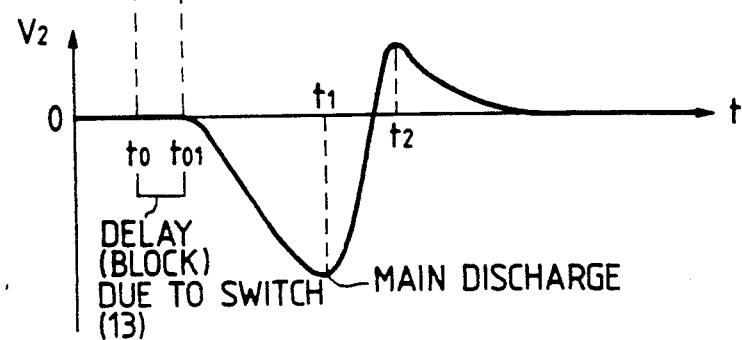

The operation of the discharge excited pulse laser device thus arranged will be described. Current $i_1$ flows into the pulse generating capacitor 174, and charges the capacitor. At time point $t=t_0$, a trigger signal is applied to the thyratron switch 175. In response to the trigger, the charge stored in the pulse generating capacitor 174 is discharged in the form of current $i_2$. After a time determined by the product of voltage and time of the saturable reactor switch 1713, elapses ($t=t_{01}$ in FIG. 83), the charge transfers from the pulse generating capacitor 174 to the peaking capacitor 173. Voltage waveforms are shown in FIG. 83. At time point $t=t_1$, the main discharge starts between the main discharge electrodes 171 and 172 and current $i_3$ flows. At time point $t=t_2$, the voltage across the peaking capacitor 173 is reversed in polarity. Subsequent to $t=t_2$, the reverse voltage will develop in the pulse generating capacitor 174. At this time, the reverse current arresting circuit including the diode 1711 and the resistor 1712, which is connected in parallel to the pulse generating capacitor 174, allows by-pass current $i_4$ to flow therethrough. Therefore, no reverse voltage develops in the pulse generating capacitor 174. Excessive energy caused by the oscillation following the main discharge is consumed by the resistor 1712. The result is that no aftercurrent (reverse current) is produced between the main discharge electrodes 171 and 172, and hence the arc or streamer is not produced. In the present embodiment, the required response speed of the diode 1711 may be relatively slow, with provision of the saturable reactor switch 1713. The reason for this follows.

The saturable reactor switch 1713 shown in FIG. 82 is saturated in the direction of an arrow indicated by a solid line. When the reverse polarity charge has been accumulated in the pulse generating capacitor 174, the switch 1713 is placed in a block state to prohibit the subsequent charge oscillation. Within a relatively long period of time (e.g., 200 ns) that the switch 1713 blocks the voltage shift, the diode 1711 may respond and flow the reverse current through the resistor 1712. For this reason, the response time of the diode 1711 may be slow, and the peak current may also be reduced. Thus, the diode 1711 in this embodiment may be an inexpensive, slow response diode.

Figure 84:
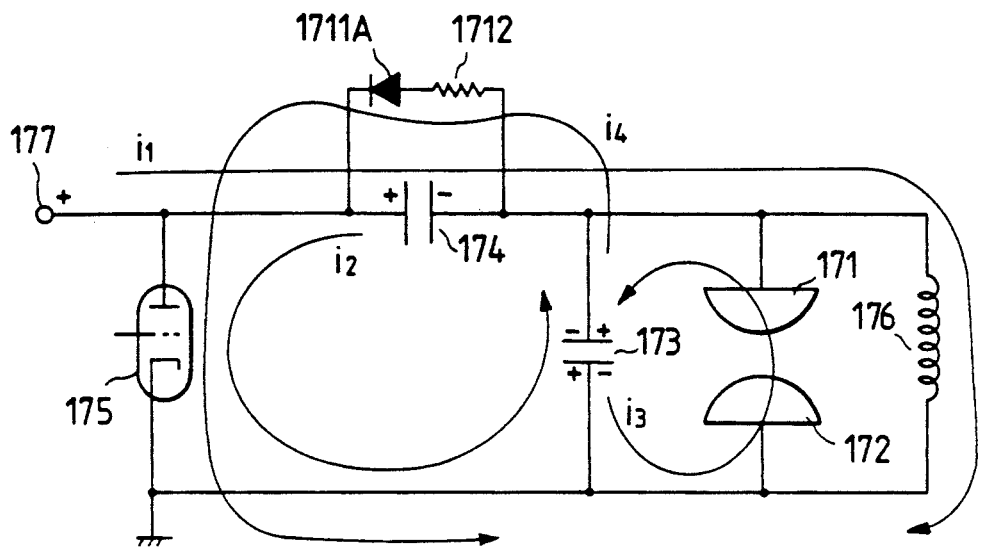
FIGS. 84 to 88 are circuit diagrams as to 34th to 37th embodiments of the present invention.

FIG. 84 shows a 34th embodiment in which a discharge excited pulse laser device uses a high response, large current diode 1711A, unlike the pulse laser device of FIG. 82. Since the diode has a high response speed, this pulse laser device may achieve the useful effects comparable with those of the 33th embodiment, without aid of the saturable reactor switch.

Figure 85:
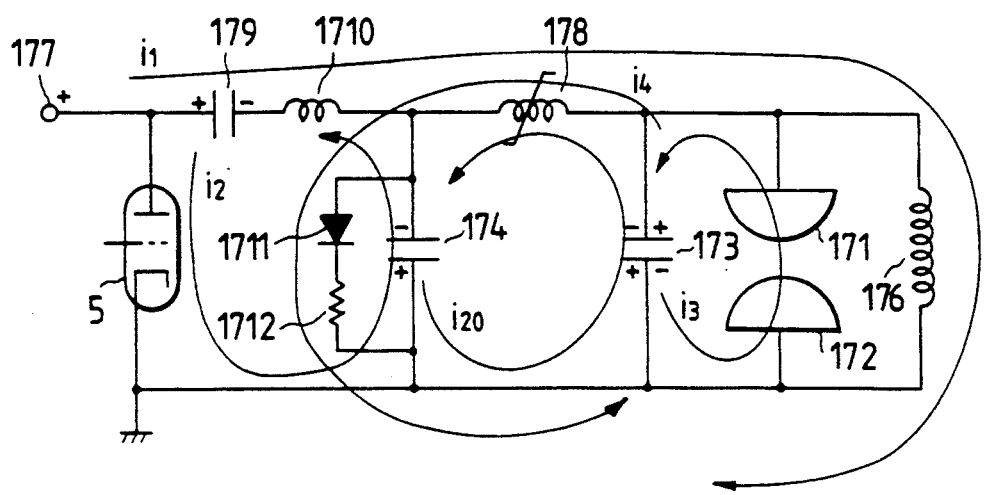

FIG. 85 shows a 35th embodiment in which a pulse laser device is arranged to have a means for arresting the reverse current in the prior pulse laser device shown in FIG. 26. As shown, a series connection of a switch 178 constructed with a saturable reactor and a pulse generating capacitor 174 is connected in parallel between the main discharge electrodes 171 and 172. A series connection of a diode 1711 and a resistor 1712 (forming a reverse current arresting circuit) is connected in parallel to the pulse generating capacitor 174. Charge current $i_1$ flows into a pulse generating capacitor 179 to charge the capacitor. The charge thus first stored is transferred (in the form of current $i_2$) to the pulse generating capacitor 174 through a thyratron switch 175. The diode 1711 is connected so as to be nonconductive for the polarity for the flow direction of the current which first charges the pulse generating capacitor 174. The reverse current charge stored in the peaking capacitor 173, when the block by the saturable reactor switch 178 is removed, abruptly by-passes through the diode 1711 as discharge current $i_4$. Therefore, this pulse laser device may also achieve the effects similar to those by the embodiments as mentioned above.

Figure 86:
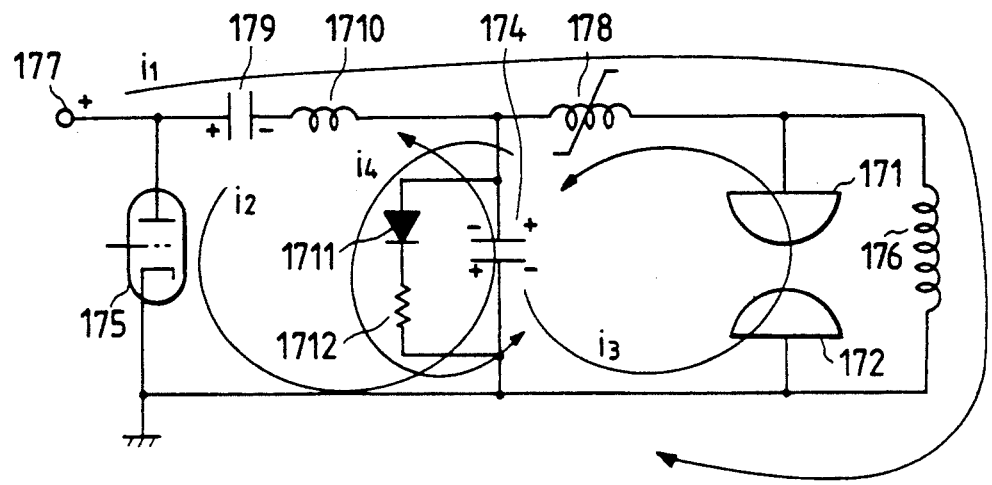

While the embodiments thus far described each use the peaking capacitor 173, a pulse laser device not using the peaking capacitor (as shown in FIG. 86) may achieve the beneficial effects comparable with those achieved by those embodiments. In this case, it is preferable to use a high speed, and high capacity diode for the diode 1711A.

Figure 87:
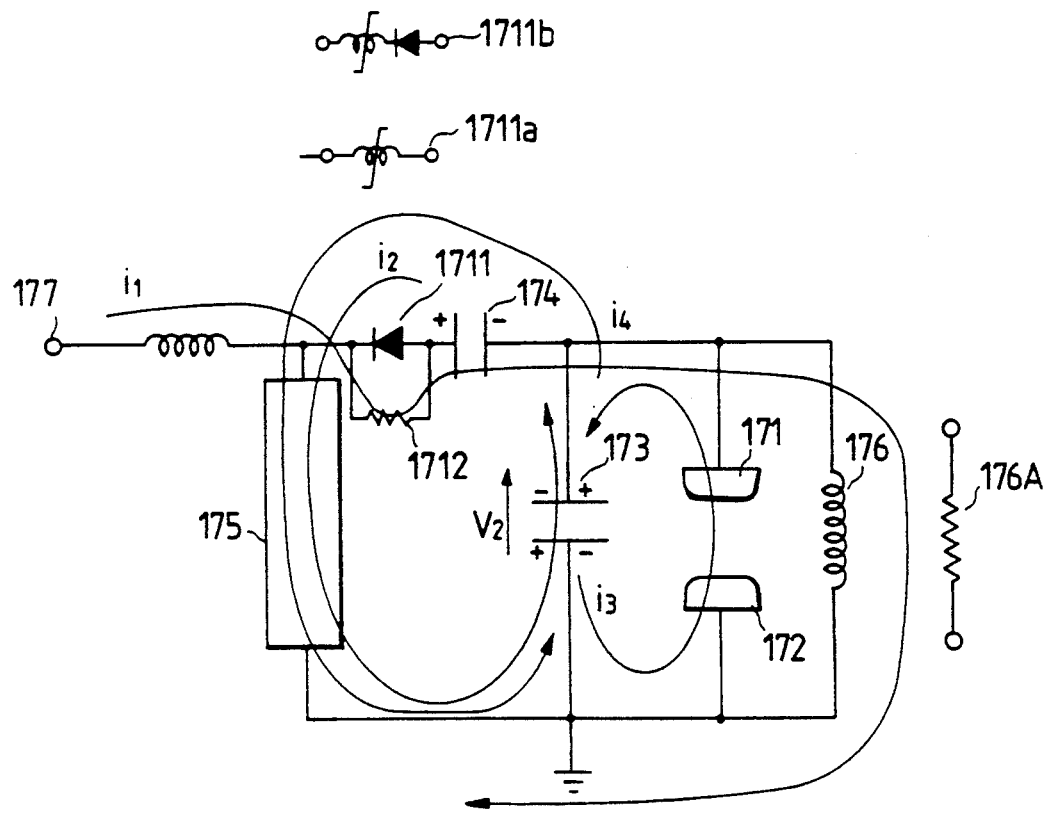

FIG. 87 shows a 36th embodiment of the present invention. In the figure, a diode 1711 is inserted in series in a circuit including a peaking capacitor 173, a pulse generating capacitor 174, and a switch 175. A resistor 1712 is connected in parallel to the diode 1711.

In the circuit, charge current $i_1$, fed from a charge terminal 177 to the pulse generating capacitor 174, flows through the resistor 1712 and an inductance 176. When the switch 175 becomes conductive, the charge stored in the pulse generating capacitor 174 is transferred to the peaking capacitor 173 (in the form of current $i_4$), which is connected in parallel to the discharge section, through the diode 1711 and the switch 175. With the charge transfer, the voltage between the main discharge electrodes 171 and 172 rises and then the main discharge starts (current $i_3$ flows) to emit a laser beam.

Part of the charge stored in the capacitors 173 and 174 is not consumed by the discharge section and will oscillate. At this time, the direction of the current is opposite to that of the current caused by the voltage when the laser beam is emitted. The diode 1711 blocks the current flow. Further, the current is consumed by the resistor 1712 if its value is set to be large. As a result, the oscillation (reverse) current is suppressed.

In this case, a high speed operation is required for the diode 1711. Because of this, a series-parallel connection of many diodes makes up the diode 1711. A saturable reactor (MPC), denoted as 1711(a) in FIG. 87, may be used in place of the series-parallel diodes connection. In this case, if the reactor is saturated, the oscillation suppressing effect is lost. This problem, however, may be avoided in such a manner that the saturation time is properly adjusted and the discharge disappears within the adjusted saturation time. If the saturable reactor and a low speed diode is combined (the combination of them is denoted as 1711(b) in FIG. 87), the voltage block effect of the saturable reactor and the resistance reduction of the large current diode caused when the voltage block is removed, cooperate to provide better effects.

In each embodiment, the inductance 176 is used for the charge circuit. The energy stored in the inductance, when discharged, is possibly transformed into an arc. To avoid this, a resistor 176A is preferable to the reactive element 176.

Figure 88:
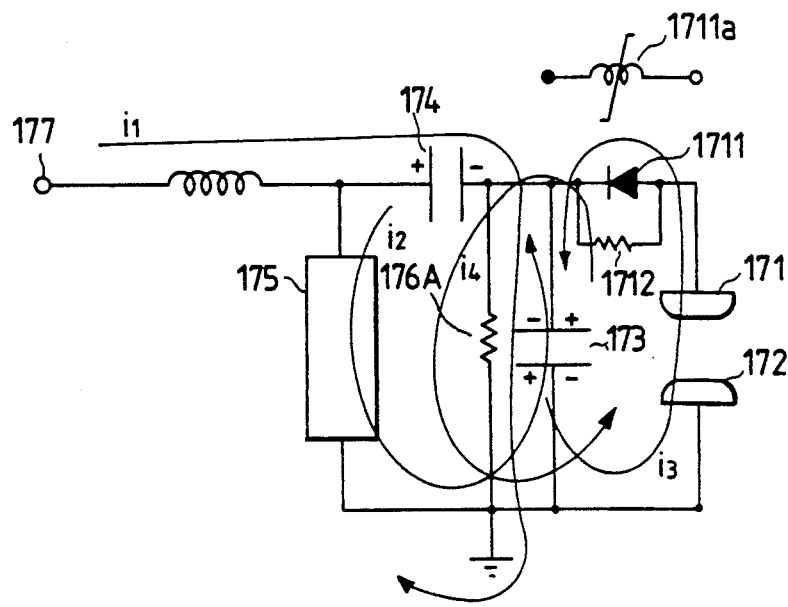

FIG. 88 shows a 37th embodiment of the present invention. In the figure, a diode 1711 of the reverse current arresting circuit (for suppressing the oscillation) is inserted in a circuit including the peaking capacitor 173 and the main discharge electrodes 171 and 172. When the oscillation is suppressed by the diode 1711, the energy left in the peaking capacitor 173 is consumed by a resistor 176A.

While the diodes and the saturable reactors are used in the above embodiments, those may be replaced by any elements capable of restricting current, such as diode vacuum tubes, thyristors, and varistors. Since the resistor 1712 may be replaced by an internal resistance of the diode and the like, the resistor 1712 may be omitted.

In the embodiments, the thyratron is used for the switch 175. It may be substituted by a series-parallel connection of semiconductor switching elements (thyristors, SIT transistors, FETs, IGBTs, etc.), or switches such as spark gaps and rail switches. The positive charge current is fed from the charge terminal 177, but a negative charge current may be used while keeping the useful effects, While the embodiments have been described using the excimer laser, it is evident that the present invention is applicable for any type of pulse laser device if it has a small discharge resistance and the oscillating discharge current.

The capacitors used in the above embodiments may be substituted by a pulse shaping circuit as a distributed constant circuit.

Proper combinations of the embodiments will provide further better effects.

As seen from the foregoing description, to arrest the reverse current caused by the reverse voltage applied to the main discharge electrodes after the main discharge, the reverse current arresting circuit is connected to a key portion of the location where the reverse voltage can be reduced. With provision of the reverse current arresting circuit, the energy caused by the reverse voltage is consumed, so that the arc and stream hardly occur between the main discharge electrodes, and the electrodes are little damaged.

Additionally, a high repetitive oscillation is allowed, realizing a high efficiency operation of the laser device.

Figure 28:
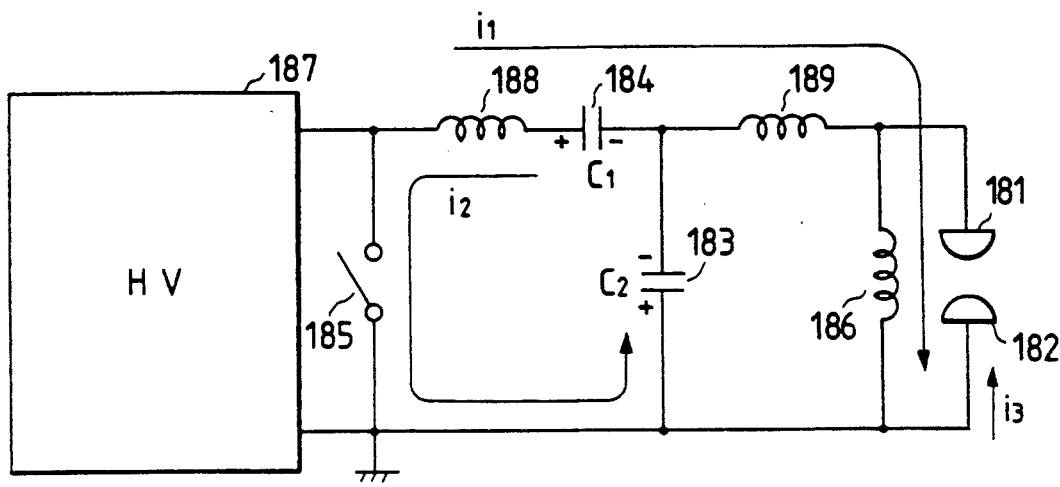
FIG. 28 is a circuit diagram showing a conventional discharge excited pulse laser device.
Figure 29:
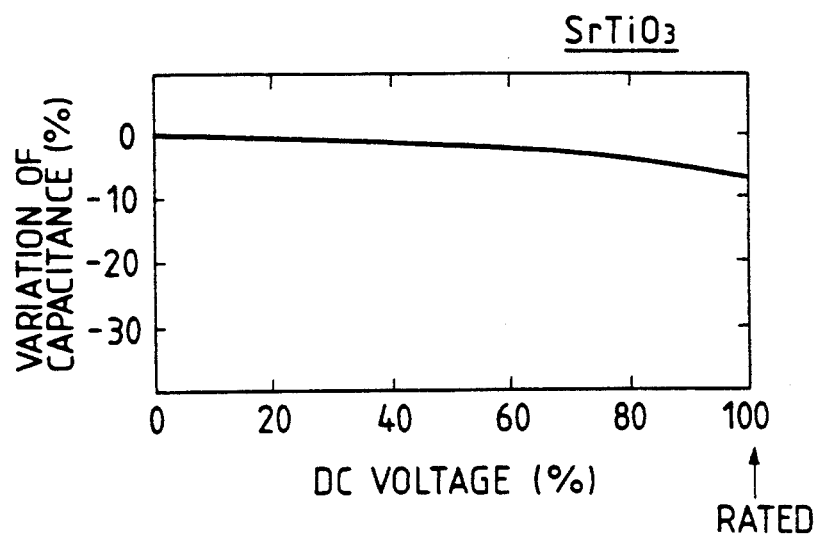
FIG. 29 is a graph showing a capacitance vs. voltage characteristic of a peaking capacitor made of $SrTiO_3$.
Figure 89:
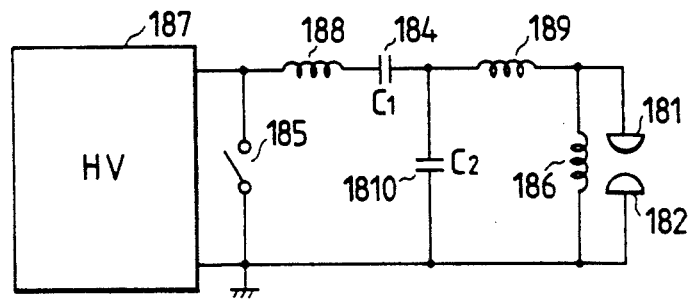
FIG. 89 is a circuit diagram showing a 38th embodiment of the invention.
Figure 90:
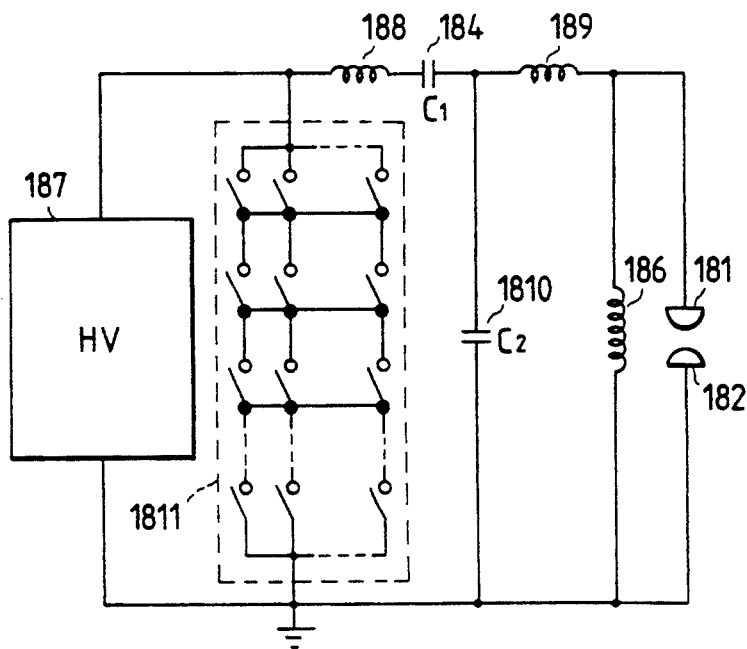
FIG. 90 is a circuit diagram showing a 39th embodiment of the invention.

38th and 39th embodiments of the present invention will be described with reference to the accompanying drawings. In FIGS. 89 and 90, like reference symbols are used for designating like or equivalent portions in FIG. 28. A peaking capacitor ($C_2$) 1810, as a voltage dependent capacitor, is made of $BaTiO_3$ (titanic acid barium), for example. A solid-state switch device 1811 is constructed with FET (field effect transistor) modules that are series-parallel connected.

Figure 91:
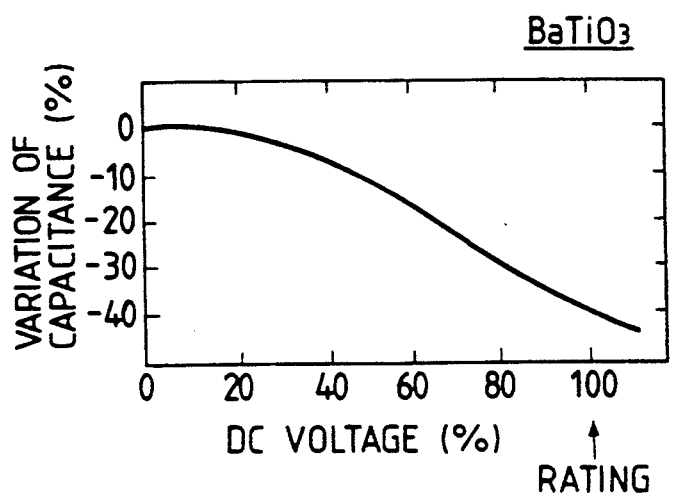
FIG. 91 is a graph showing a capacitance vs. voltage characteristic of a peaking capacitor made of $BaTiO_3$.

The operation of the laser device thus arranged will be described. The operation of the circuit is the same as that referred to in FIG. 28, and hence will be omitted. A variation of the capacitance of the peaking capacitor ($C_2$) 1810 (FIG. 89) with respect to DC voltage, will be described with reference to FIG. 91. As seen from the graph, when the charge voltage approaches to the rated voltage, the capacitance of the peaking capacitor ($C_2$) 1810, if it is made of $BaTiO_3$, decreases to approximately the half of its value before it is charged. Lifetime of the main discharge electrodes, except for the deterioration by chemical reaction, depends generally on how a uniform and arc-free discharge is performed. To avoid the deterioration of them owing to the spattering, the aftercurrent must be minimized. Hence, to secure a high reliability and a long lifetime, it is necessary to decrease the inverted voltage appearing across the peaking capacitor after the discharge starts. In the capacitance transfer type circuit, a first peak voltage $V_{2M}$ is given by $$V_{2M} = V_o \frac{2\gamma}{\gamma + 1}$$

In the equation, $V_o$ = charge voltage for the capacitor $C_1$, and $$2V_o = V_{2M}(C_1+C_2)/C_1$$

where $\gamma = C_1/C_2$.

Figure 30A:
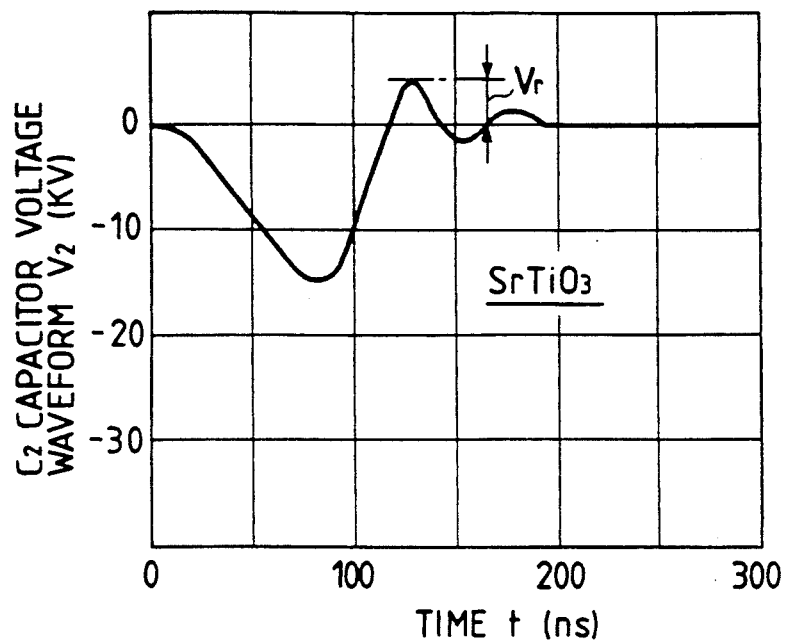
FIGS. 30(a) and 30(b) are graphs showing voltage and current waveforms of the $SrTiO_3$ peaking capacitor.
Figure 30B:
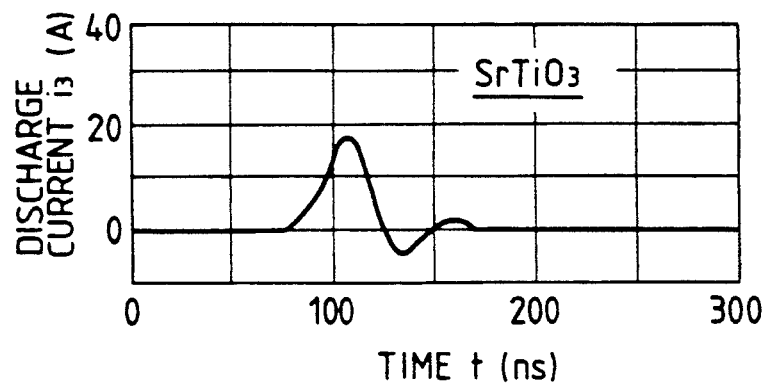
Figure 93:
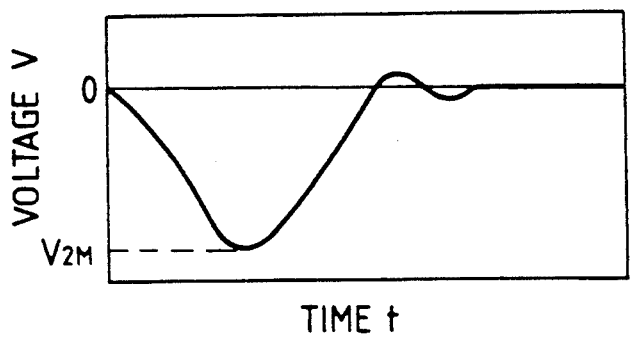
FIG. 93 is a graph showing an oscillation waveform of the maximum discharge voltage.
Figure 94:
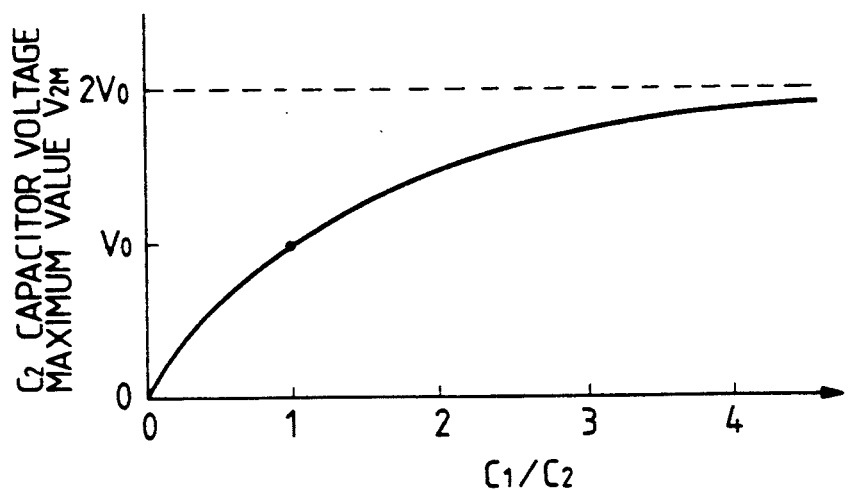
FIG. 94 is a graph showing a correlation between the ratio of $C_1/C_2$ and the maximum value of the capacitor voltage.
Figure 92A:
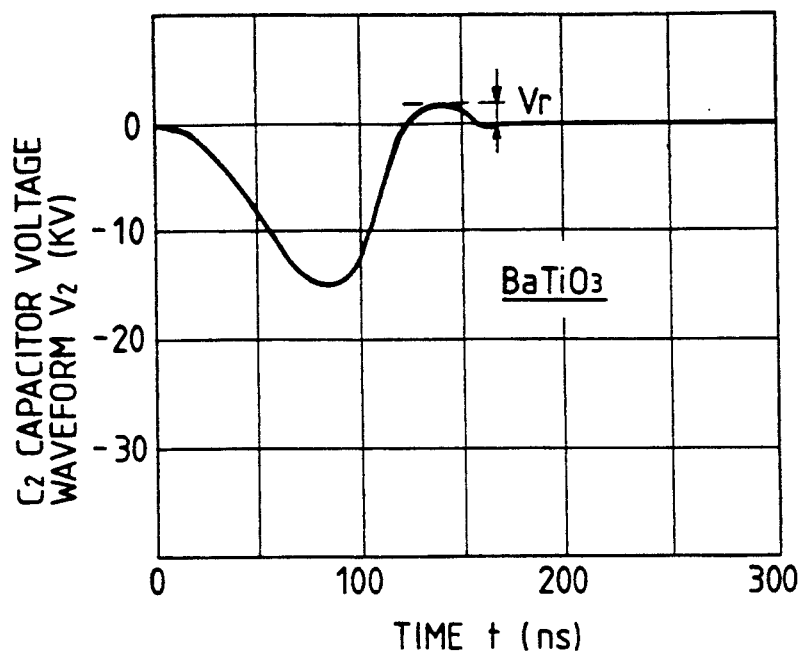
FIGS. 92(a) and 92(b) are graphs showing voltage and current waveforms of the peaking capacitor according to the invention.
Figure 92B:
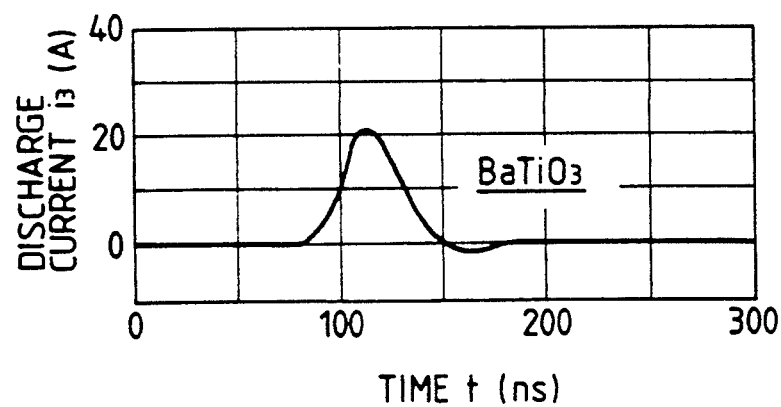

FIG. 94 is a graph showing a relationship between $C_1/C_2$ and $V_{2M}$. The graph shows that the voltage across the peaking capacitor $C_2$ can be increased up to two times the applied voltage by gradually increasing the ratio of $C_1/C_2$. Further, when the peaking capacitor $C_2$ of $BaTiO_3$ is used, its capacitance exhibits a minimum value at the start of discharge, and increases after the discharge start. A condition approximating to the matching condition with the discharge section is set up. Under this condition, much energy is injected by the discharge, so that the residual energy in the peaking capacitor is correspondingly reduced. As seen from FIG. 92(a), the voltage $V_r$ of the inverted polarity contained in the waveform of the oscillation voltage across peaking capacitor ($C_2$) 1810 is remarkably reduced when compared with that of FIG. 30. Accordingly, the after-current is also small as shown in FIG. 92(b), and no arcing occurs. As seen from FIG. 93 showing an oscillation waveform of the discharge voltage, it reaches the first peak voltage $V_{2M}$. As shown in FIG. 90, actually, when the solid-state switch device 1811 is used, the inductance of the switch at the time of discharge is remarkably smaller than that when the thyratron is used. Thus, the switch response is quick, and the voltage waveform shown in FIG. 93 steeply varies, providing a high output.

In the embodiment, the peaking capacitor made of titanic acid barium, used as the voltage dependent capacitor, operates such that when the voltage applied to the capacitor is increased up to the rated voltage, its capacitance is halved. Thus, the arc discharge owing to the after-current does not occur, elongating lifetime of the main discharge electrodes. Further, the voltage of the discharge section can be achieved by using the lower voltage of the switch section. This feature reduces the required number of the series connections of the solid-state switch elements.

What is claimed is:

1. A laser discharge circuit switching device, comprising:
   a plurality of modules connected between a laser power source and laser discharge electrodes, each module containing a circuit including a plurality of high speed switch elements of 0.1 $\mu$s or less in switching time, said switch elements being arrayed so as to simultaneously be conductive.

2. A switching device according to claim 1 wherein said plurality of high speed switch elements is a plurality of field effect transistors electrically connected in parallel to one another, each transistor having a drain electrode and a source electrode that are formed as a plate.

3. A laser discharge circuit switching device comprising:
   a plurality of solid-state switch elements which are substantially simultaneously controlled by trigger signals;
   a plurality of trigger circuits which apply the trigger signals to said plurality of solid-state switch elements; and
   transmission lines of equal lengths connecting said plurality of trigger circuits to respective ones of said plurality of solid-state switch elements.

4. A laser discharge circuit switching device, comprising:

a plurality of parallel circuits, each parallel circuit consisting of a plurality of parallel connected solid-state switch elements, said parallel circuits being connected in series into a series circuit, both ends of said series circuit being connected to a power source; and a protecting circuit for protecting said parallel circuits from overvoltage, said protecting circuit having a by-pass which by-passes a current caused by an overvoltage applied to said parallel circuits, said protecting circuit being connected in parallel to each of said parallel circuits;

wherein said protecting circuit is disposed in a current loop having a lower inductance than a current closed loop including said solid-state switch elements.

5. A laser circuit switching device comprising:
an arrangement of FETs electrically connected in series and in parallel to one another;
at least one overvoltage protecting FET provided in a series-connection stage of said FET series-parallel connection, said overvoltage protecting FET having a gate that is separated from other FETs;
a Zener diode and a diode connected between a drain and the gate of said overvoltage protecting FET;
a resistor inserted between the gate and a source of said overvoltage protecting FET; and
a resistor and a capacitor, each connected in parallel between the drain and the gate of said overvoltage protecting FET.

6. A laser circuit switching device, comprising:
a switch group including a plurality of high speed switches connected with one another, said switch group being placed in a discharge path for a charge capacitor, which leads discharge energy from said charge capacitor to discharge electrodes; and
a plurality of indicators inserted between selected high speed switches indicating whether or not at least one of said high speed switches in said switch group is shortcircuited.

7. A laser circuit switching device, comprising:
a plurality of modules, each having first and second terminal plates and containing a circuit in which a plurality of solid-state switch elements are arranged so as to be simultaneously turned on; and
a module holder constructed such that a plurality of conductive plates are disposed in parallel to one another with insulating members being interposed therebetween, whereby each of said modules is removably inserted between adjacent ones of said conductive plates such that said first and second terminal plates are in contact with said adjacent ones of said conductive plates.

8. A switching device according to claim 7, wherein a plurality of module drive blocks are mounted, respectively, to said plurality of modules.

9. A switching device according to claim 7, wherein said conductive plates are formed with grooves and protrusions allowing said module holders to be interlocked with one another.

10. A switching device according to claim 7, wherein said modules are formed with grooves and protrusions allowing said modules to be interlocked with one another.

11. A switching device according to claim 7, wherein said first terminal plate of each of said modules has a tapered edge for facilitating insertion of said modules into said module holder.

12. A laser circuit switching device, comprising:
a switch section including a plurality of modules, each of said modules containing a circuit in which a plurality of solid-state switch elements are connected so as to be simultaneously turned on, and having a plate-like first electrode, and second and third electrodes, all of said electrodes being provided common to said solid-state switch elements, said plurality of modules being stacked with each said first electrode sandwiched between adjacent ones of said modules; wherein
a plurality of said first electrodes protrude from one side edge of said modules so as to form a plurality of heat-radiating fins.

13. A laser circuit switching device, comprising:
a plurality of series-parallel connected solid-state switching elements; and
at least two heat pipes, each having metal plates arranged such that said solid-state switching elements are arrayed on said metal plates of said heat pipe and are sandwiched by adjacent ones of said metal plates, said heat pipes having end portions provided with radiating plates for cooling, wherein said metal plates have a low thermal resistance and wherein each of said heat pipes, together with said metal plates and radiating plates, absorbs, transfers and dissipates heat.

14. A switching device according to claim 13, wherein said plurality of series-parallel connected solid-state switching elements are grouped into modules, each module containing more than one of said switching elements.

15. A laser circuit switching device, comprising:
modules containing a plurality of solid-state switch elements arrayed in parallel; and
a common conductive path, equidistantly separated from said plurality of solid-state switch elements contained in said modules, connected to said plurality of solid-state switch elements to form a parallel circuit of said plurality of solid-state switch elements.

16. A laser circuit switching device, comprising:
a module containing a circuit in which a plurality of solid-state switch elements are connected so as to be simultaneously turned on;
a thin plate-like first electrode connected to each of said solid-state switch elements, and provided on a first outer surface of said module;
a thin plate-like second electrode, connected to each of said solid-state switch elements, and provided on a second outer surface, opposed to said first surface of said module; and
third electrodes provided on an outer surface of said module.

17. A switching device according to claim 16, wherein said third electrodes are provided on an outer surface different from the first and second outer surfaces.

18. A switching device according to claim 16, wherein said third electrodes are provided on said second outer surface.

19. A switching device according to claim 16, wherein said third electrodes are pin-terminal electrodes.

20. A laser circuit switching device, comprising:
a module including a module casing in which a circuit containing a plurality of solid-state switch elements connected so as to be turned on simultaneously, is accommodated, and including first terminal portions to which control signals to control said plurality of solid-state switch elements are applied, wherein said casing has a groove with an inner surface and said terminal portions are provided in the inner surface of said groove formed in said casing; and a control unit having a fitting portion fitted into said groove of said casing, in which the control signals are applied to second terminal portions formed in said fitting portions and connected to said first terminal portions, wherein said first terminal portions each have signal paths of substantially equal length and said second terminal portions each have signal paths of substantially equal length.

21. A laser circuit switching device, comprising:
a switch section containing a plurality of solid-state switch elements connected so as to be simultaneously turned on, and a first electrode for applying a control signal to said plurality of solid-state switch elements, said switch section and said first electrode disposed in a casing, and second and third electrodes extending to an exterior surface of said casing; and
a control unit electrically connected to said switch section and also disposed in said casing, wherein, said control unit applies control signals to said first electrode to render said solid-state switch elements conductive.

22. A laser circuit switching device, comprising:
a module containing a circuit in which a plurality of solid-state switch elements are connected so as to simultaneously turn on, said module having pin terminals that receive control signals to control said plurality of solid-state switch elements;
a control unit that applies the control signals to said module; and
connector means electrically and mechanically connecting said control unit to the pin terminals of said module.

23. A switching device according to claim 22, wherein said connector means forms a releasable connection between said control unit and said module.

24. A discharge excited pulse laser device, comprising:
main discharge electrodes, disposed within a laser medium, which provide a main discharge to generate a laser beam;
a high voltage pulse circuit which triggers the main discharge by pulse-discharging a charge;
a solid-state switch device, constructed with series-parallel connected solid-state switch elements, which starts the pulse discharge of the charge; and
a dedicated preparatory ionization circuit having a pulse forming line for deriving a charge from said solid-state switch device, said ionization circuit being connected to an auxiliary electrode within the laser medium, whereby said pulse forming line controls the timing of a preparatory ionization prior to the main discharge.

25. A discharge excited pulse laser device, comprising:
main discharge electrodes, disposed within a laser medium, which provide a main discharge to generate a laser beam;
a high voltage pulse circuit, having a capacitor, which triggers the main discharge by pulse-discharging a charge stored in said capacitor;
a first solid-state switch device which starts the discharge of the charge from said capacitor;
a second solid-state switch device which starts a preparatory ionization, before the main discharge, through a dedicated preparatory ionization circuit; and
a pulser which generates trigger signals to turn on said first and second solid-state switch devices.

26. A discharge excited repetitive oscillation excimer laser device, comprising:
a capacitor connected in series to a discharge section of an excimer laser device, said capacitor being charged by a high voltage power source; and
a solid-state switch device connected in series to a loop for pulse-discharging the energy charged in said capacitor into the discharge section, said switch device containing a plurality of high speed, series-parallel connected switch elements.

27. A discharge excited pulse laser device, comprising:
an LC inverting circuit including a capacitor; and
a switch device causing a pulse discharge within a discharge tube by charging said capacitor with a high voltage applied from a high voltage power source;
wherein said switch device comprises a group of solid-state element switches each containing a plurality of simultaneously controlled, series-parallel connected switch elements.

28. A discharge excited pulse laser device, comprising:
a pulse generating capacitor connected at a first end to a first main discharge electrode that, with a second main discharge electrode, generates a laser beam through a main discharge, and connected at a second end to a first charge terminal;
a peaking capacitor, connected in parallel to said first and second main discharge electrodes, which causes a main discharge of the laser beam upon receipt of a charge from said pulse generating capacitor;
a switch device connected between said first charge terminal and said second main discharge electrodes; and
a reverse current arresting circuit which arrests a reverse current which is caused by a reverse voltage applied to said first and second main discharge electrodes after the main discharge, said arresting circuit connected in parallel to said pulse generating capacitor.

29. A discharge excited pulse laser device, comprising:
a peaking capacitor which receives energy stored in a pulse generating capacitor which transfers the energy to said peaking capacitor through a switch device; and
main discharge electrodes which discharge the energy that is transferred to and stored in said peaking capacitor;
wherein said peaking capacitor is a voltage dependent capacitor, the capacitance of which decreases as the charge voltage increases.

30. A laser discharge circuit switching device, comprising:
an array of modules;
electrical interconnectors electrically interconnecting groups of said modules in series; and
electrical interconnectors electrically interconnecting groups of said modules in parallel;
wherein each said module contains a circuit having a plurality of high speed switch elements of 0.1 μs or less in switching time, said switch elements being electrically connected with one another so as to be simultaneously conductive.

* * * * *